(12) United States Patent
Murata et al.

(10) Patent No.: US 11,990,497 B2
(45) Date of Patent: May 21, 2024

(54) SOLID-STATE IMAGING ELEMENT AND ELECTRONIC DEVICE

(71) Applicant: SONY SEMICONDUCTOR SOLUTIONS CORPORATION, Kanagawa (JP)

(72) Inventors: Kenichi Murata, Kanagawa (JP); Masahiro Joei, Kanagawa (JP); Yuta Nakamura, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 43 days.

(21) Appl. No.: 17/759,108

(22) PCT Filed: Jan. 21, 2021

(86) PCT No.: PCT/JP2021/001979
§ 371 (c)(1),
(2) Date: Jul. 20, 2022

(87) PCT Pub. No.: WO2021/153404
PCT Pub. Date: Aug. 5, 2021

(65) Prior Publication Data
US 2023/0053000 A1    Feb. 16, 2023

(30) Foreign Application Priority Data

Jan. 29, 2020  (JP) ................. 2020-012994

(51) Int. Cl.
*H01L 27/146* (2006.01)
*H01L 27/148* (2006.01)
*H04N 25/633* (2023.01)

(52) U.S. Cl.
CPC .. *H01L 27/14641* (2013.01); *H01L 27/14612* (2013.01); *H01L 27/14806* (2013.01); *H04N 25/633* (2023.01)

(58) Field of Classification Search
None
See application file for complete search history.

(56) References Cited

U.S. PATENT DOCUMENTS

| 2011/0215433 | A1  | 9/2011 | Kokubun |
| 2016/0037117 | A1  | 2/2016 | Ono et al. |
| 2018/0175083 | A1* | 6/2018 | Takahashi ........... H01L 27/1463 |

FOREIGN PATENT DOCUMENTS

| EP | 2980851 A2 | 2/2016 |
| JP | 2003-332551 A | 11/2003 |

(Continued)

OTHER PUBLICATIONS

International Search Report and Written Opinion of PCT Application No. PCT/JP2021/001979, dated Apr. 13, 2021, 09 pages of ISRWO.

*Primary Examiner* — Mark T Monk
(74) *Attorney, Agent, or Firm* — CHIP LAW GROUP

(57) ABSTRACT

A solid-state imaging element includes a first photoelectric conversion unit and a second photoelectric conversion unit. The first and second photoelectric conversion units are joined at joint surfaces facing each other, and include an upper electrode, a lower electrode, a photoelectric conversion film, and a storage electrode. The lower electrode of the first photoelectric conversion unit is connected to a charge storage unit via a first through electrode penetrating a semiconductor substrate. The lower electrode of the second photoelectric conversion unit is connected to the charge storage unit via: a second electrode provided on a joint surface of the second photoelectric conversion unit; a first electrode provided on a joint surface of the first photoelec- (Continued)

tric conversion unit; a second through electrode penetrating the first photoelectric conversion unit; and the first through electrode.

18 Claims, 55 Drawing Sheets

(56) References Cited

FOREIGN PATENT DOCUMENTS

| | | | |
|---|---|---|---|
| JP | 2005-051115 | A | 2/2005 |
| JP | 2006-032715 | A | 2/2006 |
| JP | 2011-029337 | A | 2/2011 |
| JP | 2011-187565 | A | 9/2011 |
| JP | 2016-033981 | A | 3/2016 |
| JP | 2017-157816 | A | 9/2017 |
| JP | 2019-091733 | A | 6/2019 |
| WO | 2016/002576 | A1 | 1/2016 |
| WO | 2017/169241 | A1 | 10/2017 |
| WO | 2018/186192 | A1 | 10/2018 |
| WO | 2020/017305 | A1 | 1/2020 |

* cited by examiner

FIG. 52A
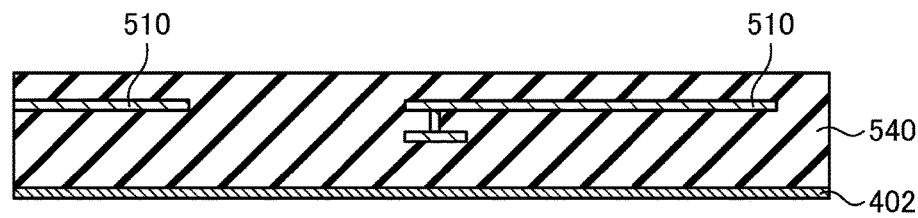
FIG. 52B
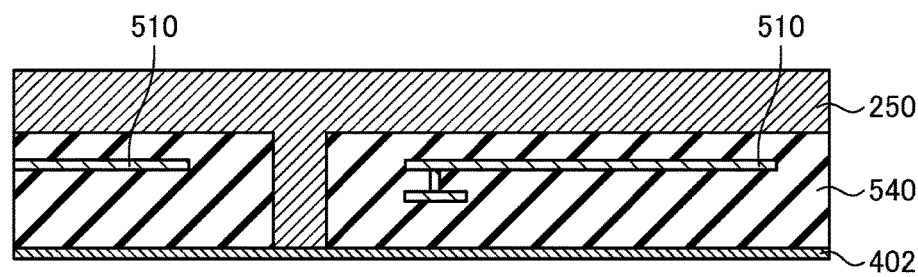
FIG. 52C
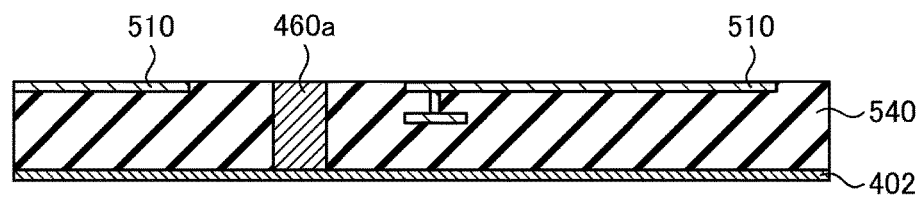
FIG. 52D
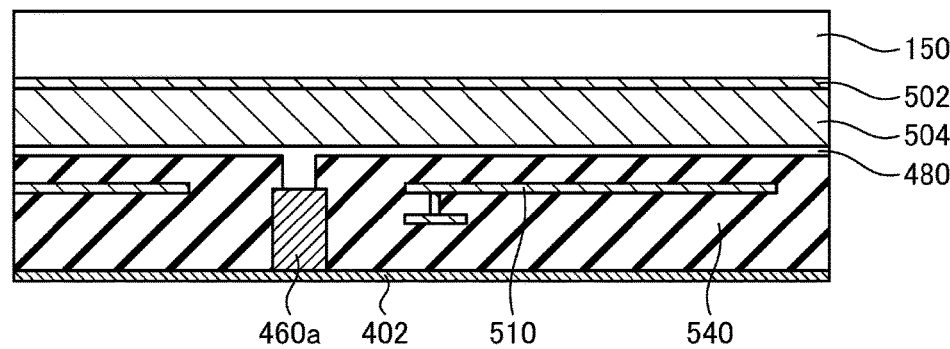

SOLID-STATE IMAGING ELEMENT AND ELECTRONIC DEVICE

CROSS REFERENCE TO RELATED APPLICATIONS

This application is a U.S. National Phase of International Patent Application No. PCT/JP2021/001979 filed on Jan. 21, 2021, which claims priority benefit of Japanese Patent Application No. JP 2020-012994 filed in the Japan Patent Office on Jan. 29, 2020. Each of the above-referenced applications is hereby incorporated herein by reference in its entirety.

TECHNICAL FIELD

The present disclosure relates to a solid-state imaging element and an electronic device.

BACKGROUND ART

In recent years, in a charge coupled device (CCD) image sensor or a complementary metal-oxide-semiconductor (CMOS) image sensor (a solid-state imaging device), an image sensor is proposed in which three photoelectric conversion films capable of performing photoelectric conversion individually with red light, green light, and blue light are laminated in a vertical direction in each unit pixel (solid-state imaging element), and light of three colors can be detected with one unit pixel (for example, Patent Documents 1 and 5 below). Furthermore, examples of other image sensors capable of detecting light of three colors with one unit pixel include the following. For example, as disclosed in Patent Document 2 below, an image sensor can be exemplified that includes: a semiconductor substrate on which two photo diodes (PDs) (photoelectric conversion elements) that individually detect red light and blue light are laminated; and a photoelectric conversion film provided above the semiconductor substrate and capable of performing photoelectric conversion with green light.

Moreover, in the image sensor including the semiconductor substrate in which two PDs are laminated and the photoelectric conversion film provided above the semiconductor substrate, examples of a circuit configuration for extraction of a pixel signal include the following. For example, as disclosed in Patent Document 3 below, a back-illuminated structure can be exemplified in which a circuit formation layer formed with the circuit described above is formed on an opposite side of a light receiving surface of an image sensor.

Furthermore, examples of other image sensors may include an image sensor as disclosed in Patent Document 4 below. Patent Document 4 below discloses a structure in which there are provided a semiconductor layer for storing and transferring charges obtained by photoelectric conversion, and a storage electrode opposed to the semiconductor layer described above via an insulating film, immediately below a photoelectric conversion film provided above a semiconductor substrate. In this structure, charges generated by photoelectric conversion by the photoelectric conversion film can be efficiently stored in the photoelectric conversion film like a kind of capacitor.

CITATION LIST

Patent Document

Patent Document 1: Japanese Patent Application Laid-Open No. 2005-51115

Patent Document 2: Japanese Patent Application Laid-Open No. 2003-332551

Patent Document 3: Japanese Patent Application Laid-Open No. 2011-29337

Patent Document 4: Japanese Patent Application Laid-Open No. 2017-157816

Patent Document 5: International Publication No. 2016/002576

SUMMARY OF THE INVENTION

Problems to be Solved by the Invention

In the above-described image sensor (solid-state imaging element), in order to output charges generated in the photoelectric conversion film provided above the substrate as a pixel signal, a plurality of pixel transistors (for example, an amplification transistor, a transfer transistor, a reset transistor, and the like) and wiring for connection of these pixel transistors are provided. In order to improve characteristics of the image sensor and suppress an increase in manufacturing cost, it is required to arrange the wiring in a suitable configuration. However, in the conventional proposal, a suitable configuration of the wiring has not been specifically studied.

Therefore, in view of such a situation, the present disclosure proposes a new and improved solid-state imaging element and electronic device capable of efficiently outputting and transferring a pixel signal while suppressing an increase in manufacturing cost.

Solutions to Problems

According to the present disclosure, there is provided a solid-state imaging element including: a semiconductor substrate; a first photoelectric conversion unit provided above the semiconductor substrate and configured to convert light into a charge; and a second photoelectric conversion unit provided above the first photoelectric conversion unit and configured to convert light into a charge, in which the first and second photoelectric conversion units are joined at joint surfaces facing each other, each of the first and second photoelectric conversion units has a laminated structure including: an upper electrode; a lower electrode; a photoelectric conversion film sandwiched between the upper electrode and the lower electrode; and a storage electrode opposed to the upper electrode via the photoelectric conversion film and an insulating film, the lower electrode of the first photoelectric conversion unit is electrically connected to a charge storage unit provided in the semiconductor substrate via a first through electrode penetrating the semiconductor substrate, and the lower electrode of the second photoelectric conversion unit is electrically connected to the charge storage unit via: a second electrode provided on a joint surface of the second photoelectric conversion unit; a first electrode provided on a joint surface of the first photoelectric conversion unit so as to be opposed to the second electrode and joined to the second electrode; a second through electrode penetrating the first photoelectric conversion unit; and the first through electrode.

Furthermore, according to the present disclosure, there is provided an electronic device including: a solid-state imaging element; an optical system configured to form an image of incident light on a light receiving surface of the solid-state imaging element; and a processor configured to control the solid-state imaging element, in which the solid-state imaging element includes: a semiconductor substrate; a first photoelectric conversion unit provided above the semiconductor substrate and configured to convert light into a charge; and a second photoelectric conversion unit provided above the first photoelectric conversion unit and configured to convert light into a charge, the first and second photoelectric conversion units are joined at joint surfaces facing each other, each of the first and second photoelectric conversion units has a laminated structure including: an upper electrode; a lower electrode; a photoelectric conversion film sandwiched between the upper electrode and the lower electrode; and a storage electrode opposed to the upper electrode via the photoelectric conversion film and an insulating film, the lower electrode of the first photoelectric conversion unit is electrically connected to a charge storage unit provided in the semiconductor substrate via a first through electrode penetrating the semiconductor substrate, and the lower electrode of the second photoelectric conversion unit is electrically connected to the charge storage unit via: a second electrode provided on a joint surface of the second photoelectric conversion unit; a first electrode provided on a joint surface of the first photoelectric conversion unit so as to be opposed to the second electrode and joined to the second electrode; a second through electrode penetrating the first photoelectric conversion unit; and the first through electrode.

BRIEF DESCRIPTION OF DRAWINGS

FIGS. 52A, 52B, 52C, and 52D are cross-sectional views for explaining a manufacturing method for the solid-state imaging element according to the present embodiment.

MODE FOR CARRYING OUT THE INVENTION

Figure 1:
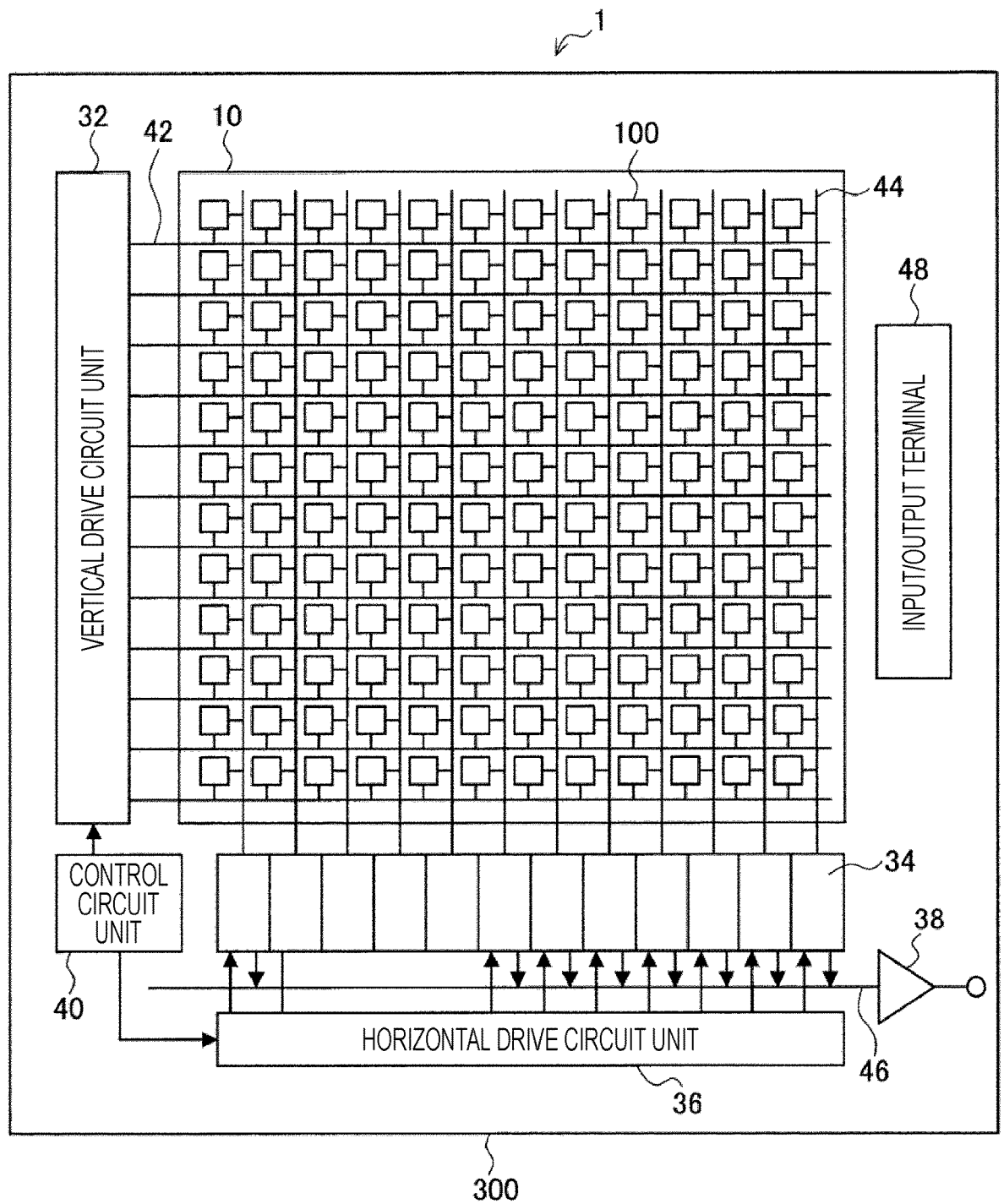
FIG. 1 is an explanatory view illustrating a planar configuration example of a solid-state imaging device according to the present embodiment.

Hereinafter, preferred embodiments of the present disclosure will be described in detail with reference to the accompanying drawings. Note that, in the present specification and the drawings, components having substantially the same functional configuration are denoted by the same reference numerals, and redundant explanations are omitted.

Furthermore, in the present specification and the drawings, similar components of different embodiments may be distinguished by adding different alphabets after the same reference numerals. However, in a case where it is not necessary to particularly distinguish each of the similar components, only the same reference numeral is assigned.

Furthermore, the drawings referred to in the following description are drawings for promoting the description of the embodiments of the present disclosure and the understanding thereof, and shapes, dimensions, ratios, and the like illustrated in the drawings may be different from actual ones for the sake of clarity. Moreover, a solid-state imaging element and a solid-state imaging device illustrated in the drawings can be appropriately changed in design in consideration of the following description and known techniques. Furthermore, in a description using a cross-sectional view of the solid-state imaging element, an up-down direction of a laminated structure of the solid-state imaging element corresponds to a relative direction in a case where an incident surface on which light is incident on the solid-state imaging element is upward, and may be different from an up-down direction according to actual gravitational acceleration.

Moreover, in the following description of a circuit configuration, unless otherwise specified, "electrically connecting" means connecting a plurality of elements such that electricity is conducted in between. In addition, "electrically connecting" in the following description includes not only a case of directly and electrically connecting a plurality of elements but also a case of indirectly and electrically connecting a plurality of elements via other elements.

Furthermore, in the following description, "sharing" means using, between elements different from each other (for example, PDs or the like), one other element (for example, an electrode or the like) together, and more specifically refers to a state where the one other element is used together by both of the different elements being electrically connected to the one other element.

Furthermore, in the following description, a "gate" refers to a gate electrode of a field effect transistor (FET). A "drain" represents a drain electrode or a drain region of the FET, and a "source" represents a source electrode or a source region of the FET.

Furthermore, in the following description, a description of specific lengths (numerical values) and shapes does not mean only the same values as mathematically defined numerical values or geometrically defined shapes. Specifically, the description of specific lengths (numerical values) and shapes in the following description includes a case where there is an allowable difference (error/distortion) in an imaging device, a manufacturing process thereof, and use/operation thereof, and includes a shape similar to that shape. For example, in the following description, a case of expression of "circular shape" also includes a shape similar to a perfect circle such as an elliptical shape, without limiting to a perfect circle.

Note that the description will be made in the following order.

Figure 74:
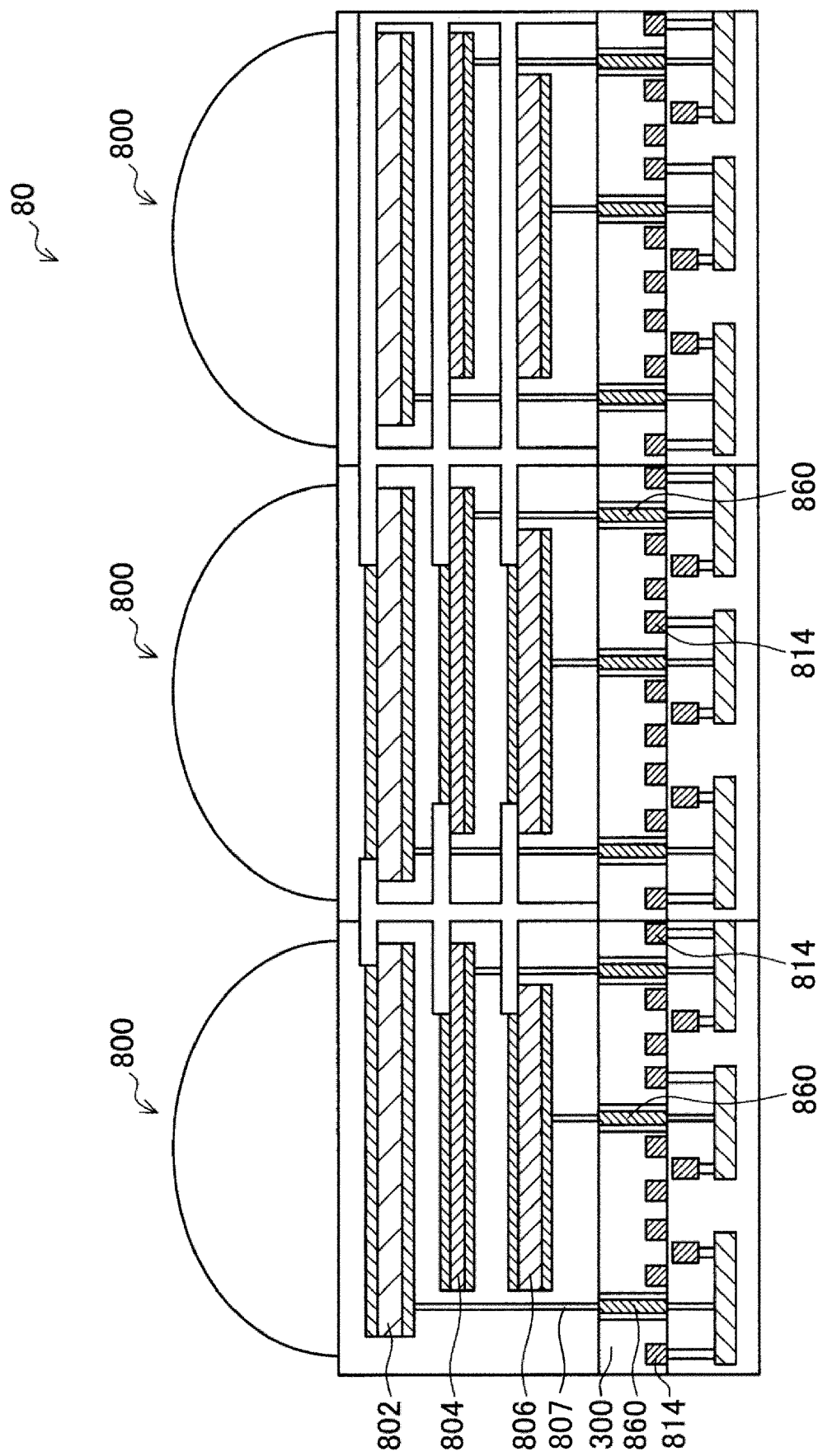
FIG. 74 is a cross-sectional view of a pixel array unit according to a comparative example.

1. Background that has led to creation of embodiments of present disclosure by present inventors
2. First embodiment
  2.1 About schematic configuration of solid-state imaging device 1
  2.2 About laminated structure of solid-state imaging element 100
  2.3 About layout configuration of solid-state imaging element 100
  2.4 About manufacturing method for solid-state imaging element 100
3. Modification of first embodiment
4. Second embodiment
  4.1 About laminated structure of solid-state imaging element 100*a*
  4.2 About layout configuration of solid-state imaging element 100*a*
  4.3 About equivalent circuit of solid-state imaging element 100*a*
  4.4 About reading method of solid-state imaging element 100*a*
5. Third embodiment
6. Fourth embodiment
7. Fifth embodiment
8. Sixth embodiment
9. Seventh embodiment
10. Eighth embodiment
11. Ninth embodiment
12. Tenth embodiment
13. Eleventh embodiment
14. Twelfth embodiment
15. Thirteenth embodiment
16. Fourteenth embodiment
17. Fifteenth embodiment
18. Application example
19. Application example to endoscopic surgery system
20. Application example to mobile object
21. Conclusion
22. Supplement 1. Background that Has Led to Creation of Embodiments of Present Disclosure by Present Inventors First, before describing details of each embodiment of the present disclosure, a background that has led to creation of embodiments of the present disclosure by the present inventors will be described with reference to FIG. 74. FIG. 74 is a cross-sectional view of a pixel array unit 80 according to a comparative example. Here, the comparative example means a solid-state imaging device (an image sensor) that has been repeatedly studied by the present inventors before obtaining the embodiments of the present disclosure.

In recent years, an image sensor has been required to reduce a pixel size. However, as the pixel size is reduced, an amount of light incident on a unit pixel is reduced, which has reduced sensitivity and caused reduction of a signal/noise (S/N) ratio.

Furthermore, in an image sensor, a configuration (for example, a Bayer array) is widely used in which individual pixels for detection of red, green, and blue light using primary color filters are arranged on a plane. In a case of such a configuration, in a pixel that detects red light, for example, green light and blue light are difficult to pass through a color filter of the pixel, and thus are not photoelectrically converted in the pixel, that is, are not detected. Therefore, in the case of the configuration as described above, for each pixel, light of one specific color is detected while light of other colors cannot be detected. Therefore, it cannot be said that light incident on each pixel is sufficiently used, in other words, it can be said that a loss occurs from the viewpoint of pixel sensitivity. Furthermore, in the case of the configuration as described above, since interpolation processing between pixels is performed, a false color accompanying generation of a color signal for interpolation also occurs.

Examples of a method for solving the above-described situation may include an image sensor in which three photoelectric conversion films capable of performing photoelectric conversion individually with red light, green light, and blue light are laminated in a vertical direction in a unit pixel, and light of three colors can be detected with one unit pixel (for example, Patent Documents 1 and 5 described above). Furthermore, examples of other image sensors capable of detecting light of three colors with one unit pixel include the following. For example, as disclosed in Patent Document 2 described above, an image sensor can be exemplified that includes: a semiconductor substrate on which two PDs that individually detect red light and blue light are laminated; and a photoelectric conversion film provided above the semiconductor substrate and capable of performing photoelectric conversion with green light.

Moreover, in the image sensor including the semiconductor substrate in which two PDs are laminated and the photoelectric conversion film provided above the semiconductor substrate, examples of a circuit configuration for extraction of a pixel signal include the following. For example, as described above, as disclosed in Patent Document 3 described above, a back-illuminated structure can be exemplified in which a circuit formation layer formed with the circuit described above is formed on an opposite side of a light receiving surface of an image sensor. In the case of the structure described above, a circuit, wiring, or the like is not provided between the PD in the semiconductor substrate and the photoelectric conversion film provided above the semiconductor substrate. Therefore, according to this structure, a distance between the PD and the photoelectric conversion film can be shortened in a laminating direction (a vertical direction) in the same pixel. As a result, in this structure, F value dependence of each color can be suppressed, and a difference in sensitivity between individual colors can be reduced.

Furthermore, examples of other image sensors may include an image sensor as disclosed in Patent Document 4 described above. Patent Document 4 described above discloses a structure in which there are provided a semiconductor layer for storing and transferring charges obtained by photoelectric conversion, and a storage electrode opposed to the semiconductor layer described above via an insulating film, immediately below a photoelectric conversion film provided above a semiconductor substrate. In this structure, charges generated by photoelectric conversion by the photoelectric conversion film can be efficiently stored in the photoelectric conversion film like a kind of capacitor. Moreover, in the structure described above, since charges can be stored in the photoelectric conversion film, the charge storage unit (a floating diffusion unit) provided in the semiconductor substrate can be completely depleted at a start of exposure, and charges can be erased. As a result, according to this structure, it is possible to suppress an occurrence of a phenomenon in which random noise deteriorates and imaging image quality of the image sensor deteriorates due to an increase in kTC noise (noise caused by thermal fluctuation of a charge) due to charges of the charge storage unit described above.

Meanwhile, in a case where a plurality of PDs is provided in a unit pixel as described above (for example, Patent Document 5 described above), a charge storage unit is provided for every PD in a semiconductor substrate in order to extract a charge generated by photoelectric conversion for every PD. Moreover, in order to transfer charges generated by photoelectric conversion for every PD to each charge storage unit, a through electrode penetrating the semiconductor substrate described above, wiring, or the like are provided for every PD. A solid-state imaging element 800 having such a structure will be described with reference to FIG. 74. FIG. 74 is a cross-sectional view of the pixel array unit 80 including a plurality of solid-state imaging elements 800 two-dimensionally arranged in a matrix on a semiconductor substrate 300 of a solid-state imaging device according to a comparative example. In FIG. 74, the solid-state imaging element 800 is illustrated such that an incident surface on which light is incident on the solid-state imaging element 800 faces upward.

Specifically, in the comparative example, as illustrated in FIG. 74, PDs 802, 804, and 806 are laminated on the semiconductor substrate 300. Moreover, in the comparative example, each of the PDs 802, 804, and 806 is electrically connected to each floating diffusion unit (charge storage unit) 814 provided in the semiconductor substrate 300 in order to temporarily store generated charges. More specifically, in the comparative example, each of the PDs 802, 804, and 806 is electrically connected to the floating diffusion unit 814 via each through electrode 807 and each through electrode 860 provided so as to penetrate the semiconductor substrate 300.

In the comparative example, a specific configuration of how to connect the through electrode 807 and the through electrode 860 has not been studied. For example, when connection between the through electrode 807 and the through electrode 860 is shifted along a direction perpendicular to a laminating direction, charges (pixel signals) cannot be outputted from the PDs 802, 804, and 806 each. In this way, in the comparative example, there has been a possibility that the pixel signals generated by the PDs 802, 804, and 806 each cannot be efficiently outputted.

Therefore, in view of the above-described situation, the present inventors have intensively studied a solid-state imaging element capable of efficiently outputting a pixel signal while avoiding an increase in manufacturing cost. During the study, the present inventors have uniquely had an idea of a configuration of connecting, via an electrode, a through electrode penetrating a photoelectric conversion film with wiring extending from a lower electrode of another photoelectric conversion film arranged above the photoelectric conversion film. According to the idea of the present inventors, if the wiring extending from the lower electrode of another photoelectric conversion film can be more reliably connected with the through electrode, a pixel signal generated in another photoelectric conversion film can be efficiently outputted and transferred to the floating diffusion unit.

That is, the present inventors have created the embodiments of the present disclosure with the above idea as one point of view. Hereinafter, details of embodiments of the present disclosure will be sequentially described.

2. First Embodiment

<2.1 About Schematic Configuration of Solid-State Imaging Device 1>

First, a schematic configuration of a solid-state imaging device 1 according to a first embodiment of the present disclosure will be described with reference to FIG. 1. FIG. 1 is an explanatory view illustrating a planar configuration example of the solid-state imaging device 1 according to the present embodiment. As illustrated in FIG. 1, the solid-state imaging device 1 according to the present embodiment includes: a pixel array unit 10; a vertical drive circuit unit 32; a column signal processing circuit unit 34; a horizontal drive circuit unit 36; an output circuit unit 38; a control circuit unit 40; and the like, which are provided on a semiconductor substrate 300 including, for example, silicon. Hereinafter, details of each block of the solid-state imaging device 1 according to the present embodiment will be described.

(Pixel Array Unit 10)

The pixel array unit 10 includes a plurality of solid-state imaging elements (pixels) 100 two-dimensionally arranged in a matrix on the semiconductor substrate 300. Note that, here, the solid-state imaging element 100 means a solid-state imaging element (a unit pixel) that can be regarded as one unit that outputs one result for every color, when detecting light of each color and outputting a detection result. Each solid-state imaging element 100 includes a plurality of photoelectric conversion elements (PDs) (not illustrated) and a plurality of pixel transistors (for example, metal-oxide-semiconductor (MOS) transistors) (not illustrated). More specifically, the pixel transistor can include, for example, a transfer transistor, a selection transistor, a reset transistor, an amplification transistor, and the like. Note that details of a circuit (a connection configuration) using these pixel transistors will be described later.

(Vertical Drive Circuit Unit 32)

The vertical drive circuit unit 32 is formed by, for example, a shift register, selects a pixel drive wiring 42, supplies a pulse for driving the solid-state imaging element 100 to the selected pixel drive wiring 42, and drives the solid-state imaging element 100 on a row basis. That is, the vertical drive circuit unit 32 selectively scans the solid-state imaging elements 100 of the pixel array unit 10 sequentially in a vertical direction (an up-down direction in FIG. 1) on a row basis, and supplies a pixel signal based on a charge generated according to an amount of light received by the PD of each solid-state imaging element 100, to the column signal processing circuit unit 34 described later through a vertical signal line 44.

(Column Signal Processing Circuit Unit 34)

The column signal processing circuit unit 34 is arranged for every column of the solid-state imaging element 100, and performs signal processing such as noise removal for every pixel column on pixel signals outputted from the solid-state imaging element 100 for one row. For example, the column signal processing circuit unit 34 performs signal processing such as correlated double sampling (CDS) and analog-degital (AD) conversion in order to remove fixed pattern noise unique to pixels.

(Horizontal Drive Circuit Unit 36)

The horizontal drive circuit unit 36 is formed by, for example, a shift register, and can sequentially select each of the above-described column signal processing circuit units 34 by sequentially outputting horizontal scanning pulses, and can cause each of the column signal processing circuit units 34 to output a pixel signal to a horizontal signal line 46.

(Output Circuit Unit 38)

The output circuit unit 38 can perform signal processing on pixel signals sequentially supplied from each of the column signal processing circuit units 34 described above through the horizontal signal line 46, and output the pixel signals. The output circuit unit 38 may function as, for example, a functional unit that performs buffering, or may perform processing such as black level adjustment, column variation correction, and various types of digital signal processing. Note that the buffering refers to temporarily storing pixel signals in order to compensate for a difference in processing speed and transfer speed when pixel signals are exchanged. Furthermore, an input/output terminal 48 is a terminal for exchanging signals between with an external device.

(Control Circuit Unit 40)

The control circuit unit 40 can receive an input clock and data instructing an operation mode and the like, and can output data such as internal information of the solid-state imaging element 100. That is, the control circuit unit 40 generates a clock signal or a control signal serving as a reference of operations of the vertical drive circuit unit 32, the column signal processing circuit unit 34, the horizontal drive circuit unit 36, and the like on the basis of a vertical synchronization signal, a horizontal synchronization signal, and a master clock. Then, the control circuit unit 40 outputs the generated clock signal or control signal to the vertical drive circuit unit 32, the column signal processing circuit unit 34, the horizontal drive circuit unit 36, and the like.

Note that a planar configuration example of the solid-state imaging device 1 according to the present embodiment is not limited to the example illustrated in FIG. 1, and may include, for example, other circuits and the like, and is not particularly limited.

<2.2 About Laminated Structure of Solid-State Imaging Element 100>

Figure 2:
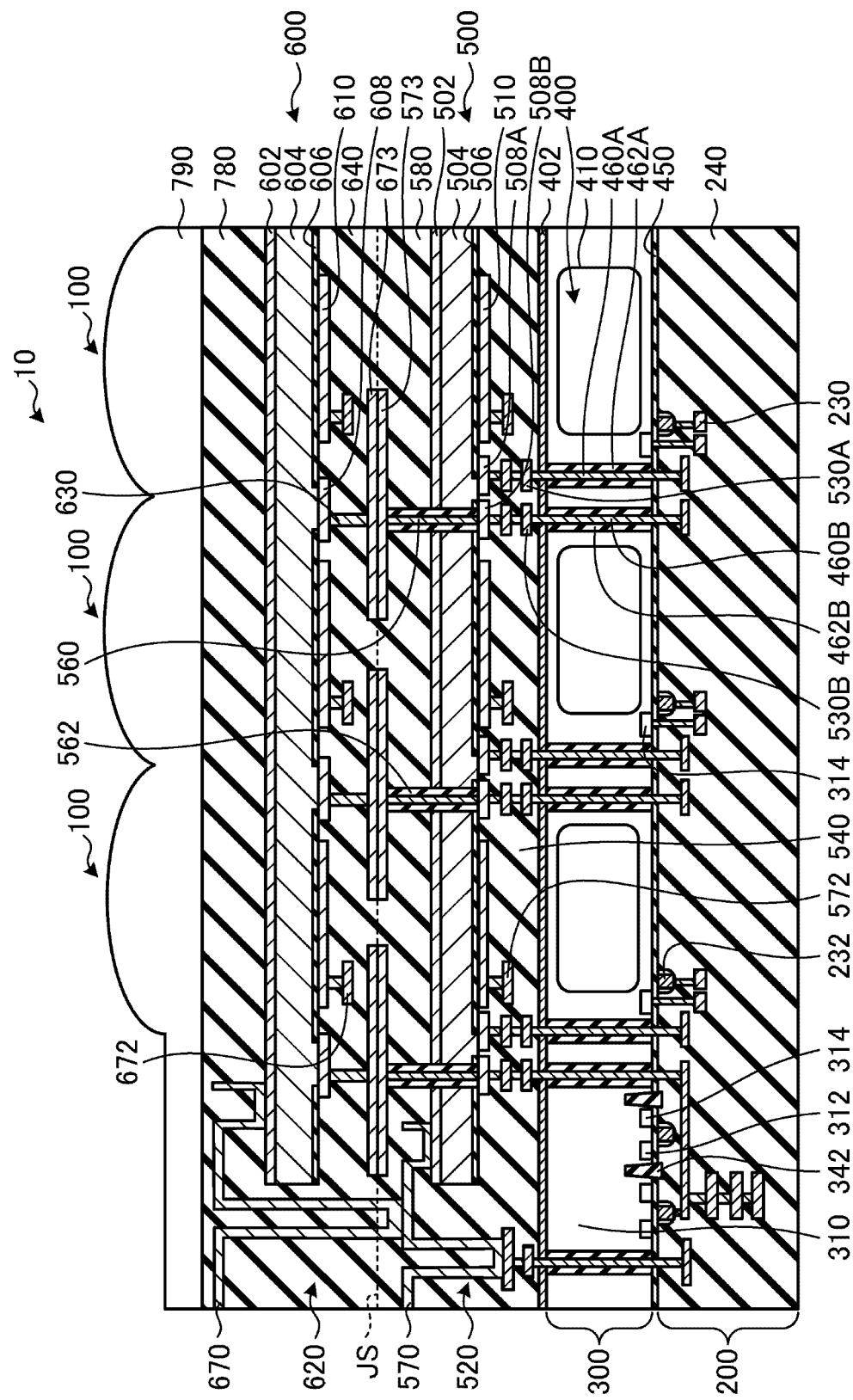
FIG. 2 is a cross-sectional view of a pixel array unit according to the present embodiment.

A schematic configuration of the solid-state imaging device 1 according to the present embodiment has been described above. Next, a laminated structure of the solid-state imaging element 100 according to the present embodiment will be described with reference to FIG. 2. FIG. 2 is a cross-sectional view of the pixel array unit 10 according to the present embodiment. In FIG. 2, the solid-state imaging element 100 is illustrated such that an incident surface on which light is incident on the solid-state imaging element 100 faces upward. In the following description, a laminated structure in the solid-state imaging element 100 will be described in an order from the semiconductor substrate 300 located on a lower side of the solid-state imaging element 100, toward a PD 500 (a first photoelectric conversion unit) provided above the semiconductor substrate 300 and a PD 600 (a second photoelectric conversion unit) provided above the PD 500.

Specifically, as illustrated in FIG. 2, in the solid-state imaging element 100, a semiconductor region 310 having a first conductivity type (for example, a P-type) of the semiconductor substrate 300 including, for example, silicon is provided with a semiconductor region 410 having a second conductivity type (for example, an N-type). With PN junction by such a semiconductor region 410, a PD 400 that converts light into charges is formed in the semiconductor substrate 300. Note that, in the present embodiment, the PD 400 is, for example, a photoelectric conversion element that absorbs red light (for example, light having a wavelength of 600 nm to 700 nm) and generates charges.

Furthermore, on a side (a lower side in FIG. 2) of the semiconductor substrate 300 opposite to an incident surface, a wiring layer 200 is provided including: wiring 230 formed by tungsten (W), aluminum (Al), copper (Cu), cobalt (Co), ruthenium (Ru), or the like; and an interlayer insulating film 240 formed by silicon oxide ($SiO_2$) or the like. Moreover, the wiring layer 200 is provided with a plurality of electrodes 232 formed by W, Al, Cu, or the like as gate electrodes of a plurality of pixel transistors that is for reading out charges generated in the PDs 400, 500, and 600. Specifically, the electrode 232 is provided so as to be opposed to the semiconductor region 310 having the first conductivity type (for example, the P-type) in the semiconductor substrate 300, via an insulating film 450. Moreover, in the semiconductor substrate 300, a semiconductor region 312 having the second conductivity type (for example, the N-type) is provided so as to be adjacent to the semiconductor region 310 described above having the first conductivity type, and the semiconductor region 312 functions as a source/drain region of the pixel transistor described above.

Moreover, in the semiconductor substrate 300, a floating diffusion unit (a charge storage unit) 314, which is a semiconductor region having the second conductivity type (for example, the N-type), is provided. The floating diffusion unit 314 can temporarily store charges generated by the PDs 400, 500, and 600. Furthermore, in the present embodiment, in the semiconductor substrate 300, an isolation insulating film 342 formed by $SiO_2$ or the like may be provided so as to be adjacent to the floating diffusion unit 314 described above and the semiconductor region 312, which is a source/drain region of each pixel transistor.

Furthermore, in the present embodiment, as illustrated in FIG. 2, through electrodes (first through electrodes) 460A and 460B for extraction of charges generated in the PDs 500 and 600 to be described later to the wiring 230 are provided so as to penetrate the semiconductor substrate 300. The through electrodes 460A and 460B can be formed by a metal film or the like of Cu, W, Al, or the like. Furthermore, in order to prevent a short circuit between the semiconductor substrate 300 and the through electrodes 460A and 460B, insulating films 462A and 462B including $SiO_2$ or the like are provided so as to cover outer peripheries of the through electrodes 460A and 460B. Moreover, in the present embodiment, a barrier metal film (not illustrated) may be provided between the through electrodes 460A and 460B and the insulating films 462A and 462B surrounding the outer peripheries of the through electrodes 460A and 460B. The barrier metal film can be formed by a material such as titanium nitride (TiN), tungsten nitride (WN), titanium (Ti), tantalum nitride (TaN), tantalum (Ta), zirconium (Zr), Ru, or Co.

The through electrodes 460A and 460B described above can electrically connect reading electrodes (lower electrodes) 508A and 608 of the PDs 500 and 600 to be described later, via the wiring 230 provided in the wiring layer 200, to the floating diffusion unit 314 provided in the semiconductor substrate 300. Therefore, the through electrodes 460A and 460B allows the floating diffusion unit 314 described above to temporarily store charges generated by photoelectric conversion in the PDs 500 and 600. Moreover, the through electrodes 460A and 460B can electrically connect the reading electrodes 508A and 608 of the PDs 500 and 600 to a pixel transistor provided on the semiconductor substrate 300.

Note that the through electrodes 460A and 460B described above can be formed as follows. For example, a through hole penetrating the semiconductor substrate 300 is formed, and the insulating films 462A and 462B and the barrier metal described above are formed by a physical vapor deposition (PVD) method, a chemical vapor deposition (CVD) method, an atomic layer deposition method (ALD), or the like, so as to cover an inner wall of the through hole. Moreover, for example, after the formed insulating films 462A and 462B and barrier metal described above are etched, a metal film or the like of Cu, W, Al, or the like is formed by a plating method, a CVD method, a PVD method, or an ALD method so as to fill the through hole. In this way, the through electrodes 460A and 460B can be formed.

Furthermore, in the present embodiment, a semiconductor region (not illustrated) having the first conductivity type (for example, the P-type) may be provided on an incident surface of the semiconductor substrate 300, and further, an antireflection film 402 including aluminum oxide ($Al_2O_3$) may be provided on the semiconductor region.

Then, in the present embodiment, as illustrated in FIG. 2, a wiring layer 520, which includes: an insulating film 540 including, for example, $SiO_2$ or the like and capable of transmitting light; and wiring 530 formed by W or the like, is provided so as to be sandwiched between the semiconductor substrate 300 and the PD 500. Since the insulating film 540 can transmit light, the PD 400 provided below the insulating film 540 can receive light and perform photoelectric conversion, that is, can detect light. Furthermore, the reading electrodes 508A and 608 of the PDs 500 and 600 described later are electrically connected respectively to the through electrodes 460A and 460B described above, via the wiring 530.

Then, in the present embodiment, on the wiring layer 520, a photoelectric conversion film 504 is provided to be sandwiched between a common electrode (an upper electrode) 502 shared by solid-state imaging elements 100 adjacent to each other (specifically, adjacent to each other in a left-right direction in FIG. 2) and the reading electrode 508A that reads charges generated in the photoelectric conversion film 504. The common electrode 502, the photoelectric conversion film 504, and the reading electrode 508A constitute a part of a laminated structure of the PD 500 (the first photoelectric conversion unit) that converts light into charges. In the present embodiment, the PD 500 is, for example, a photoelectric conversion element that absorbs green light (for example, light having a wavelength of 500 nm to 600 nm) and generates charges (photoelectric conversion). Note that details of materials constituting the common electrode 502, the photoelectric conversion film 504, and the reading electrode 508A will be described later.

Moreover, in the present embodiment, as illustrated in FIG. 2, the PD 500 includes a storage electrode 510 opposed to the common electrode 502 via the photoelectric conversion film 504 and an insulating film 506, in order to temporarily store charges generated in the photoelectric conversion film 504 into the photoelectric conversion film 504. In the present embodiment, the storage electrode 510 may be opposed to the common electrode 502 via a semiconductor layer (not illustrated) provided so as to be sandwiched between the photoelectric conversion film 504 and the insulating film 506. The semiconductor layer described above is provided for more efficiently store charges, and is preferably formed by an oxide semiconductor material capable of transmitting light. Note that details of materials constituting the storage electrode 510, the insulating film 506, and the semiconductor layer will be described later.

As illustrated in FIG. 2, the reading electrode 508A in contact with the photoelectric conversion film 504 is electrically connected to the floating diffusion unit 314 provided in the semiconductor substrate 300 via the through electrode 460A. Furthermore, the common electrode 502 is electrically connected to wiring 570 that applies a desired potential to the common electrode 502. Moreover, the storage electrode 510 is electrically connected to wiring 572 that applies a desired potential to the storage electrode 510.

Therefore, in the present embodiment, by controlling potentials applied to the common electrode 502, the reading electrode 508A, and the storage electrode 510, charges generated in the photoelectric conversion film 504 can be stored at an interface of the photoelectric conversion film 504 or the photoelectric conversion film 504, or the charges can be taken out to the floating diffusion unit 314. In other words, the storage electrode 510 can function as a charge storage electrode to attract charges generated in the photoelectric conversion film 504 in accordance with the applied potential and store the charges in the photoelectric conversion film 504. Note that, in the present embodiment, in order to effectively use light incident on the solid-state imaging element 100, the storage electrode 510 is preferably provided so as to have a larger area than the reading electrode 508A in a case where the solid-state imaging element 100 is viewed from above the incident surface.

Then, in the present embodiment, as illustrated in FIG. 2, a wiring layer 620, which includes: insulating films 580 and 640 including, for example, $SiO_2$ or the like and capable of transmitting light; and wiring formed by W or the like, is provided so as to be sandwiched between the PD 500 and the PD 600. Since the insulating films 580 and 640 can also transmit light, the PD 500 provided below the insulating films 580 and 640 can receive light and perform photoelectric conversion, that is, can detect light. Furthermore, the reading electrode 608 of the PD 600 described later is electrically connected to a through electrode (a second through electrode) 560 described later via a through electrode 630. The through electrode 630 is provided so as to penetrate the insulating film 640 from the reading electrode 608 to an electrode 673 of the PD 600.

Then, in the present embodiment, as illustrated in FIG. 2, the insulating films 580 and 640 are joined to each other at joint surfaces JS. Furthermore, the through electrode 560 and the through electrode 630 are electrically connected via electrodes (a first electrode and a second electrode) 573 and 673. In the present embodiment, the electrode 573 is provided on a joint surface JS of the PD 500, and the electrode 673 is provided on a joint surface JS of the PD 600. The electrodes 573 and 673 face each other and are joined at the joint surfaces JS. Therefore, in the present embodiment, it can be said that the PD 500 and the PD 600 are joined at the joint surfaces JS facing each other.

Furthermore, as illustrated in FIG. 2, the through electrode 560 is provided so as to penetrate a part of the insulating film 580 and the PD 500 from the electrode 573 to the reading electrode 508A of the PD 500. Specifically, the reading electrode 608 of the PD 600 is electrically connected to the through electrode 460B via the through electrodes 560 and 630. Moreover, the reading electrode 608 of the PD 600 is electrically connected to the floating diffusion unit 314 provided in the semiconductor substrate 300 via the through electrode 560 and the through electrode 460B. Therefore, the through electrodes 460B and 560 allows the floating diffusion unit 314 described above to temporarily store charges generated by photoelectric conversion in the PD 600. Moreover, the reading electrode 608 of the PD 600 is electrically connected to a pixel transistor provided in the semiconductor substrate 300 via the through electrode 560 and the through electrode 460B.

In the present embodiment, the through electrode 560 can be formed by a metal film or the like of Cu, W, Al, or the like. Moreover, the through electrode 560 may be formed by a transparent conductive film such as indium tin oxide (ITO) or indium zinc oxide (IZO). Furthermore, in order to prevent a short circuit between the through electrode 560 and the PD 500, an insulating film 562 including $SiO_2$ or the like may be provided on an outer periphery of the through electrode 560. Moreover, in the present embodiment, a barrier metal film (not illustrated) may be provided between the through electrode 560 and the insulating film 562 surrounding the outer periphery of the through electrode 560. The barrier metal film can be formed by, for example, a material such as TiN.

Note that the through electrode 560 described above can be formed as follows. For example, a through hole penetrating the PD 500 is formed, and the insulating film 562 is formed by a PVD method, a CVD method, an ALD method, or the like so as to cover an inner wall of the through hole. Moreover, for example, after the formed insulating film 562 is etched, a metal film or the like of Cu or the like is formed by a plating method, a CVD method, a PVD method, or an ALD method so as to fill the through hole. In this way, the through electrode 560 can be formed.

In the present embodiment, the through electrode 630 can be formed by a metal film or the like of Cu, W, Al, or the like. Moreover, the through electrode 630 may be formed by a transparent conductive film such as indium tin oxide (ITO) or indium zinc oxide (IZO).

Note that the through electrode 630 described above can be formed as follows. For example, a through hole penetrating the insulating film 640 is formed, and a metal film or the like of Cu or the like is formed by a plating method, a CVD method, a PVD method, or an ALD method so as to fill the through hole. In this way, the through electrode 630 can be formed.

Moreover, in the present embodiment, the PD 600 (the second photoelectric conversion unit) that converts light into a charge is provided on the wiring layer 620. The PD 600 is, for example, a photoelectric conversion element that absorbs blue light (for example, light having a wavelength of 400 nm to 500 nm) and generates charges (photoelectric conversion). Specifically, as the PD 600, a common electrode (an upper electrode) 602, a photoelectric conversion film 604, an insulating film 606, the reading electrode (the lower electrode) 608, and a storage electrode 610 are sequentially laminated.

Furthermore, the reading electrode 608 in contact with the photoelectric conversion film 604 is electrically connected to the through electrode 460B via the through electrode 560. Furthermore, the common electrode 602 is electrically connected to wiring 670 that applies a desired potential to the common electrode 602. Moreover, the storage electrode 610 is electrically connected to wiring 672 that applies a desired potential to the storage electrode 610.

That is, as illustrated in FIG. 2, the PD 500 and the PD 600 respectively include the common electrodes 502 and 602, the photoelectric conversion films 504 and 604, and the reading electrodes 508A and 608. Moreover, in the laminated structures individually included in the PD 500 and the PD 600, the order in which the individual layers described above are laminated is the same. In other words, in the photoelectric conversion laminated structures of the PDs 500 and 600, the reading electrodes 508A and 608, the photoelectric conversion films 504 and 604, and the common electrodes 502 and 602 are sequentially laminated from below.

Note that, in the present embodiment, the lamination order of the individual layers of the PD 500 and the PD 600 may not be the above-described order, and the individual layers may be laminated in orders having a symmetrical relationship in the laminating direction. Furthermore, in the present embodiment, in a case where the solid-state imaging element 100 is viewed from above the incident surface, the reading electrodes 508A and 608, the storage electrodes 510 and 610, and the like of the PD 500 and the PD 600 may not completely overlap with each other. That is, in the present embodiment, in a case where the solid-state imaging element 100 is viewed from above the incident surface, the layout of each layer of the PDs 500 and 600 is not particularly limited.

The photoelectric conversion films 504 and 604 described above can be formed by an organic material (an organic photoelectric conversion film) or an inorganic material (an inorganic photoelectric conversion film). For example, in a case where the photoelectric conversion film is formed by an organic material, any one can be selected from four modes of: (a) a P-type organic semiconductor material; (b) an N-type organic semiconductor material; (c) a laminated structure of at least two of a P-type organic semiconductor material layer, an N-type organic semiconductor material layer, and a mixed layer (a bulk hetero structure) of the P-type organic semiconductor material and the N-type organic semiconductor material; and (d) a mixed layer of the P-type organic semiconductor material and the N-type organic semiconductor material. Note that the photoelectric conversion film using an organic material includes a laminated structure or the like having lamination of, for example, an electron blocking film-cum-buffer film in contact with the reading electrodes 508A and 608, a photoelectric conversion film, a positive hole blocking film, a positive hole blocking-cum-buffer film, and a work function adjustment film.

Specifically, examples of the P-type organic semiconductor material may include a naphthalene derivative, an anthracene derivative, a phenanthrene derivative, a pyrene derivative, a perylene derivative, a tetracene derivative, a pentacene derivative, a quinacridone derivative, a coumarin derivative, a pyrromethene derivative, a pyran derivative, a phenoxazone derivative, a thiophene derivative, a thienothiophene derivative, a benzothiophene derivative, a benzothienobenzothiophene (BTBT) derivative, a dinaphthothienothiophene (DNTT) derivative, a dianthracenothienothiophene (DATT) derivative, a benzobisbenzothiophene (BBBT) derivative, naphthalene bisbenzothiophene (NBBT), a thienobisbenzothiophene (TBBT) derivative, a dibenzothienobisbenzothiophene (DBTBT) derivative, a dithienobenzodithiophene (DTBDT) derivative, a dibenzothienodithiophene (DBTDT) derivative, a benzodithiophene (BDT) derivative, a naphthodithiophene (NDT) derivative, an anthracenodithiophene (ADT) derivative, a tetracenodithiophene (TDT) derivative, a pentacenodithiophene (PDT) derivative, a triallylamine derivative, a carbazole derivative, a picene derivative, a chrysene derivative, a fluoranthene derivative, a phthalocyanine derivative, a subphthalocyanine derivative, a subporphyrazine derivative, a metal complex having a heterocyclic compound as a ligand, a polythiophene derivative, a polybenzothiadiazole derivative, a polyfluorene derivative, and the like.

Furthermore, examples of the N-type organic semiconductor material may include fullerene and a fullerene derivative (for example, fullerene (higher-order fullerene) such as C60, C70, and C74, endohedral fullerene, and the like), or a fullerene derivative (for example, fullerene fluoride, a phenyl-$C_{61}$-butyric acid methyl ester (PCBM) fullerene compound, fullerene multimer, and the like), an organic semiconductor deeper in highest occupied molecular orbital (HOMO) and lowest unoccupied molecular orbital (LUMO) than a P-type organic semiconductor, inorganic metal oxide capable of transmitting light, and the like. More specifically, examples of the N-type organic semiconductor material may include a heterocyclic compound containing a nitrogen atom, an oxygen atom, and a sulfur atom, for example, a pyridine derivative, a pyrromethene derivative, a pyrazine derivative, a pyrimidine derivative, a triazine derivative, a quinoline derivative, a quinoxaline derivative, an isoquinoline derivative, a coumarin derivative, a pyran derivative, a phenoxazone derivative, a perylene derivative, an acridine derivative, a phenazine derivative, a phenanthroline derivative, a tetrazole derivative, a pyrazole derivative, an imidazole derivative, a thiazole derivative, an oxazole derivative, an imidazole derivative, a benzimidazole derivative, a benzotriazole derivative, a benzoxazole derivative, a benzoxazole derivative, a carbazole derivative, a benzofuran derivative, a dibenzofuran derivative, a subporphyrazine derivative, a polyphenylenevinylene derivative, a polybenzothiadiazole derivative, an organic molecule having a polyfluorene derivative or the like as a part of a molecular skeleton, an organometallic complex, and a subphthalocyanine derivative. Furthermore, examples of a group or the like contained in the fullerene derivative may include: a branched or cyclic alkyl group or phenyl group; a group having a linear or condensed aromatic compound; a group having halide; a partial fluoroalkyl group; a perfluoroalkyl group; a silylalkyl group; a silyl alkoxy group; an arylsilyl group; an arylsulfanyl group; an alkylsulfanyl group; an arylsulfonyl group; an alkylsulfonyl group; an aryl sulfide group; an alkyl sulfide group; an amino group; an alkylamino group; an arylamino group; a hydroxy group; an alkoxy group; an acylamino group; an acyloxy group; a carbonyl group; a carboxy group; a carboxamide group; a carboalkoxy group; an acyl group; a sulfonyl group; a cyano group; a nitro group; a group having chalcogenide; a phosphine group; a phosphon group; and a derivative of those. Note that a film thickness of a photoelectric conversion film formed by an organic material is not limited, and may be, for example, $1 \times 10^{-8}$ m to $5 \times 10^{-7}$ m, preferably $2.5 \times 10^{-8}$ m to $3 \times 10^{-7}$ m, and more preferably $2.5 \times 10^{-8}$ m to $2 \times 10^{-7}$ m. Furthermore, in the above description, the organic semiconductor materials are classified into the P-type and the N-type. Here, the P-type means that positive holes are easily transported, and the N-type means that electrons are easily transported. That is, interpretation is not limited to that the organic semiconductor material has positive holes or electrons as majority carriers of thermal excitation like an inorganic semiconductor material.

Moreover, the photoelectric conversion films 504 and 604 may be formed by a polymer such as phenylenevinylene, fluorene, carbazole, indole, pyrene, pyrrole, picoline, thiophene, acetylene, or diacetylene, or a derivative thereof.

Furthermore, in a case where the photoelectric conversion films 504 and 604 are formed by an inorganic material, examples of the inorganic semiconductor material may include crystalline silicon, amorphous silicon, microcrystalline silicon, crystalline selenium, amorphous selenium, and chalcopyrite compounds such as CIGS (CuInGaSe), CIS (CuInSe$_2$), CuInS$_2$, CuAlS$_2$, CuAlSe$_2$, CuGaS$_2$, CuGaSe$_2$, AgAlS$_2$, AgAlSe$_2$, AgInS$_2$, and AgInSe$_2$, or III-V group compounds such as GaAs, InP, AlGaAs, InGaP, AlGaInP, and InGaAsP, and compound semiconductors such as CdSe, CdS, In$_2$Se$_3$, In$_2$S$_3$, Bi$_2$Se$_3$, Bi$_2$S$_3$, ZnSe, ZnS, PbSe, and PbS. In addition, in the present embodiment, quantum dots including these materials described above can also be used as the photoelectric conversion films 504 and 604.

Moreover, for the photoelectric conversion films 504 and 604, in order to detect blue light and green light, for example, there may be preferably used a metal complex dye, a rhodamine dye, a quinacridone dye, a cyanine dye, a merocyanine dye, a phenylxanthene dye, a triphenylmethane dye, a rhodacyanine dye, a xanthene dye, a macrocyclic azaannulene dye, an azulene dye, naphthoquinone, an anthraquinone dye, a condensed polycyclic aromatic compound such as anthracene and pyrene, a chain compound in which an aromatic ring compound or a heterocyclic compound is condensed, two nitrogen-containing heterocycles having a squarylium group and a croconic methine group as a bonding chain, such as quinoline, benzothiazole, or benzoxazole, or a cyanine-like dye bonded by a squarylium group and a croconic methine group, and the like. Furthermore, for the metal complex dye described above, a dithiol metal complex dye, a metal phthalocyanine dye, a metal porphyrin dye, or a ruthenium complex dye is preferable, and a ruthenium complex dye is particularly preferable, but the metal complex dye described above is not limited to the above.

Note that, in the present embodiment, the photoelectric conversion films 504 and 604 can be formed or laminated by mixing several kinds of materials in order to improve characteristics. Moreover, in the present embodiment, the photoelectric conversion films 504 and 604 can be formed by laminating or mixing materials that do not directly contribute to photoelectric conversion in order to improve characteristics.

Furthermore, in the present embodiment, the common electrodes 502 and 602, the reading electrodes 508A and 608, the electrodes 573 and 673, and the storage electrodes 510 and 610 can be formed by, for example, a transparent conductive film that can transmit light, such as an indium tin oxide (ITO, including crystalline ITO and amorphous ITO) film. However, in the present embodiment, the common electrodes 502 and 602, the reading electrodes 508A and 608, and the storage electrodes 510 and 610 are not limited to ITO as described above, and may contain other materials. For example, the transparent conductive film preferably contains a material having a band gap of 2.5 eV or more, and preferably 3.1 eV or more. Examples of the transparent conductive film may include, for example, tin oxide, antimony tin oxide (Sb is added to SnO$_2$ as a dopant, for example, ATO), fluorine tin oxide (F is added to SnO$_2$ as a dopant, for example FTC)), and the like, as a tin oxide material. Examples of a zinc oxide material may include aluminum zinc oxide (Al is added to ZnO as a dopant, for example, AZO), gallium zinc oxide (Ga is added to ZnO as a dopant, for example, GZO), indium zinc oxide (In is added to ZnO as a dopant, for example, IZO), indium gallium zinc oxide (In and Ga are added to ZnO$_4$ as dopants, for example, IGZO), indium tin zinc oxide (In and Sn are added to ZnO as dopants, for example, ITZO), and the like. Furthermore, in addition, indium gallium oxide (In is added as a dopant to Ga$_2$O$_3$, for example, IGO), CuInO$_2$, MgIn$_2$O$_4$, CuI, InSbO$_4$, ZnMgO, CdO, ZnSnO$_3$, graphene, and the like can be exemplified.

Note that, in the present embodiment, the electrodes 573 and 673 may include a material other than the transparent conductive material. For example, the electrodes 573 and 673 can be formed by a metal film or the like of Cu, W, Al, or the like.

Furthermore, in the present embodiment, the insulating films 506 and 606 can be formed by, for example, SiO$_2$, Al$_2$O$_3$, silicon nitride (Si$_3$N$_4$), or the like that can transmit light, and are not particularly limited.

Moreover, in the present embodiment, a semiconductor layer (not illustrated) included in the PDs 500 and 600 is preferably formed using a material having a higher charge mobility and a larger band gap than those of the photoelectric conversion films 504 and 604. For example, the band gap of a constituent material of the semiconductor layer is preferably 3.0 eV or more. Examples of such a material include, for example, an oxide semiconductor material such as IGZO, an organic semiconductor material, and the like. Examples of the organic semiconductor material include, for example, transition metal dichalcogenide, silicon carbide, diamond, graphene, a carbon nanotube, a condensed polycyclic hydrocarbon compound, a condensed heterocyclic compound, and the like. The semiconductor layer may be formed by a single film or may be formed by laminating a plurality of films.

Then, in the present embodiment, as illustrated in FIG. 2, for example, an insulating film 780 including a material such as a SiO$_2$ film capable of transmitting light is provided on the PD 600. Moreover, on the insulating film 780, an on-chip lens 790 is provided for every solid-state imaging element 100. The on-chip lens 790 can be formed by, for example, Si$_3$N$_4$ or a resin material such as a styrene resin, an acrylic resin, a styrene-acrylic copolymer resin, or a siloxane resin.

As described above, the solid-state imaging element 100 according to the present embodiment has a laminated structure in which the PD 400, the PD 500, and the PD 600 that individually detect light of three colors are laminated. That is, the above-described solid-state imaging element 100 can be said a solid-state imaging element of a vertical spectral type in which, for example, blue light is photoelectrically converted by the photoelectric conversion film 604 (the PD 600) formed above the semiconductor substrate 300, green light is photoelectrically converted by the photoelectric conversion film 504 (the PD 500) provided below the PD 600, and red light is photoelectrically converted by the PD 400 provided in the semiconductor substrate 300. Note that, in the present embodiment, the above-described solid-state imaging element 100 is not limited to the above-described vertical spectral laminated structure. For example, green light may be photoelectrically converted by the photoelectric conversion film 604 (the PD 600) formed above the semiconductor substrate 300, and blue light may be photoelectrically converted by the photoelectric conversion film 504 (the PD 500) provided below the PD 600.

<2.3 About Layout Configuration of Solid-State Imaging Element 100>

Figure 3:
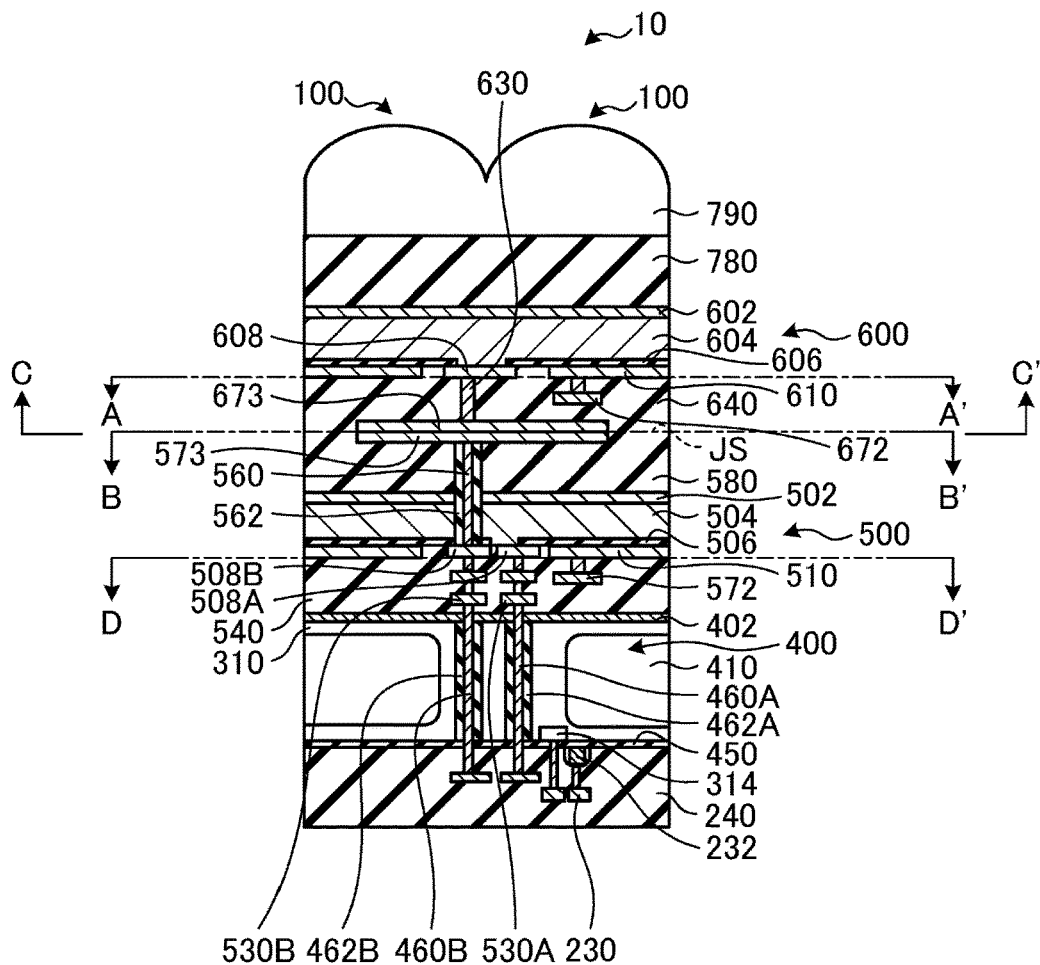
FIG. 3 is an explanatory view illustrating a part of a cross-sectional view of a solid-state imaging element according to the present embodiment.
Figure 4:
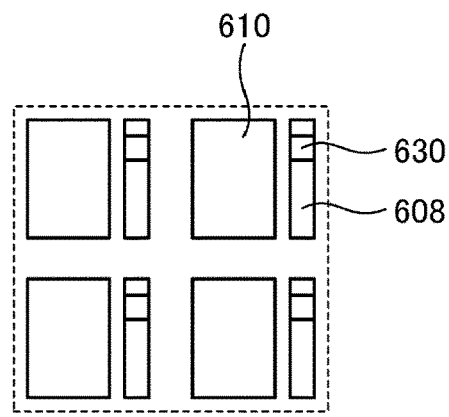
FIG. 4 is a cross-sectional view of the solid-state imaging element taken along line A-A' in FIG. 3.
Figure 5:
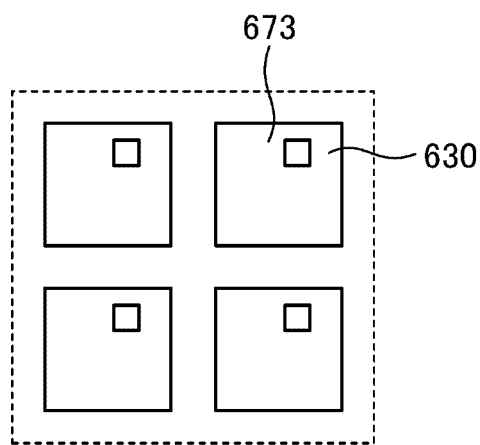
FIG. 5 is a cross-sectional view of the solid-state imaging element taken along line B-B' in FIG. 3.
Figure 6:
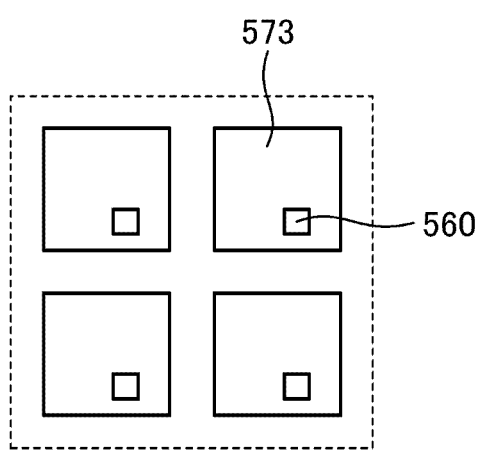
FIG. 6 is a cross-sectional view of the solid-state imaging element taken along line C-C' in FIG. 3.
Figure 7:
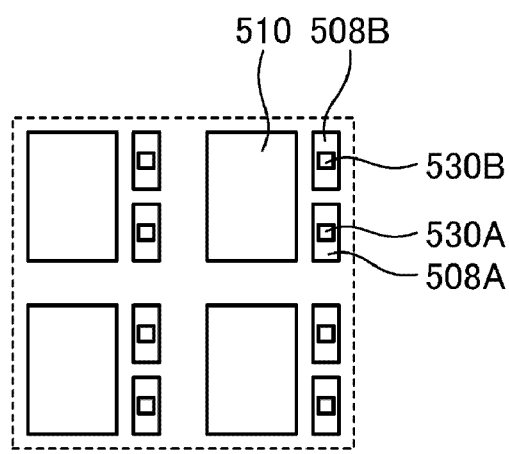
FIG. 7 is a cross-sectional view of the solid-state imaging element taken along line D-D' in FIG. 3.

The laminated structure of the solid-state imaging element 100 according to the present embodiment has been described above. Next, a layout configuration of the solid-state imaging element 100 according to the present embodiment will be described with reference to FIGS. 3 to 7. FIG. 3 is an explanatory view illustrating a part of a cross-sectional view of the solid-state imaging element 100 according to the present embodiment. FIG. 4 is a cross-sectional view of the solid-state imaging element 100 taken along line A-A' in FIG. 3. FIG. 5 is a cross-sectional view of the solid-state imaging element 100 taken along line B-B' in FIG. 3. FIG. 6 is a cross-sectional view of the solid-state imaging element 100 taken along line C-C' in FIG. 3. FIG. 7 is a cross-sectional view of the solid-state imaging element 100 taken along line D-D' in FIG. 3. Note that FIGS. 4 to 7 illustrate cross sections of four pixels (four solid-state imaging elements 100).

As described above, as illustrated in FIG. 3, in the present embodiment, the PD 500 and the PD 600 have a structure in which the common electrodes 502 and 602, the photoelectric conversion films 504 and 604, the reading electrodes 508A and 608, the insulating films 506 and 606, and the storage electrodes 510 and 610 are sequentially laminated. Furthermore, the reading electrode 608 of the PD 600 is electrically connected to a through electrode 420B via the through electrode 630, the electrodes 573 and 673, and the through electrode 560. Furthermore, the reading electrode 508 of the PD 500 is electrically connected to a through electrode 420A.

Here, FIG. 4 illustrates a cross section in a case where the solid-state imaging element 100 is cut along line A-A' (an interface between the insulating film 606 and the storage electrode 610) illustrated in FIG. 3, and the cut surface is viewed from above the solid-state imaging element 100. As illustrated in FIG. 4, the reading electrode 608 is electrically connected to the through electrode 630.

Furthermore, FIG. 5 illustrates a cross section in a case where the solid-state imaging element 100 is cut along line B-B' (an interface between the insulating film 640 and the electrode 673) illustrated in FIG. 3, and the cut surface is viewed from above the solid-state imaging element 100. As illustrated in FIG. 5, the through electrode 630 is electrically connected to the electrode 673. A size of the electrode 673 is smaller than a size of one pixel.

Furthermore, FIG. 6 illustrates a cross section in a case where the solid-state imaging element 100 is cut along line C-C' (an interface between the insulating film 580 and the electrode 573) illustrated in FIG. 3, and the cut surface is viewed from below the solid-state imaging element 100. As illustrated in FIG. 6, the through electrode 560 is electrically connected to the electrode 573. A size of the electrode 573 is substantially the same as that of the electrode 673, and is smaller than a size of one pixel.

Furthermore, FIG. 7 illustrates a cross section in a case where the solid-state imaging element 100 is cut along line D-D' (an interface between the insulating film 506 and the storage electrode 510) illustrated in FIG. 3, and the cut surface is viewed from above the solid-state imaging element 100. As illustrated in FIG. 7, the reading electrode 508A is electrically connected to wiring 530A connected to the through electrode 460A. Furthermore, an electrode 508B electrically connected to the through electrode 560 is electrically connected to wiring 530B connected to the through electrode 460B.

<2.4 About manufacturing method for solid-state imaging element 100>

Figure 8C:
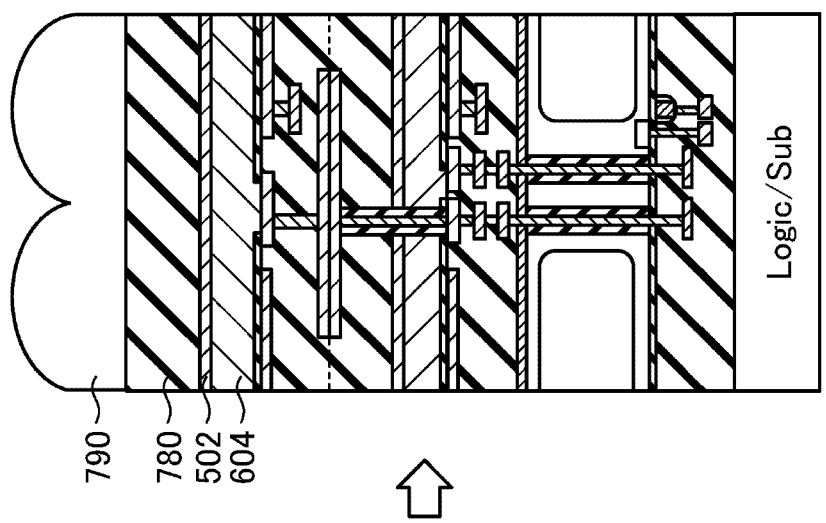
FIGS. 8A, 8B, and 8C are views for explaining a manufacturing method for the solid-state imaging element according to the present embodiment.
Figure 8B:
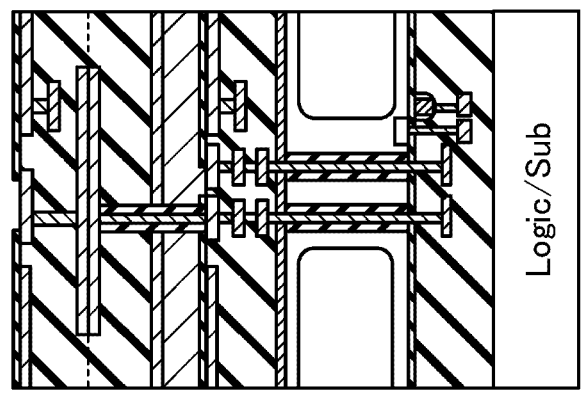
Figure 8A:
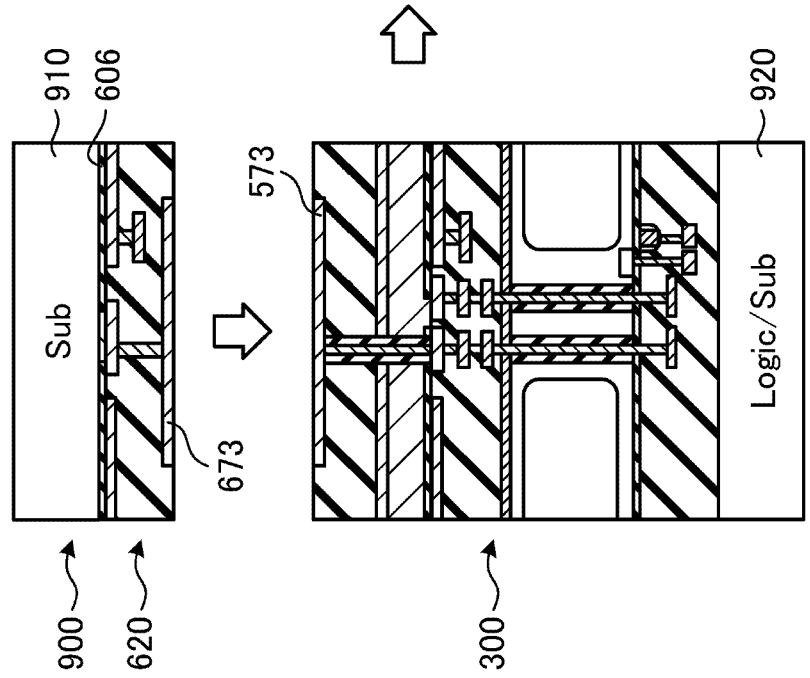

The layout configuration of the solid-state imaging element 100 according to the present embodiment has been described above. Next, a manufacturing method for the solid-state imaging element 100 according to the present embodiment will be described with reference to FIGS. 8A, 8B, and 8C. FIGS. 8A, 8B, and 8C are views for explaining the manufacturing method for the solid-state imaging element 100 according to the present embodiment. Note that, in FIGS. 8A, 8B, and 8C, only reference numerals used for the description are given, and other reference numerals are omitted.

First, as illustrated in FIG. 8A, the semiconductor substrate 300 on which the electrode 573 is formed is joined with a semiconductor substrate 900. The semiconductor substrate 300 is formed above a semiconductor substrate 920 on which a logic circuit is formed. In the semiconductor substrate 900, the wiring layer 620 is formed on a silicon substrate 910, and the electrode 673 is formed on a joint surface.

Next, as illustrated in FIG. 8B, the semiconductor substrate 900 is thinned, and the silicon substrate 910 is removed. Subsequently, by forming the photoelectric conversion film 604, the common electrode 502, the insulating film 780, and the on-chip lens 790 on the thinned semiconductor substrate 900, the solid-state imaging element 100 illustrated in FIG. 8C can be obtained.

As described above, according to the present embodiment, the through electrode 630 electrically connected to the reading electrode 608 of the PD 600 is electrically connected with the through electrode 560 via the electrodes 573 and 673. Furthermore, the electrodes 573 and 673 are respectively provided on the joint surfaces JS of the PDs 500 and 600, and are joined to each other at the joint surfaces JS. Therefore, even if joint misalignment (positions of the electrodes 573 and 673 are shifted from each other in a direction perpendicular to the laminating direction) occurs in the electrodes 573 and 673, the through electrode 630 and the through electrode 560 can be electrically connected as long as the electrodes 573 and 673 are at least partially joined. As a result, according to the present embodiment, it is possible to efficiently output and transfer a pixel signal while suppressing an increase in manufacturing cost.

3. Modification of First Embodiment

In the above-described first embodiment, the reading electrodes 508A and 608 are provided for every one pixel (solid-state imaging element 100). However, the embodiment of the present disclosure is not limited to the configuration in which the reading electrodes 508A and 608 are provided for every pixel. For example, the reading electrodes 508A and 608 may be shared by every plurality of pixels. Therefore, a case where the reading electrodes 508A and 608 are shared by four pixels will be described as a modification of the first embodiment with reference to FIGS. 9 to 12.

Figure 9:
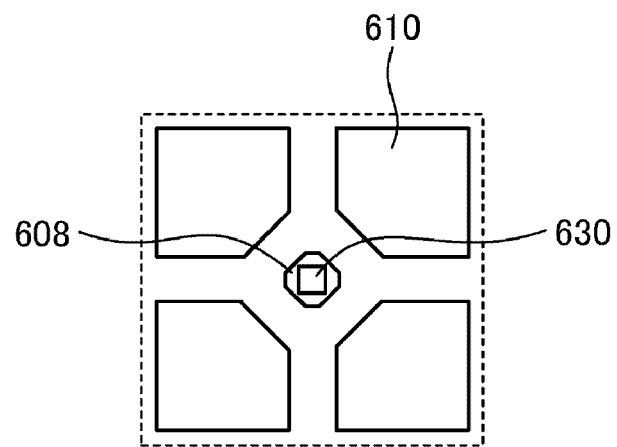
FIG. 9 is a cross-sectional view of the solid-state imaging element taken along line A-A' in FIG. 3.
Figure 10:
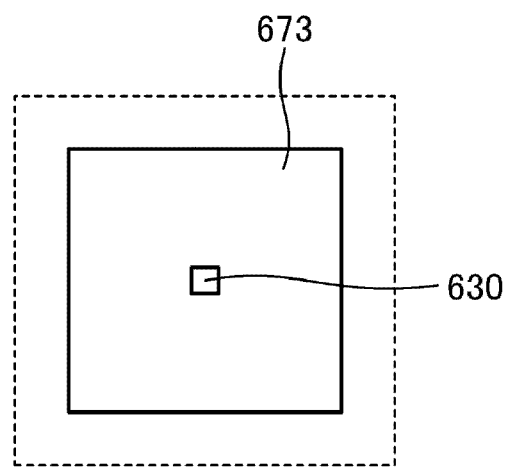
FIG. 10 is a cross-sectional view of the solid-state imaging element taken along line B-B' in FIG. 3.
Figure 11:
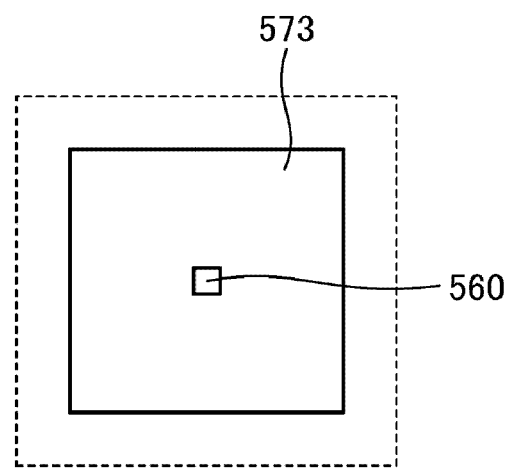
FIG. 11 is a cross-sectional view of the solid-state imaging element taken along line C-C' in FIG. 3.
Figure 12:
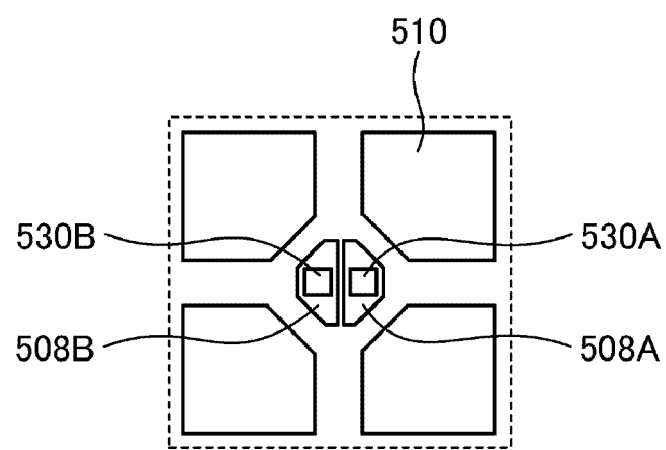
FIG. 12 is a cross-sectional view of the solid-state imaging element taken along line D-D' in FIG. 3.

FIG. 9 is a cross-sectional view of the solid-state imaging element 100 taken along line A-A' in FIG. 3. FIG. 10 is a cross-sectional view of the solid-state imaging element 100 taken along line B-B' in FIG. 3. FIG. 11 is a cross-sectional view of the solid-state imaging element 100 taken along line C-C' in FIG. 3. FIG. 12 is a cross-sectional view of the solid-state imaging element 100 taken along line D-D' in FIG. 3. Note that FIGS. 9 to 12 illustrate cross sections of four pixels (four solid-state imaging elements 100).

Here, FIG. 9 illustrates a cross section in a case where the solid-state imaging element 100 is cut along line A-A' (an interface between the insulating film 606 and the storage electrode 610) illustrated in FIG. 3, and the cut surface is viewed from above the solid-state imaging element 100. As illustrated in FIG. 9, one reading electrode 608 is provided for four pixels. The reading electrode 608 is electrically connected to the through electrode 630.

Furthermore, FIG. 10 illustrates a cross section in a case where the solid-state imaging element 100 is cut along line B-B' (an interface between the insulating film 640 and the electrode 673) illustrated in FIG. 3, and the cut surface is viewed from above the solid-state imaging element 100. As illustrated in FIG. 10, the through electrode 630 is electrically connected to the electrode 673. One electrode 673 is formed for every four pixels. A size of the electrode 673 is smaller than a total size of four pixels.

Furthermore, FIG. 11 illustrates a cross section in a case where the solid-state imaging element 100 is cut along line C-C' (an interface between the insulating film 580 and the electrode 573) illustrated in FIG. 3, and the cut surface is viewed from below the solid-state imaging element 100. As illustrated in FIG. 11, the through electrode 560 is electrically connected to the electrode 573. One electrode 673 is formed for every four pixels. A size of the electrode 573 is substantially the same as that of the electrode 673, and is smaller than a total size of four pixels.

Furthermore, FIG. 12 illustrates a cross section in a case where the solid-state imaging element 100 is cut along line D-D' (an interface between the insulating film 506 and the storage electrode 510) illustrated in FIG. 3, and the cut surface is viewed from above the solid-state imaging element 100. As illustrated in FIG. 12, the reading electrode 508A is electrically connected to the wiring 530A connected to the through electrode 460A. Furthermore, the electrode 508B electrically connected to the through electrode 560 is electrically connected to the wiring 530B connected to the through electrode 460B. One reading electrode 508A and one electrode 508B are formed for every four pixels.

4. Second Embodiment

In the above-described first embodiment, the solid-state imaging element 100 is a solid-state imaging element in which the reading electrode 508 of the PD 500 is electrically connected to the through electrode 460A, and the reading electrode 608 of the PD 600 is electrically connected to the through electrode 460B. However, without limiting to such a configuration, an embodiment of the present disclosure may adopt a solid-state imaging element 100a in which a through electrode (a common through electrode) 460 is shared between PDs 500 and 600. Therefore, as a second embodiment of the present disclosure, the solid-state imaging element 100a in which the through electrode 460 is shared by the PDs 500 and 600 will be described with reference to FIGS. 13 to 18.

<4.1 About Laminated Structure of Solid-State Imaging Element 100a>

Figure 13:
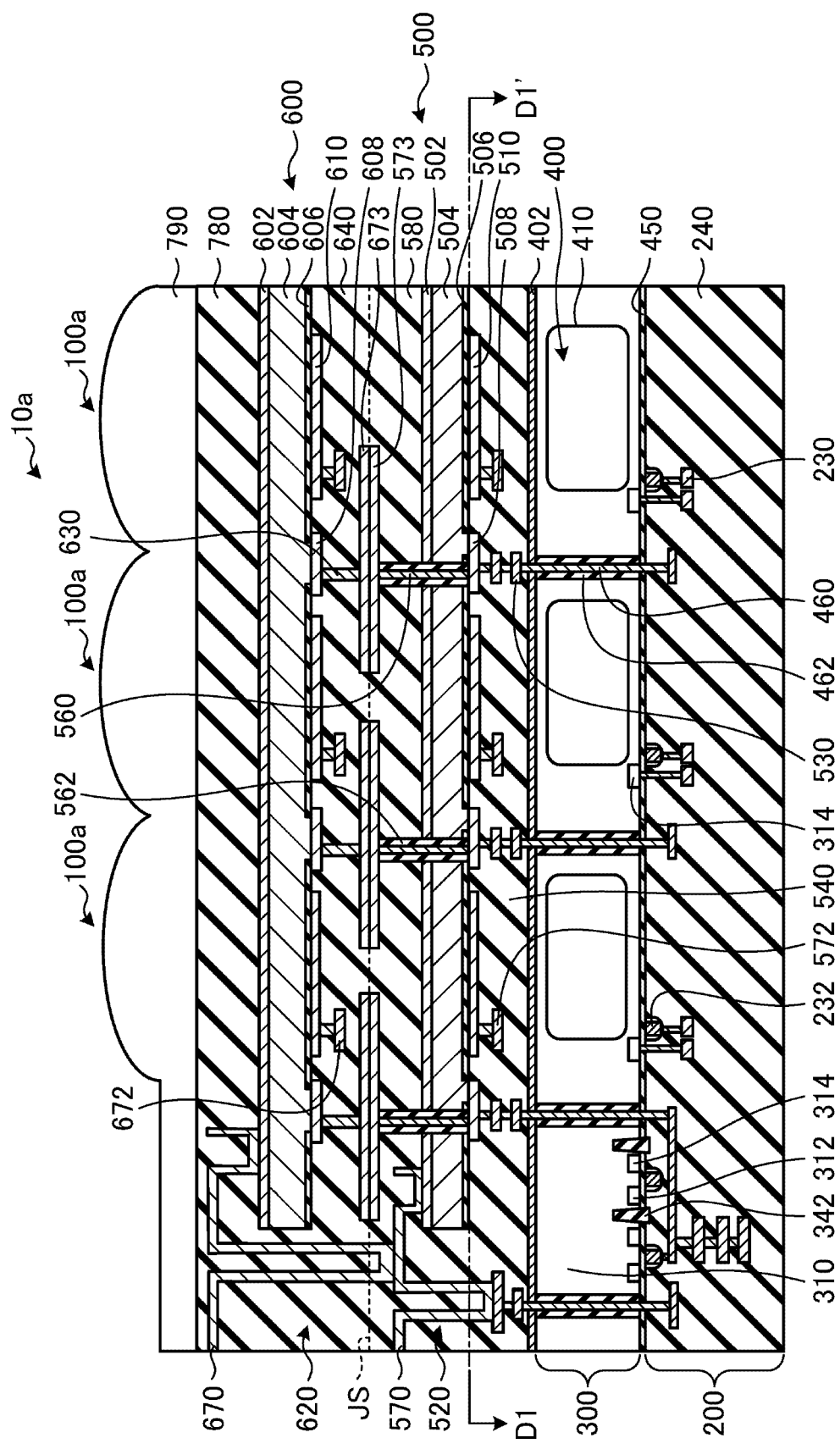
FIG. 13 is a cross-sectional view of a pixel array unit according to the present embodiment.

First, a laminated structure of the solid-state imaging element 100a according to the present embodiment will be described with reference to FIG. 13. FIG. 13 is a cross-sectional view of a pixel array unit 10a according to the present embodiment. As illustrated in FIG. 13, the solid-state imaging element 100a according to the present embodiment has a configuration similar to that of the above-described first embodiment except that the PDs 500 and 600 share the through electrode 460. Therefore, a description of the configuration similar to that of the first embodiment will be omitted. In the present embodiment, some pixel transistors provided in a semiconductor substrate 300 are shared by the PDs 500 and 600 provided above the semiconductor substrate 300. That is, in the present embodiment, it can be said that some of a plurality of pixel transistors is common pixel transistors shared by the PDs 500 and 600.

Furthermore, in the present embodiment, some of a plurality of floating diffusion units (common charge storage units) 314 is provided so as to be in common in the PDs 500 and 600, in other words, to be shared by the PDs 500 and 600, in order to temporarily store charges generated by the PDs 500 and 600.

Furthermore, in the present embodiment, as illustrated in FIG. 13, the through electrode 460 shared by the PDs 500 and 600 for extraction of charges generated by the PDs 500 and 600 into wiring 230 is provided so as to penetrate the semiconductor substrate 300. The through electrode 460 can be formed by a metal film or the like of Cu, W, Al, or the like. Furthermore, in order to prevent a short circuit between the through electrode 460 and the semiconductor substrate 300, an insulating film 462 including $SiO_2$ or the like is provided so as to cover an outer periphery of the through electrode 460. Moreover, in the present embodiment, a barrier metal film (not illustrated) may be provided between the through electrode 460 and the insulating film 462 surrounding the outer periphery of the through electrode 460. The barrier metal film can be formed by a material such as titanium nitride (TiN), tungsten nitride (WN), titanium (Ti), tantalum nitride (TaN), tantalum (Ta), zirconium (Zr), Ru, or Co.

The through electrode 460 described above can electrically connect reading electrodes (lower electrodes) 508 and 608 of the PDs 500 and 600, via the wiring 230 provided in the wiring layer 200 described above, to the floating diffusion unit 314 provided in the semiconductor substrate 300. Therefore, the through electrode 460 allows the floating diffusion unit 314 described above to temporarily store charges generated by photoelectric conversion in the PDs 500 and 600. Moreover, the through electrode 460 can electrically connect the reading electrodes 508 and 608 of the PDs 500 and 600 to a pixel transistor provided in the semiconductor substrate 300.

Note that the through electrode 460 described above can be formed as follows. For example, a through hole penetrating the semiconductor substrate 300 is formed, and the insulating film 462 and the barrier metal described above are formed by a physical vapor deposition (PVD) method, a chemical vapor deposition (CVD) method, an atomic layer deposition (ALD) method, or the like, so as to cover an inner wall of the through hole. Moreover, for example, after the formed insulating film 462 and barrier metal described above are etched, a metal film or the like of Cu, W, Al, or the like is formed by a plating method, a CVD method, a PVD method, or an ALD method so as to fill the through hole. In this way, the through electrode 460 can be formed.

<4.2 About Layout Configuration of Solid-State Imaging Element 100*a*>

Figure 14:
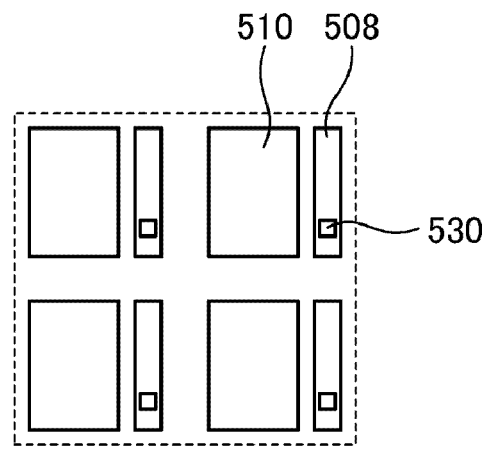
FIG. 14 is a cross-sectional view of a solid-state imaging element taken along line D1-D1' in FIG. 13.

The laminated structure of the solid-state imaging element 100*a* according to the present embodiment has been described above. Next, a layout configuration of the solid-state imaging element 100*a* according to the present embodiment will be described with reference to FIG. 14. FIG. 14 is a cross-sectional view of the solid-state imaging element 100*a* taken along line D1-D1' in FIG. 13. Note that FIG. 14 illustrates a cross section of four pixels (four solid-state imaging elements 100*a*).

Here, FIG. 14 illustrates a cross section in a case where the solid-state imaging element 100*a* is cut along line D1-D1' (an interface between an insulating film 506 and a storage electrode 510) illustrated in FIG. 13, and the cut surface is viewed from above the solid-state imaging element 100*a*. As illustrated in FIG. 14, the reading electrode 508 is electrically connected to wiring 530 connected to the through electrode 460. Furthermore, the reading electrode 508 is electrically connected to a through electrode 560.

Figure 15:
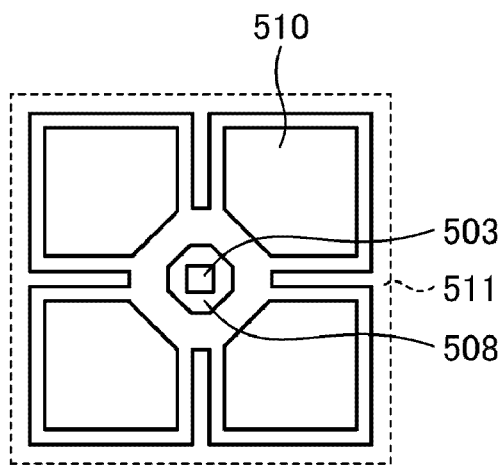
FIG. 15 is a cross-sectional view of the solid-state imaging element taken along line D1-D1' in FIG. 13.

FIG. 15 is a cross-sectional view of the solid-state imaging element 100*a* taken along line D1-D1' in FIG. 13. FIG. 14 has illustrated a case where the reading electrode 508 is provided for every pixel, but the reading electrode 508 can be shared by a plurality of pixels as shown in Modification 1 of the first embodiment. FIG. 15 illustrates a case where four pixels share one reading electrode 508.

As described above, in the present embodiment, the different PDs 500 and 600 share one floating diffusion unit 314 and one through electrode 460. Therefore, according to the present embodiment, since an increase in processing area of the semiconductor substrate 300 due to formation of the through electrode 460 can be avoided, and reduction of an incident surface of a PD 400 can be avoided, an amount of light incident on the PD 400 does not decrease, and deterioration in sensitivity characteristics of the PD 400 can be avoided. Moreover, according to the present embodiment, since the different PDs 500 and 600 share the floating diffusion unit 314 and the through electrode 460, it is possible to avoid an increase in area of a chip on which a solid-state imaging device 1 is mounted. As a result, according to the present embodiment, an increase in manufacturing cost of the solid-state imaging device 1 can be avoided. In addition, according to the present embodiment, since one through electrode 460 is shared by the different PDs 500 and 600, the number of through electrodes 460 penetrating the semiconductor substrate 300 can be reduced. As a result, according to the present embodiment, it is possible to avoid deterioration of dark current characteristics of the solid-state imaging device 1 due to a decrease in crystallinity of the semiconductor substrate 300.

<4.3 About Equivalent Circuit of Solid-State Imaging Element 100*a*>

Figure 16:
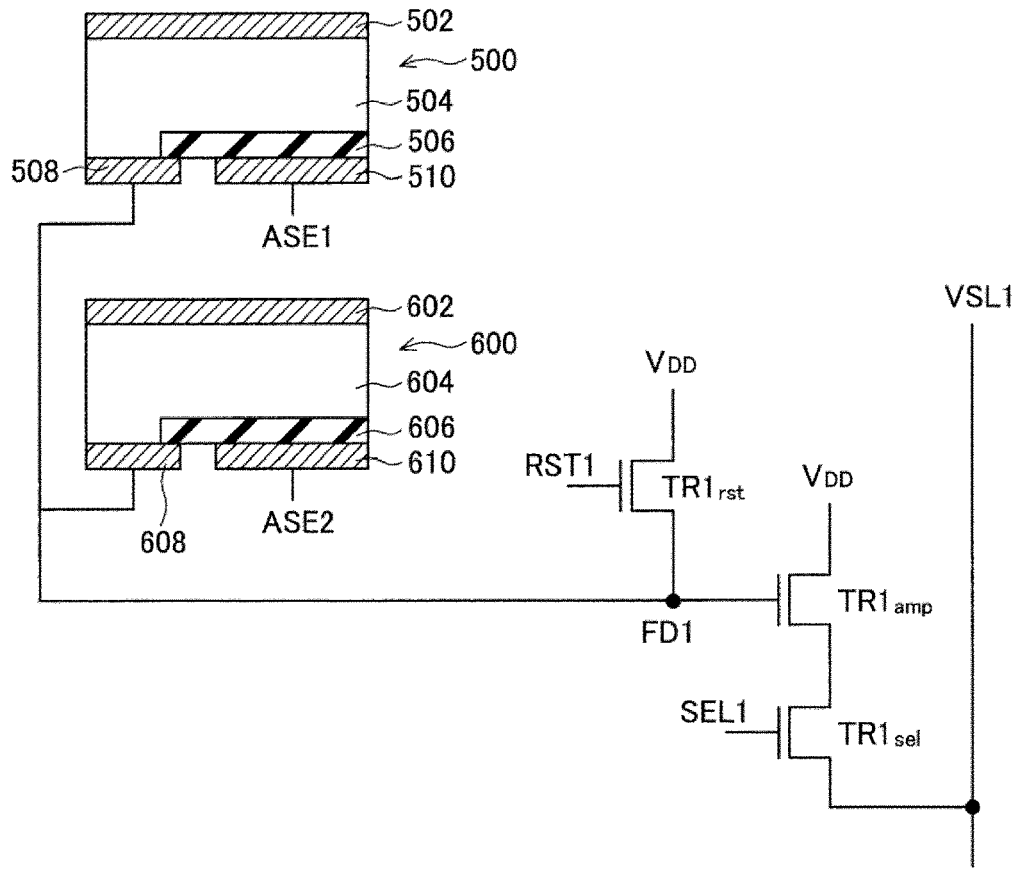
FIG. 16 is an equivalent circuit diagram of a PD of the solid-state imaging element according to the present embodiment.

The layout configuration of the solid-state imaging element 100*a* according to the present embodiment has been described above. Next, an equivalent circuit of the solid-state imaging element 100*a* according to the present embodiment, specifically, an equivalent circuit of the PDs 500 and 600 will be described with reference to FIG. 16. FIG. 16 is an equivalent circuit diagram of the PDs 500 and 600 of the solid-state imaging element 100*a* according to the present embodiment.

As described above, in the present embodiment, the PDs 500 and 600 include common electrodes 502 and 602, the reading electrodes 508 and 608, and photoelectric conversion films 504 and 604 sandwiched therebetween. Moreover, the PDs 500 and 600 have storage electrodes 510 and 610 in contact with the photoelectric conversion films 504 and 604 via the insulating films 506 and 606.

As illustrated in FIG. 16, the reading electrodes 508 and 608 are electrically connected, via wiring or the like, to one of a drain and a source of a reset transistor $TR1_{rst}$ that is for resetting stored charges. A gate of the reset transistor $TR1_{rst}$ is electrically connected to a reset signal line RST1, and is further electrically connected to a vertical drive circuit unit 32 described above. Furthermore, another one (a side not connected to the reading electrodes 508 and 608) of the drain and the source of the reset transistor $TR1_{rst}$ is electrically connected to a power supply circuit (a power supply potential $V_{DD}$). That is, in the present embodiment, as illustrated in FIG. 16, it can be said that the reset transistor $TR1_{rst}$ is a common pixel transistor shared by the PDs 500 and 600.

Moreover, the reading electrodes 508 and 608 are electrically connected, via wiring, to a gate of an amplification transistor $TR1_{amp}$ that converts a charge into a voltage and outputs as a pixel signal. Furthermore, a node FD1 connecting the reading electrodes 508 and 608, the gate of the amplification transistor $TR1_{amp}$, and one of the drain and the source of the reset transistor $TR1_{rst}$ constitutes a part of the reset transistor $TR1_{rst}$. Moreover, the node FD1 also functions as the floating diffusion unit 314 shared by the PDs 500 and 600. Charges from the reading electrodes 508 and 608 change a potential of the node FD1, and are converted into a voltage by the amplification transistor $TR1_{amp}$. Furthermore, one of a source and a drain of the amplification transistor $TR1_{amp}$ is electrically connected to one of a source and a drain of a selection transistor $TR1_{sel}$ that outputs the pixel signal described above obtained by conversion, to a signal line VSL1 via wiring in accordance with a selection signal. Moreover, another one of the source and the drain of the amplification transistor $TR1_{amp}$ (a side not connected to the selection transistor $TR1_{sel}$) is electrically connected to a power supply circuit (a power supply potential $V_{DD}$). That is, in the present embodiment, it can be said that the amplification transistor $TR1_{amp}$, and the selection transistor $TR1_{sel}$ are common pixel transistors shared by the PDs 500 and 600.

Moreover, another one of the source and the drain of the selection transistor $TR1_{sel}$ (a side not connected to the amplification transistor $TR1_{amp}$) is electrically connected to the signal line VSL1 that transmits a converted voltage as a pixel signal, and is further electrically connected to the column signal processing circuit unit 34 described above. Furthermore, a gate of the selection transistor $TR1_{sel}$ is electrically connected to a selection line SEL1 that selects a row to output a pixel signal, and is further electrically connected to the vertical drive circuit unit 32 described above.

Furthermore, as illustrated in FIG. 16, the storage electrodes 510 and 610 are electrically connected to voltage application lines ASE1 and ASE2, respectively. As described above, the storage electrodes 510 and 610 can attract charges generated in the photoelectric conversion films 504 and 604 in accordance with an applied potential, and store the charges in the photoelectric conversion films 504 and 604, or transfer the charges to the reading electrodes 508 and 608. Moreover, the common electrodes 502 and 602 are electrically connected to a selection line (not illustrated) that selects a column to output a pixel signal.

Next, as a reference, an equivalent circuit of the PD 400 will also be described with reference to FIG. 17. FIG. 7 is an equivalent circuit diagram of the PD 400 included in the solid-state imaging element 100a according to the present embodiment.

Figure 17:
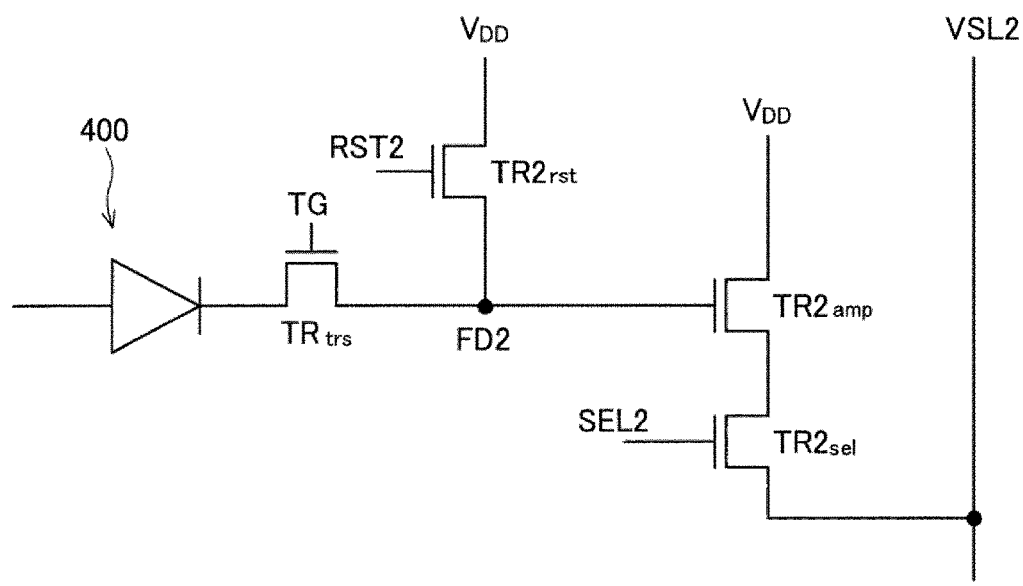
FIG. 17 is an equivalent circuit diagram of a PD included in the solid-state imaging element according to the present embodiment.

As illustrated in FIG. 17, the PD 400 provided in the semiconductor substrate 300 is connected, via wiring, to a pixel transistor (an amplification transistor $TR2_{amp}$, a transfer transistor $TR_{trs}$, a reset transistor $TR2_{rst}$, and a selection transistor $TR2_{sel}$) provided in the semiconductor substrate 300. Specifically, one side of the PD 400 is electrically connected, via wiring, to one of a source and a drain of the transfer transistor $TR_{trs}$ that transfers charges. Moreover, another one of the source and the drain of the transfer transistor $TR_{trs}$ (a side not connected to the PD 400) is electrically connected, via wiring, to one of a source and a drain of the reset transistor $TR2_{rst}$. Furthermore, a gate of the transfer transistor $TR_{trs}$ is electrically connected to a transfer gate line TG, and is further connected to the vertical drive circuit unit 32 described above. Then, another one of the source and the drain of the reset transistor $TR2_{rst}$ (a side not connected to the transfer transistor $TR_{trs}$) is electrically connected to a power supply circuit (a power supply potential $V_{DD}$). Moreover, a gate of the reset transistor $TR2_{rst}$ is electrically connected to a reset line RST2, and is further connected to the vertical drive circuit unit 32 described above.

Moreover, another one of the source and the drain of the transfer transistor $TR_{trs}$ (a side not connected to the PD 400) is also electrically connected to a gate of the amplification transistor $TR2_{amp}$ that amplifies (converts) a charge and outputs as a pixel signal via wiring. Furthermore, one of a source and a drain of the amplification transistor $TR2_{amp}$ is electrically connected to one of a source and a drain of the selection transistor $TR2_{sel}$ that outputs the pixel signal described above, to a signal line VSL2 via wiring in accordance with a selection signal. Then, another one of the source and the drain of the amplification transistor $TR2_{amp}$ (a side not connected to the selection transistor $TR2_{sel}$) is electrically connected to a power supply circuit (a power supply potential $V_{DD}$). Furthermore, another one of the source and the drain of the selection transistor $TR2_{sel}$ (a side not connected to the amplification transistor $TR2_{amp}$) is electrically connected to the signal line VSL2 described above, and is further electrically connected to the column signal processing circuit unit 34 described above. Then, a gate of the selection transistor $TR2_{sel}$ is electrically connected to a selection line SEL2, and is further electrically connected to the vertical drive circuit unit 32 described above.

<4.4 About Reading Method of Solid-State Imaging Element 100a>

Figure 18:
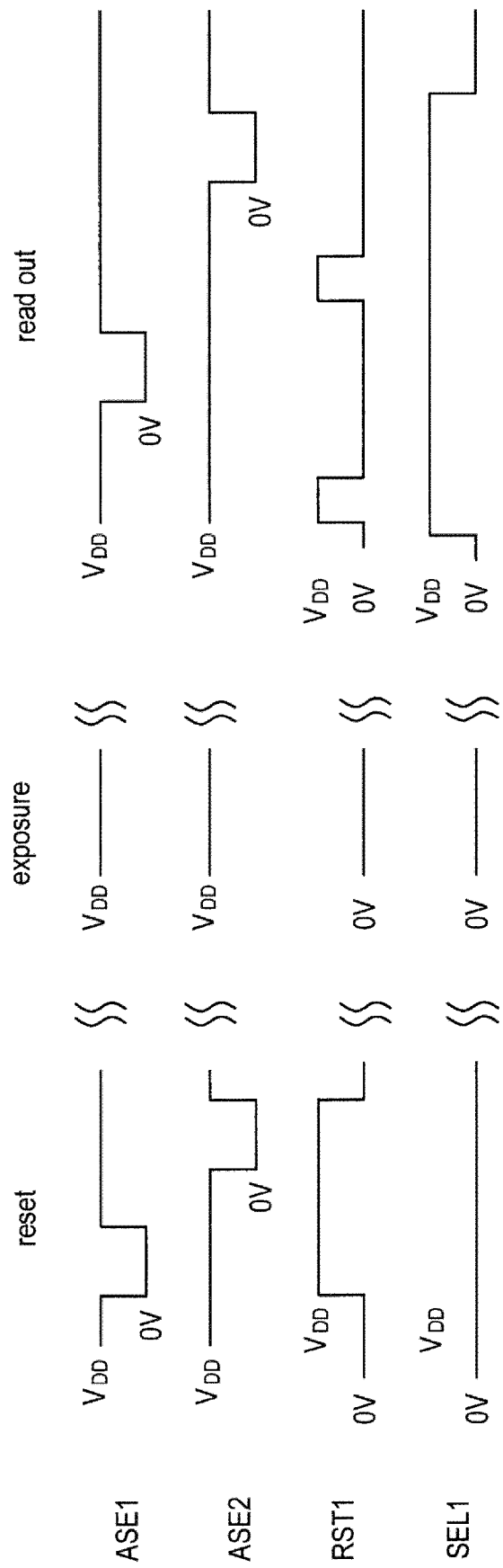
FIG. 18 is an explanatory view for explaining a reading method of the solid-state imaging element according to the present embodiment.

The equivalent circuit of the solid-state imaging element 100a according to the present embodiment has been described above. Next, a reading method of the solid-state imaging element 100a according to the present embodiment will be described with reference to FIG. 18. FIG. 18 is an explanatory view for explaining the reading method of the solid-state imaging element 100a according to the present embodiment.

First, in the present embodiment, a reset operation is performed as illustrated on a left side of FIG. 18. In the reset operation, a potential of the selection line SEL1 is set to 0 V, and a potential of a reset line RST1 is set to 0 V at the start, but is switched to the power supply potential $V_{DD}$. Next, at the same time as a potential of the reset line RST1 being switched to the power supply potential $V_{DD}$, a potential of the storage electrode 510 of the PD 500 is switched from the power supply potential $V_{DD}$ to 0 V via the voltage application line ASE1, and is returned to the power supply potential $V_{DD}$ again after a lapse of a predetermined time. Then, at the same time as the potential of the storage electrode 510 of the PD 500 being returned to the power supply potential $V_{DD}$ again, a potential of the storage electrode 610 of the PD 600 is switched from the power supply potential $V_{DD}$ to 0 V via the voltage application line ASE2, and is returned to the power supply potential $V_{DD}$ again after a lapse of a predetermined time. Moreover, at the same time as the potential of the storage electrode 610 of the PD 600 being returned to the power supply potential $V_{DD}$ again, the potential of the reset line RST1 is returned to 0 V again. By such a reset operation, charges stored in the photoelectric conversion films 504 and 604 of the PDs 500 and 600 can be reset.

Next, in the present embodiment, as illustrated in a center of FIG. 18, exposure, that is, an exposure operation is performed in which charges are stored in the photoelectric conversion films 504 and 604 of the PDs 500 and 600 by photoelectric conversion. In the exposure operation, potentials of the selection line SEL1 and the reset line RST1 are maintained at 0 V. Whereas, potentials of the storage electrode 510 of the PD 500 and the storage electrode 610 of the PD 600 are maintained at the power supply potential $V_{DD}$ via the voltage application lines ASE1 and ASE2. By such an exposure operation, charges are stored in the photoelectric conversion films 504 and 604 of the PDs 500 and 600 so as to be attracted to the storage electrodes 510 and 610.

Moreover, in the present embodiment, as illustrated on a right side of FIG. 18, a read out operation is performed on charges stored in the photoelectric conversion films 504 and 604 of the PDs 500 and 600. In the read out operation, a potential of the selection line SEL1 is maintained at the power supply potential $V_{DD}$, and the solid-state imaging element 100a to be subjected to reading is selected. Next, the potential of the reset line RST1 is switched from 0 V to the power supply potential $V_{DD}$, and is returned to 0 V again after a lapse of a predetermined time. By doing this way, charges stored in the floating diffusion unit 314 are reset. Next, a potential of the storage electrode 510 of the PD 500 is switched from the power supply potential $V_{DD}$ to 0 V via the voltage application line ASE1, and is returned to the power supply potential $V_{DD}$ again after a lapse of a predetermined time. By doing this way, charges stored in the photoelectric conversion film 504 so as to be attracted to the storage electrode 510 are transferred to the floating diffusion unit 314 via the reading electrode 508. Then, the charges transferred to the floating diffusion unit 314 are further converted into a voltage by the amplification transistor TR1$_{amp}$ described above, and are read out as a pixel signal.

Next, the potential of the reset line RST1 is switched from 0 V to the power supply potential $V_{DD}$, and is returned to 0 V again after a lapse of a predetermined time. By doing this way, charges stored in the floating diffusion unit 314 are reset. Then, a potential of the storage electrode 610 of the PD 600 is switched from the power supply potential $V_{DD}$ to 0 V via the voltage application line ASE2, and is returned to the power supply potential $V_{DD}$ again after a lapse of a predetermined time. By doing this way, charges stored in the photoelectric conversion film 604 so as to be attracted to the storage electrode 610 are transferred to the floating diffusion unit 314 via the reading electrode 608. In this way, the charges stored in the photoelectric conversion film 604 of the PD 600 are read out. Then, the charges transferred to the floating diffusion unit 314 are further converted into a voltage by the amplification transistor TR1$_{amp}$ described above, and are read out as a pixel signal.

As described above, a series of operations such as the reset operation, the exposure operation, and the read out operation is completed. That is, in the reading method according to the present embodiment, by individually controlling potentials applied to the storage electrodes 510 and 610, charges individually stored in the photoelectric conversion films 504 and 604 can be sequentially transferred to the reading electrodes 508 and 608 with a time difference. Moreover, in the present embodiment, the charges sequentially transferred to the reading electrodes 508 and 608 can be sequentially stored in the floating diffusion unit 314 and sequentially read out.

As described above, in the present embodiment, it is possible to temporarily store charges in the photoelectric conversion films 504 and 604 of the PDs 500 and 600 by performing the above-described operations. Then, in the present embodiment, by performing the operations as described above, the charges stored in the photoelectric conversion films 504 and 604 each are sequentially transferred to the reading electrodes 508 and 608 with a time difference, and can be sequentially stored in the floating diffusion unit 314 with a time difference. Therefore, according to the present embodiment, since charges can be sequentially transferred with a time difference, one floating diffusion unit 314 and one through electrode 460 can be shared by different PDs 500 and 600.

As a result, in the present embodiment, the different PDs 500 and 600 can share one floating diffusion unit 314 and one through electrode 460. Therefore, according to the present embodiment, since an increase in processing area of the semiconductor substrate 300 due to formation of the through electrode 460 can be avoided, and reduction of an incident surface of the PD 400 can be avoided, an amount of light incident on the PD 400 does not decrease, and deterioration in sensitivity characteristics of the PD 400 can be avoided. Moreover, according to the present embodiment, since the different PDs 500 and 600 share the floating diffusion unit 314 and the through electrode 460, it is possible to avoid an increase in area of a chip on which the solid-state imaging device 1 is mounted. As a result, according to the present embodiment, an increase in manufacturing cost of the solid-state imaging device 1 can be avoided. In addition, according to the present embodiment, since the through electrode 460 is shared by the different PDs 500 and 600, the number of through electrodes 460 penetrating the semiconductor substrate 300 can be reduced. As a result, according to the present embodiment, it is possible to avoid deterioration of dark current characteristics of the solid-state imaging device 1 due to a decrease in crystallinity of the semiconductor substrate 300.

5. Third Embodiment

Figure 19:
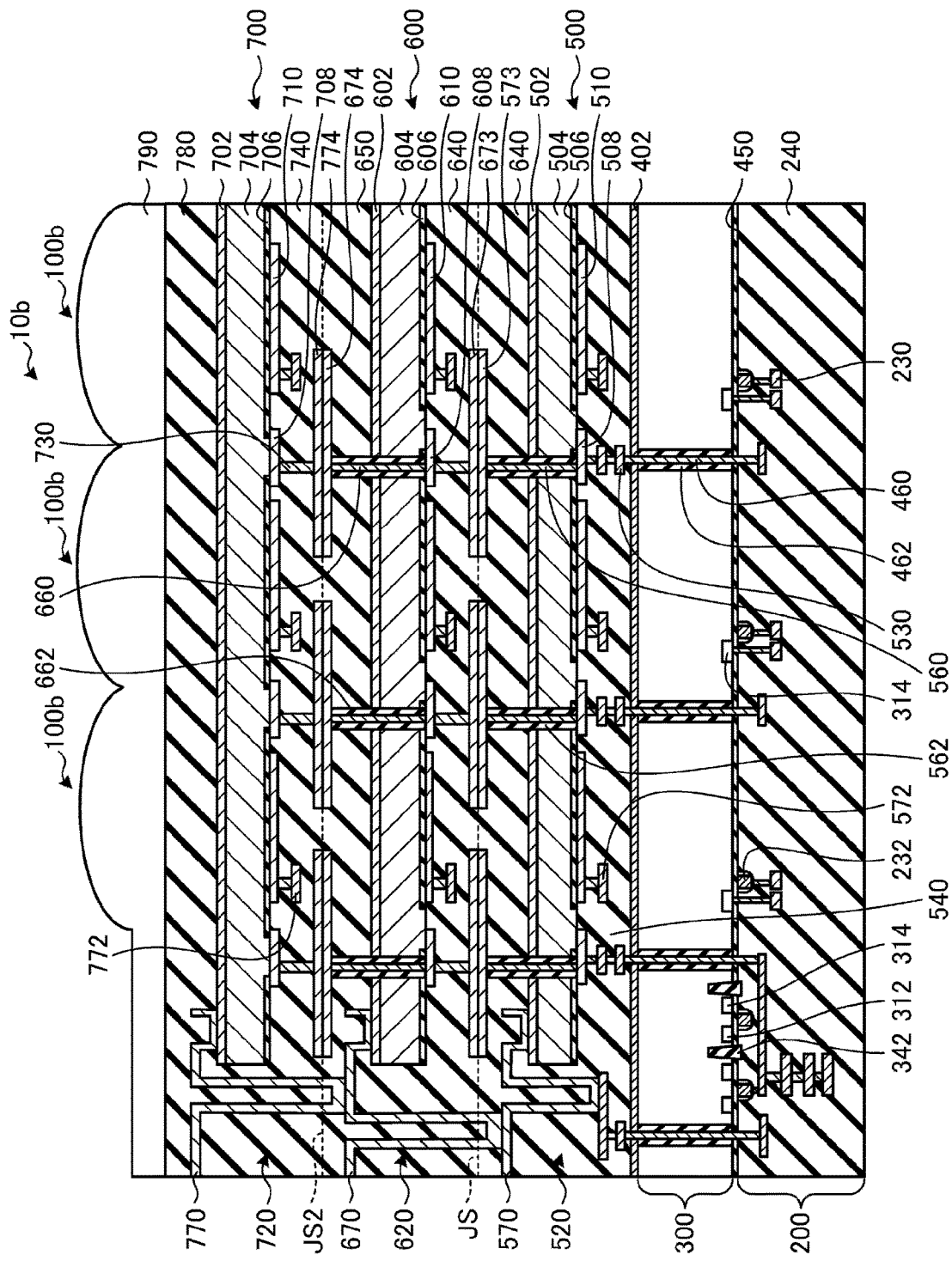
FIG. 19 is a cross-sectional view of a pixel array unit according to the present embodiment.

In the above-described second embodiment, the solid-state imaging element 100a has been a solid-state imaging element in which blue light is photoelectrically converted by the photoelectric conversion film 604 formed above the semiconductor substrate 300, green light is photoelectrically convert by the photoelectric conversion film 504 provided below the PD 600, and red light is photoelectrically convert by the PD 400 provided in a semiconductor substrate 300. However, without limiting to such a configuration, an embodiment of the present disclosure may adopt a solid-state imaging element 100b in which blue light, green light, and red light are photoelectrically converted by three photoelectric conversion films laminated on a semiconductor substrate 300. Therefore, as a third embodiment of the present disclosure, a laminated structure of the solid-state imaging element 100b including three photoelectric conversion films 504, 604, and 704 laminated on the semiconductor substrate 300 will be described with reference to FIG. 19. FIG. 19 is a cross-sectional view of a pixel array unit 10b according to the present embodiment, and specifically, in the pixel array unit 10b, the solid-state imaging elements 100b having the three photoelectric conversion films 504, 604, and 704 laminated on the semiconductor substrate 300 are arranged in a matrix.

Specifically, as illustrated in FIG. 19, the solid-state imaging element 100b according to the present embodiment has a configuration similar to that of the above-described second embodiment from a wiring layer 200 to a PD 600 except that a PD 400 is not provided in the semiconductor substrate 300. Therefore, a description of the detailed configuration from the wiring layer 200 to the PD 600 is omitted here.

In the present embodiment, as illustrated in FIG. 19, a through electrode 660 is provided so as to penetrate a part of an insulating film 650 and the PD 600 from an electrode 674 to a reading electrode 608 of the PD 600. Then, in the present embodiment, electrodes 674 and 774 are joined to each other at joint surfaces JS2. Furthermore, the through electrode 660 and wiring 730 are electrically connected via the electrodes 674 and 774. In the present embodiment, the electrode 674 is provided on the joint surface JS2 of the PD 600, and the electrode 774 is provided on a joint surface JS2 of a PD 700. Therefore, in the present embodiment, it can be said that the PD 600 and the PD 700 are joined at the joint surfaces JS2 facing each other.

Then, in the present embodiment, a reading electrode 708 of the PD 700 is electrically connected to the reading electrode 608 of the PD 600 via the wiring 730 and the through electrode 660. Moreover, the reading electrode 708 of the PD 700 is electrically connected to a floating diffusion unit 314 provided in the semiconductor substrate 300 via through electrodes 460, 560, and 660. Therefore, the through electrodes 460, 560, and 660 allows the floating diffusion unit 314 described above to temporarily store charges generated by photoelectric conversion in the PD 700. Moreover, the through electrode 660 can electrically connect the reading electrode 708 of the PD 700 to a pixel transistor provided in the semiconductor substrate 300 via the through electrode 560 and the through electrode 460. Note that, in the present embodiment, the through electrode 660 may penetrate a part of the insulating film 650 and the PD 600, or may penetrate only the PD 600, and is not particularly limited.

Furthermore, in the present embodiment, the through electrode 660 can be formed by a metal film or the like of Cu or the like, similarly to the through electrode 560 described above. Furthermore, similarly to the through electrode 560 described above, an insulating film 662 including $SiO_2$ or the like may be provided on an outer periphery of the through electrode 660 in order to prevent a short circuit between the through electrode 660 and the PD 600. Note that the through electrode 660 is similar to the through electrode 560 described above, and thus a detailed description thereof will be omitted here.

Moreover, in the present embodiment, the PD 700 that converts light into a charge is provided above a wiring layer 720. Specifically, as the PD 700, similarly to the PDs 500 and 600 described above, a common electrode (an upper electrode) 702, the photoelectric conversion film 704, an insulating film 706, the reading electrode (a lower electrode) 708, and a storage electrode 710 are sequentially laminated. Note that the common electrode 702, the photoelectric conversion film 704, the insulating film 706, the reading electrode 708, and the storage electrode 710 are similar to those of the PDs 500 and 600 described above, and thus a detailed description thereof is omitted here.

Furthermore, as illustrated in FIG. 19, the reading electrode 708 is electrically connected to the through electrode 560 via the wiring 730 and the through electrode 660. The common electrode 702 is electrically connected to wiring 770 that applies a desired potential to the common electrode 702. Moreover, the storage electrode 710 is electrically connected to wiring 772 that applies a desired potential to the storage electrode 710.

For example, the solid-state imaging element 100b according to the present embodiment can photoelectrically convert blue light with the photoelectric conversion film 704 (the PD 700) formed above the semiconductor substrate 300, photoelectrically convert green light with the photoelectric conversion film 604 (the PD 600) provided below the PD 700, and photoelectrically convert red light with the photoelectric conversion film 504 (a PD 500) provided below the PD 600.

Note that, in a case where the photoelectric conversion film 504 is made function as a photoelectric conversion film for detection of red light, the photoelectric conversion film 504 can contain, for example, a phthalocyanine dye, a subphthalocyanine dye (a subphthalocyanine derivative), or the like.

According to the present embodiment, even in the solid-state imaging element 100b having the three photoelectric conversion films 504, 604, and 704 laminated on the semiconductor substrate 300, it is possible to avoid deterioration of characteristics while avoiding an increase in manufacturing cost, similarly to the second embodiment.

Specifically, also in the present embodiment, by performing operations similar to the reading method of the solid-state imaging element 100a of the above-described second embodiment, charges can be temporarily stored in the photoelectric conversion films 504, 604, and 704 of the PDs 500, 600, and 700 by storage electrodes 510, 610, and 710. Therefore, according to the present embodiment, the floating diffusion unit 314 and the through electrode 460 can be shared by the different PDs 500, 600, and 700.

As a result, also in the present embodiment, since an increase in processing area of the semiconductor substrate 300 due to formation of the through electrode 460 can be avoided, and reduction of an incident surface of a PD 400 can be avoided, deterioration in sensitivity characteristics of the PD 400 can be avoided. Moreover, according to the present embodiment, since the different PDs 500, 600, and 700 share the floating diffusion unit 314 and the through electrode 460, it is possible to avoid an increase in area of a chip on which a solid-state imaging device 1 is mounted, and consequently to avoid an increase in manufacturing cost. In addition, according to the present embodiment, since the through electrode 460 is shared by the different PDs 500, 600, and 700, the number of through electrodes 460 penetrating the semiconductor substrate 300 can be reduced. As a result, according to the present embodiment as well, it is possible to avoid deterioration of dark current characteristics of the solid-state imaging device 1 due to a decrease in crystallinity of the semiconductor substrate 300.

Note that the present embodiment is not limited to the solid-state imaging element 100a including the three photoelectric conversion films 504, 604, and 704 laminated on the semiconductor substrate 300, but may be, for example, a solid-state imaging element including four or more photoelectric conversion films laminated on the semiconductor substrate 300.

Furthermore, in the present embodiment, the configuration in which the PD 700 is added to the solid-state imaging element 100a according to the second embodiment has been described, but the present embodiment is not limited to this. Similarly, the PD 700 may be added to the solid-state imaging element 100 according to the first embodiment.

6. Fourth Embodiment

Figure 20:
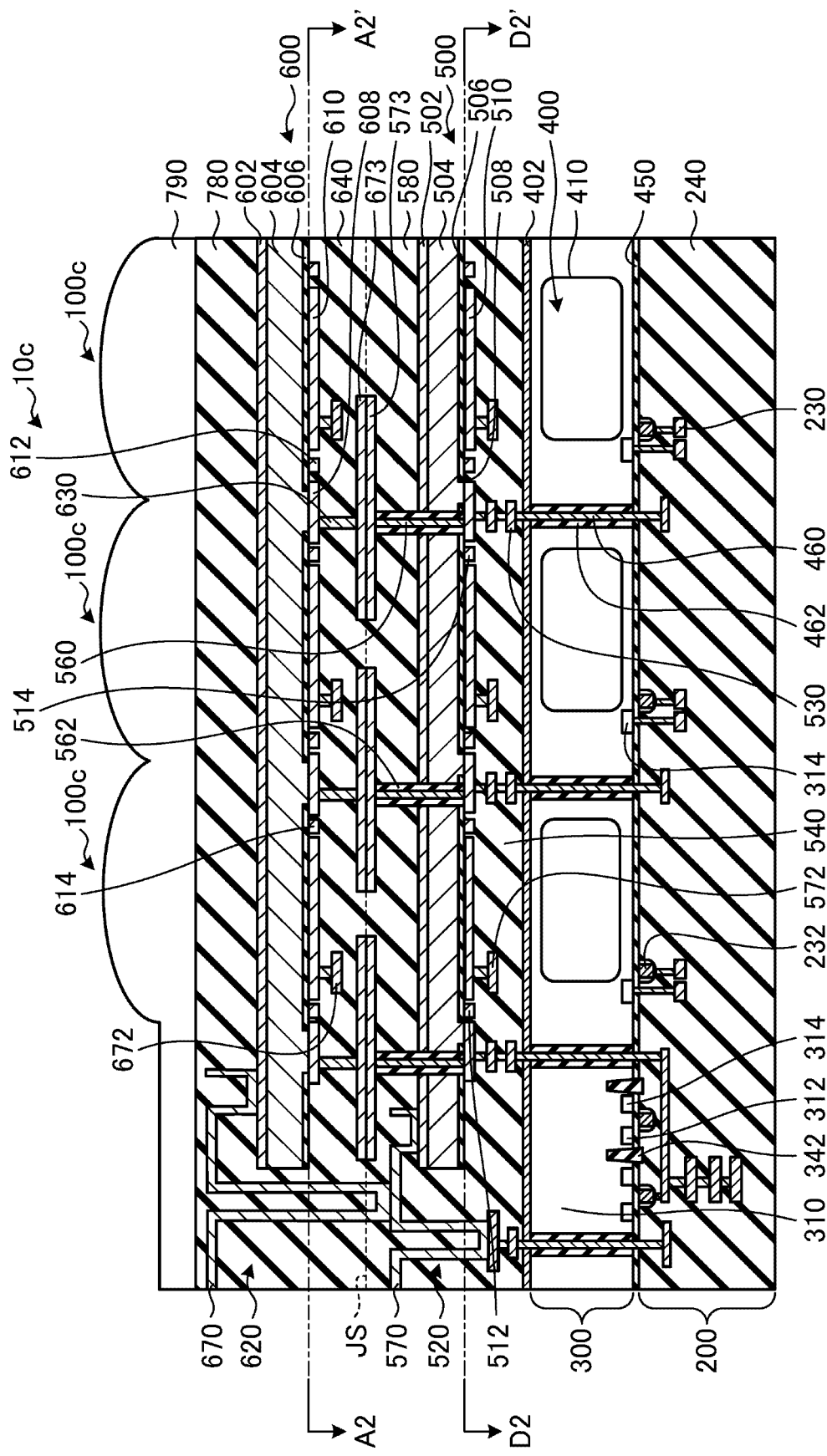
FIG. 20 is a cross-sectional view of a pixel array unit according to the present embodiment.

Moreover, in an embodiment of the present disclosure, the PDs 500 and 600 may include transfer electrodes 512 and 612 and shield electrodes 514 and 614. Therefore, as a fourth embodiment of the present disclosure, a laminated structure of a solid-state imaging element 100c including PDs 500 and 600 having transfer electrodes 512 and 612 and shield electrodes 514 and 614 will be described with reference to FIG. 20. FIG. 20 is a cross-sectional view of a pixel array unit 10c according to the present embodiment, and specifically, in the pixel array unit 10c, the solid-state imaging elements 100c including the PDs 500 and 600 having the transfer electrodes 512 and 612 and the shield electrodes 514 and 614 are arranged in a matrix.

Specifically, in the present embodiment, as illustrated in FIG. 20, the PDs 500 and 600 further include the transfer electrodes 512 and 612 provided between the reading electrodes 508 and 608 and storage electrodes 510 and 610, and opposed to common electrodes 502 and 602 via photoelectric conversion films 504 and 604 and insulating films 506 and 606. The transfer electrodes 512 and 612 described above are electrodes provided between the reading electrodes 508 and 608 and the storage electrodes 510 and 610, and configured to control charge transfer. More specifically, during a storage period for storing charges into the photoelectric conversion films 504 and 604, a predetermined potential is applied to the transfer electrodes 512 and 612, and charges stored so as to be attracted to the storage electrodes 510 and 510 can be blocked. Moreover, during a transfer period for transferring charges, the transfer electrodes 512 and 612 are in an open state, and the stored charges can be easily transferred to the reading electrodes 508 and 608.

Moreover, in the present embodiment, as illustrated in FIG. 20, the PDs 500 and 600 further include the shield electrodes 514 and 614 provided between reading electrodes 508 and 608 and the storage electrodes 510 and 610, and opposed to the common electrodes 502 and 602 via the photoelectric conversion films 504 and 604 and the insulating films 506 and 606. The shield electrodes 514 and 614 described above are, for example, electrodes maintained at a predetermined potential and configured to suppress charge leakage from an adjacent solid-state imaging element 100b or to an adjacent solid-state imaging element 100b.

Note that the transfer electrodes 512 and 612 and the shield electrodes 514 and 614 can be formed by a material similar to those of the reading electrodes 508 and 608 and the storage electrodes 510 and 610 described above. Moreover, the transfer electrodes 512 and 612 and the shield electrodes 514 and 614 can be formed simultaneously with the reading electrodes 508 and 608 and the storage electrodes 510 and 610 described above.

Figure 21:
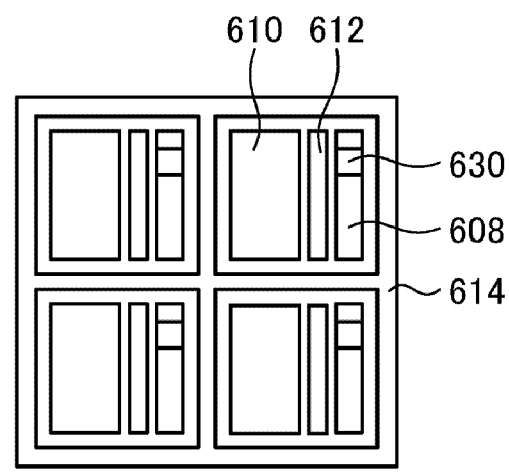
FIG. 21 is a cross-sectional view of a solid-state imaging element taken along line D2-D2' in FIG. 20.

Here, a layout configuration of the solid-state imaging element 100c according to the present embodiment will be described with reference to FIG. 21. FIG. 21 is a cross-sectional view of the solid-state imaging element 100c taken along line D2-D2' in FIG. 20. Note that FIG. 21 illustrates a cross section of four pixels (four solid-state imaging elements 100c).

Here, FIG. 21 illustrates a cross section in a case where the solid-state imaging element 100c is cut along line A2-A2' (an interface between the insulating film 606 and the storage electrode 610) illustrated in FIG. 20, and the cut surface is viewed from above the solid-state imaging element 100c. As illustrated in FIG. 21, the shield electrode 614 is arranged so as to surround the storage electrode 610 and the reading electrode 608. Furthermore, the transfer electrode 612 is arranged between the storage electrode 610 and the reading electrode 608. Note that the transfer electrode 512 and the shield electrode 514 are also arranged similarly to the shield electrode 614, and thus illustration thereof is omitted.

Figure 22:
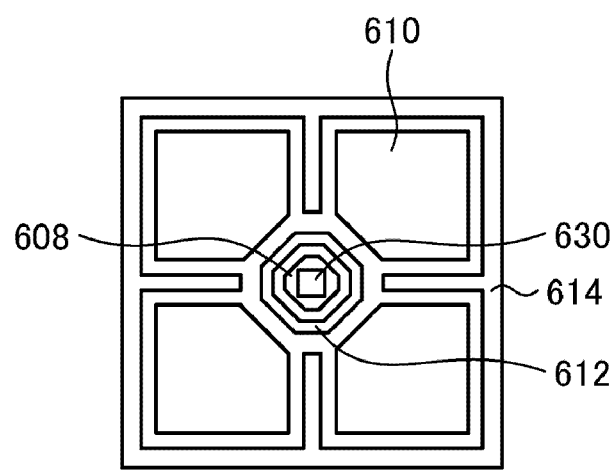
FIG. 22 is a cross-sectional view of the solid-state imaging element taken along line A2-A2' in FIG. 20.

FIG. 22 is a cross-sectional view of the solid-state imaging element 100c taken along line A2-A2' in FIG. 20. FIG. 20 has illustrated a case where the reading electrode 608 is provided for every pixel, but the reading electrode 608 can be shared by a plurality of pixels as shown in Modification 1 of the first embodiment. FIG. 20 illustrates a case where four pixels share one reading electrode 608. In this case, as illustrated in FIG. 22, the shield electrode 614 surrounds the storage electrode 610 in a state where a portion close to the reading electrode 608 is opened. In this way, in a case where one reading electrode 608 is shared by four pixels, the shield electrode 614 is arranged so as to surround the storage electrode 610 in a partially opened state, and the reading electrode 608 is arranged in the opening of the shield electrode 614. Furthermore, the transfer electrode 612 is arranged between the storage electrode 610 and the reading electrode 608 so as to surround the reading electrode 608. Note that the transfer electrode 512 and the shield electrode 514 are also arranged similarly to the shield electrode 614, and thus illustration thereof is omitted.

As described above, according to the present embodiment, since the PDs 500 and 600 have the shield electrodes 514 and 614, the characteristics of the PDs 500 and 600 can be further improved.

Furthermore, in the present embodiment, the configuration in which the shield electrodes 514 and 614 are added to the solid-state imaging element 100a according to the second embodiment has been described, but the present embodiment is not limited to this. Similarly, the shield electrodes 514 and 614 may be added to the solid-state imaging element 100 according to the first embodiment.

7. Fifth Embodiment

Figure 23:
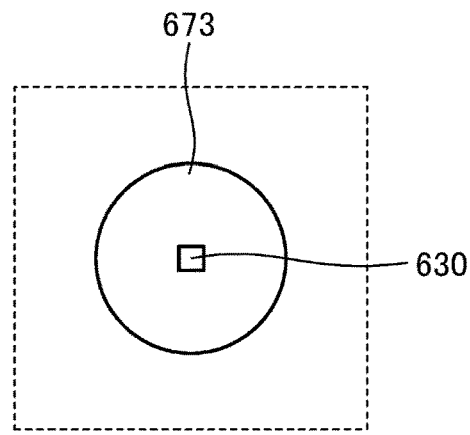
FIG. 23 is a view for explaining a shape of an electrode according to the present embodiment.

Moreover, in an embodiment of the present disclosure, a shape of the electrodes 573 and 673 is not limited to a quadrangle. Therefore, as a fifth embodiment of the present disclosure, a case where electrodes 573 and 673 are substantially circular will be described with reference to FIG. 23. FIG. 23 is a view for explaining a shape of the electrode 673 according to the present embodiment. FIG. 23 is a cross-sectional view of the solid-state imaging element 100 taken along line B-B' in FIG. 3 in the first embodiment, for example.

Here, FIG. 23 illustrates a cross section in a case where the solid-state imaging element 100 is cut along line B-B' (an interface between the insulating film 640 and the electrode 673) illustrated in FIG. 3, and the cut surface is viewed from above the solid-state imaging element 100. In the present embodiment, as illustrated in FIG. 23, the electrode 673 has a substantially circular shape. Note that, since a shape of the electrode 573 is substantially the same as the shape of the electrode 673, illustration thereof is omitted.

By making the electrodes 573 and 673 substantially circular, it is possible to prevent four corners from being depressed by recess as compared with the case of a quadrangle, and it is possible to avoid generation of a void.

Note that, here, the shapes of the electrodes 573 and 673 in the first embodiment have been made substantially circular, but the electrodes 573, 673, 674, and 774 in the second to fourth embodiments can also be made substantially circular in a similar manner.

Note that, here, the shapes of the electrodes 573 and 673 have been made substantially circular, but the present embodiment is not limited to this. In the present embodiment, the electrodes 573 and 673 can have various shapes such as a polygon.

8. Sixth Embodiment

Figure 24:
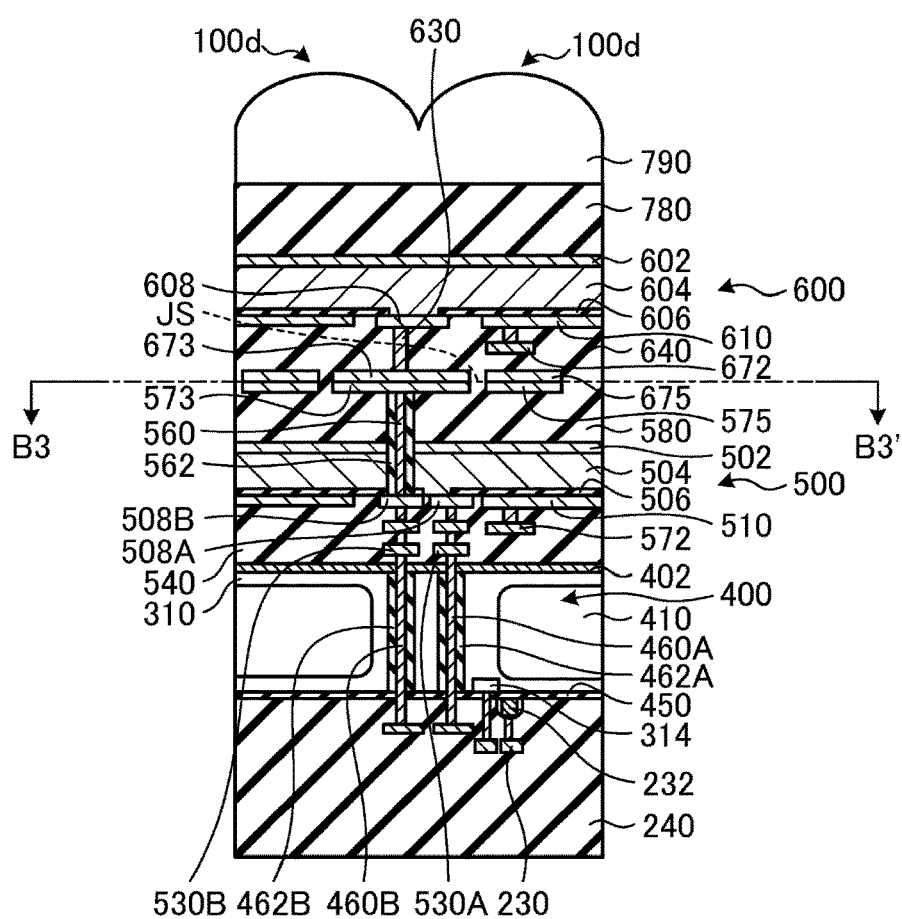
FIG. 24 is a cross-sectional view of a pixel array unit according to the present embodiment.

Moreover, in an embodiment of the present disclosure, the PDs 500 and 600 may have dummy electrodes 575 and 675. Therefore, as a sixth embodiment of the present disclosure, a laminated structure of a solid-state imaging element 100d including PDs 500 and 600 having dummy electrodes 575 and 675 will be described with reference to FIG. 24. FIG. 24 is a cross-sectional view of a pixel array unit 10*d* according to the present embodiment, and specifically, in the pixel array unit 10*d*, the solid-state imaging elements 100*d* including the PDs 500 and 600 having the dummy electrodes 575 and 675 are arranged in a matrix.

Specifically, in the present embodiment, as illustrated in FIG. 24, the PD 500 further includes the dummy electrode 575 between electrodes 573 of the individual solid-state imaging elements 100*d* on a joint surface JS. Similarly, the PD 600 further includes the dummy electrode 675 between electrodes 673 of the individual solid-state imaging elements 100*d* on the joint surface JS.

Note that the dummy electrodes 575 and 675 can be formed by a material similar to those of the electrodes 573 and 673 described above. Moreover, the dummy electrodes 575 and 675 can be formed simultaneously with the electrodes 573 and 673 described above.

Figure 25:
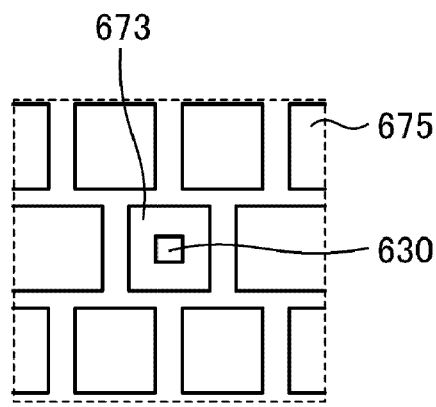
FIG. 25 is a cross-sectional view of a solid-state imaging element taken along line B3-B3' in FIG. 24.

Here, a layout configuration of the solid-state imaging element 100*c* according to the present embodiment will be described with reference to FIG. 25. FIG. 25 is a cross-sectional view of the solid-state imaging element 100*d* taken along line B3-B3' in FIG. 24. Note that FIG. 25 illustrates a cross section in a case where one reading electrode 508 and one reading electrode 608 are shared by four pixels (four solid-state imaging elements 100*d*).

In the present embodiment, as illustrated in FIG. 25, a plurality of dummy electrodes 675 is arranged around the electrode 673. In the present embodiment, the electrode 673 is formed to be smaller than a size of the electrode 673 of the solid-state imaging element 100 illustrated in FIG. 5, for example. Note that, since the dummy electrode 575 is formed similarly to the dummy electrode 675, illustration thereof is omitted.

Figure 26:
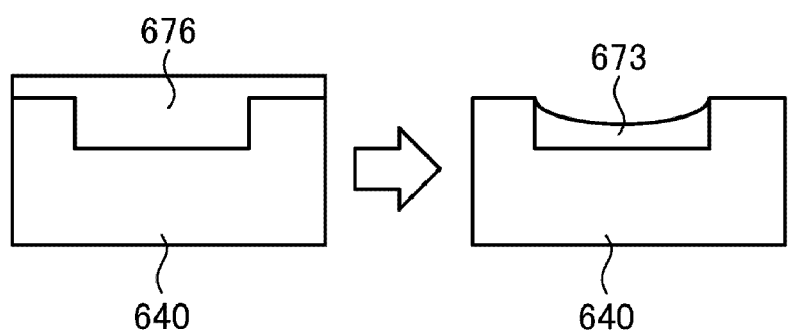
FIG. 26 is a view for explaining an effect obtained by providing a dummy electrode according to the present embodiment.
Figure 27:
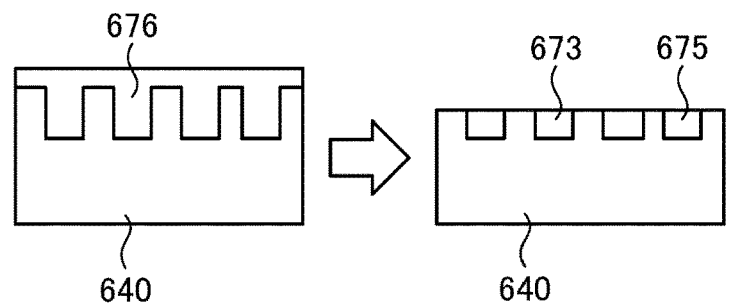
FIG. 27 is a view for explaining an effect obtained by providing a dummy electrode according to the present embodiment.

Here, an effect obtained by providing the dummy electrodes 575 and 675 in the present embodiment will be described with reference to FIGS. 26 and 27. FIGS. 26 and 27 are views for explaining an effect obtained by providing the dummy electrodes 575 and 675 according to the present embodiment.

First, a case of forming the electrode 673 in a case where the dummy electrode 675 is not provided will be described with reference to FIG. 26. In the case of forming the electrode 673, the electrode 673 is formed by planarizing a transparent conductive layer 676 formed on an insulating film 640 by, for example, a chemical mechanical polishing (CMP) method or a dry etching method. At this time, when an area of the electrode 673 whose polishing rate is higher than that of the insulating film 640 is large, and a density difference between the insulating film 640 and the electrode 673 is large, the electrode 673 is further planarized, and a step is generated in the insulating film 640 and the electrode 673 due to dishing or erosion.

Whereas, when the dummy electrode 675 is provided, a density difference between the insulating film 640 and the electrode 673 and the dummy electrode 675 can be reduced, and dishing and erosion of the electrode 673 can be suppressed as illustrated in FIG. 27. This configuration makes it possible to suppress a step between the insulating film 640 and the electrode 673 and the dummy electrode 675.

Note that, in the present embodiment, a plurality of dummy electrodes 675 is arranged around the electrode 673. However, without particularly limited to this, the number of dummy electrodes 675 may be one.

9. Seventh Embodiment

Figure 28:
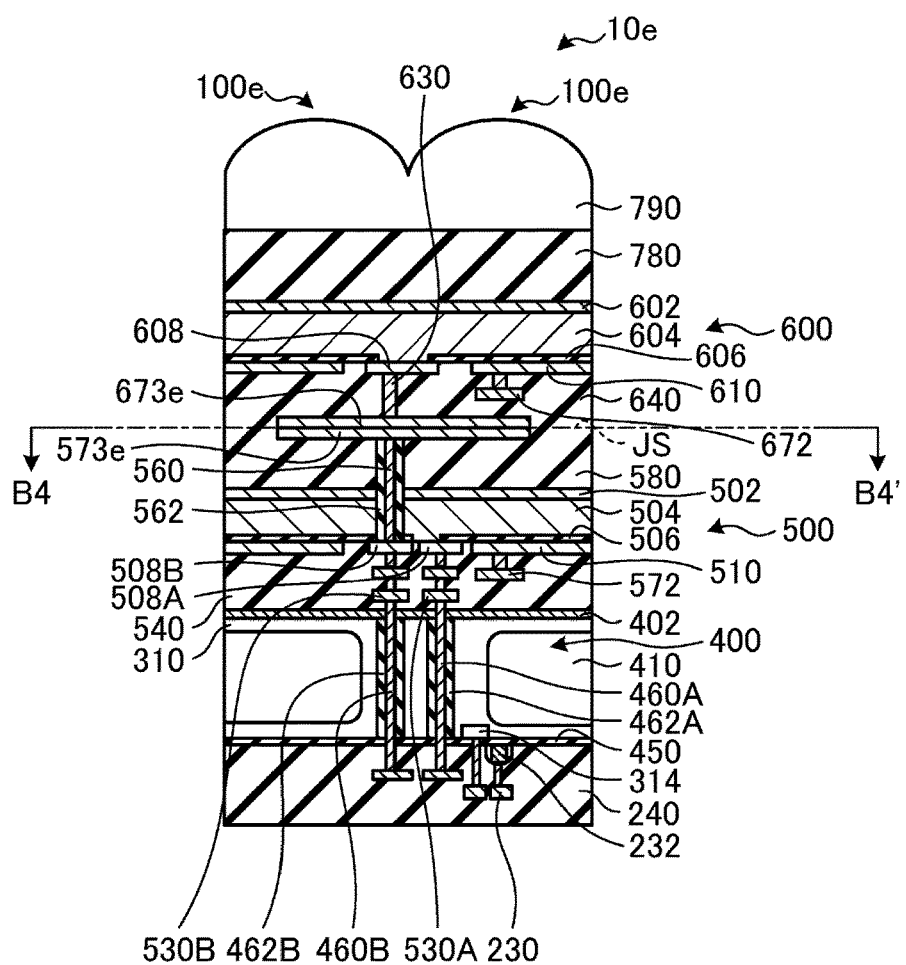
FIG. 28 is a cross-sectional view of a pixel array unit according to the present embodiment.

Moreover, in an embodiment of the present disclosure, electrodes 573*a* and 673*a* may have openings. Therefore, as a seventh embodiment of the present disclosure, a laminated structure of a solid-state imaging element 100*e* including PDs 500 and 600 having electrodes 573*a* and 673*a* will be described with reference to FIG. 28. FIG. 28 is a cross-sectional view of a pixel array unit 10*e* according to the present embodiment, and specifically, in the pixel array unit 10*e*, the solid-state imaging elements 100*e* including the PDs 500 and 600 having the electrodes 573*a* and 673*a* are arranged in a matrix.

Figure 29:
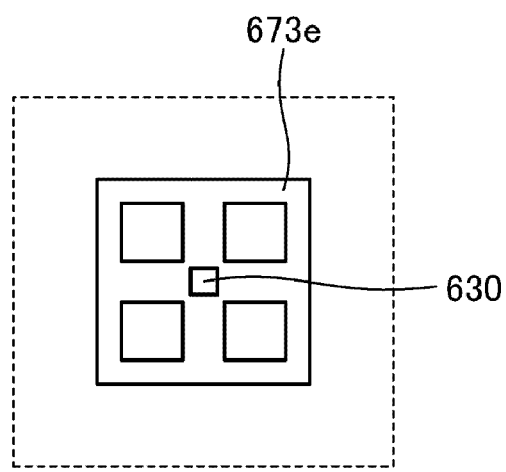
FIG. 29 is a cross-sectional view of a solid-state imaging element taken along line B4-B4' in FIG. 28.

Here, a layout configuration of the solid-state imaging element 100*e* according to the present embodiment will be described with reference to FIG. 29. FIG. 29 is a cross-sectional view of the solid-state imaging element 100*e* taken along line B4-B4' in FIG. 28. Note that FIG. 29 illustrates a cross section in a case where one reading electrode 508 and one reading electrode 608 are shared by four pixels (four solid-state imaging elements 100*e*).

In the present embodiment, as illustrated in FIG. 29, the electrode 673*a* has a lattice shape in which four rectangular openings are formed. In this way, by forming the electrode 673*a* in a lattice shape, a density difference between an insulating film 640 and the electrode 673*a* can be reduced, and erosion at a time of forming the electrode 673*a* can be suppressed similarly to the sixth embodiment. Note that, since the electrode 573*a* also has a shape similar to the electrode 673*a*, illustration thereof is omitted.

As described above, according to the present embodiment, by forming the electrodes 573*a* and 673*a* in a lattice shape, it is easy to join the electrodes 573*a* and 673*a* even in a case where joint misalignment occurs at a joint surface JS, and it is possible to more reliably electrically connect a through electrode 630 and a through electrode 560, while suppressing a density difference (an area ratio of the electrodes 573*a* and 673*a*) between the insulating film 640 and the electrodes 573*a* and 673*a* as much as possible. Furthermore, by forming the electrodes 573*a* and 673*a* in a lattice shape, an area density of the electrodes 573*a* and 673*a* is uniform when viewed from a direction in which light is incident on the solid-state imaging element 100*e* (from above in FIG. 28) even in a case where joint misalignment occurs at the joint surface JS, so that light incident on the solid-state imaging element 100*e* is optically uniform. Moreover, since the area density of the electrodes 573*a* and 673*a* is uniform, the electrodes 573*a* and 673*a* can be accurately and uniformly formed.

Figure 30:
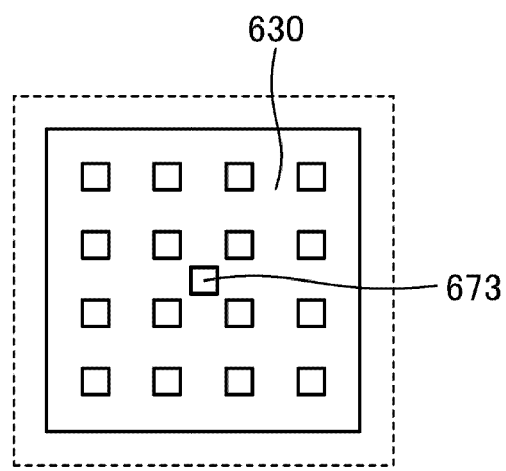
FIG. 30 is a cross-sectional view of the solid-state imaging element taken along line B4-B4' in FIG. 28.
Figure 31:
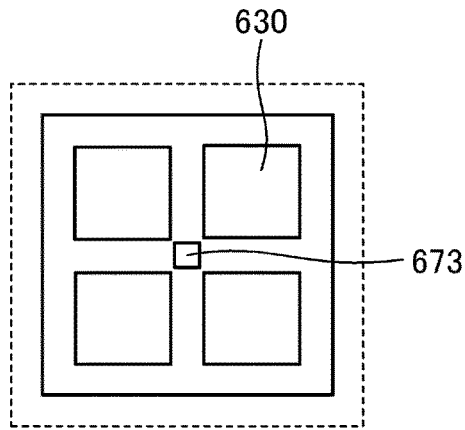
FIG. 31 is a cross-sectional view of the solid-state imaging element taken along line B4-B4' in FIG. 28.

Note that shapes of the electrodes 573*a* and 673*a* are not limited to the shapes illustrated in FIG. 29. FIG. 30 is a cross-sectional view of the solid-state imaging element 100*e* taken along line B4-B4' in FIG. 28, and FIG. 31 is a cross-sectional view of the solid-state imaging element 100*e* taken along line B4-B4' in FIG. 28. As illustrated in FIG. 30, the electrode 673*a* may have a lattice shape in which eight rectangular openings are formed in a matrix shape. Alternatively, as illustrated in FIG. 31, the electrode 673*a* may have a shape in which an opening larger than that of the electrode 673*a* illustrated in FIG. 29 is formed and a width of a lattice is narrow. Note that, since the electrode 573*a* has the same shape as the electrode 673*a*, illustration thereof is omitted. In this way, the number of openings and the width of the lattice of the electrodes 573*a* and 673*a* in the present embodiment can take various values.

Note that the shapes of the electrodes 573*a* and 673*a* and the shapes of the openings formed in the electrodes 573*a* and 673*a* are not limited to quadrangles. The shapes of the electrodes 573*a* and 673*a* may be substantially circular as shown in the fifth embodiment. Furthermore, the shapes of the openings formed in the electrodes 573*a* and 673*a* may be substantially circular. In this way, the electrodes 573a and 673a and the openings formed in the electrodes 573a and 673a can take various shapes.

10. Eighth Embodiment

Figure 32:
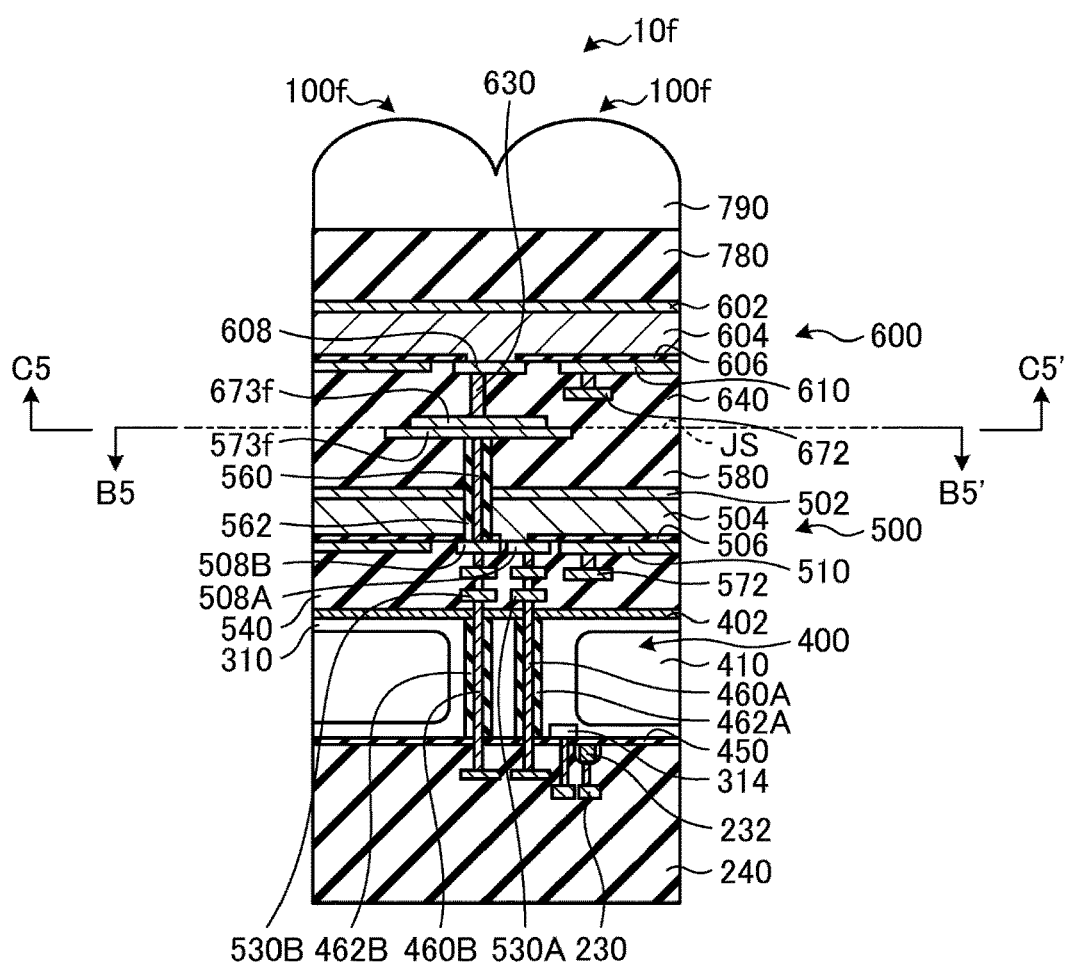
FIG. 32 is a cross-sectional view of a pixel array unit according to the present embodiment.

Moreover, in an embodiment of the present disclosure, sizes of electrodes 573f and 673f may be different. Therefore, as an eighth embodiment of the present disclosure, a laminated structure of a solid-state imaging element 100f including PDs 500 and 600 having electrodes 573f and 673f having different sizes will be described with reference to FIG. 32. FIG. 32 is a cross-sectional view of a pixel array unit 10f according to the present embodiment, and specifically, in the pixel array unit 10f, the solid-state imaging elements 100f including the PDs 500 and 600 having the electrodes 573f and 673f are arranged in a matrix.

Figure 33:
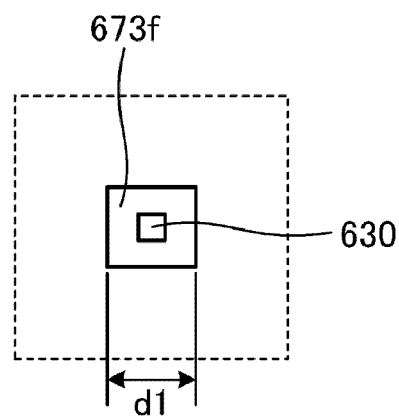
FIG. 33 is a cross-sectional view of a solid-state imaging element taken along line B5-B5' in FIG. 32.
Figure 34:
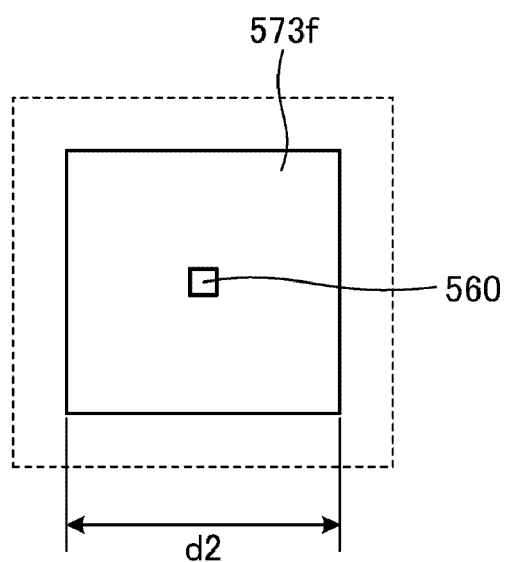
FIG. 34 is a cross-sectional view of the solid-state imaging element taken along line C5-C5' in FIG. 32.

Here, a layout configuration of the solid-state imaging element 100f according to the present embodiment will be described with reference to FIGS. 33 and 34. FIG. 33 is a cross-sectional view of the solid-state imaging element 100f taken along line B5-B5' in FIG. 32. FIG. 34 is a cross-sectional view of the solid-state imaging element 100f taken along line C5-C5' in FIG. 32. Note that FIGS. 33 and 34 illustrate cross sections in a case where four pixels (four solid-state imaging elements 100f) share one reading electrode 508 and one reading electrode 608.

In the present embodiment, as illustrated in FIGS. 33 and 34, a length d1 of one side of the electrode 673f viewed from a direction in which light is incident in the solid-state imaging element 100f is shorter than a length d2 of one side of the electrode 573f viewed from a direction in which light is incident in the solid-state imaging element 100f. In this way, in the present embodiment, the electrode 673f is formed smaller than the electrode 573f on a surface (a joint surface JS) in contact with the electrode 573f.

As described above, according to the present embodiment, by forming the electrodes 573f and 673f in different sizes, for example, even in a case where sizes suitable for a manufacturing process are different between the electrodes 573f and 673f, the sizes suitable for the manufacturing process can be selected.

11. Ninth Embodiment

Figure 35:
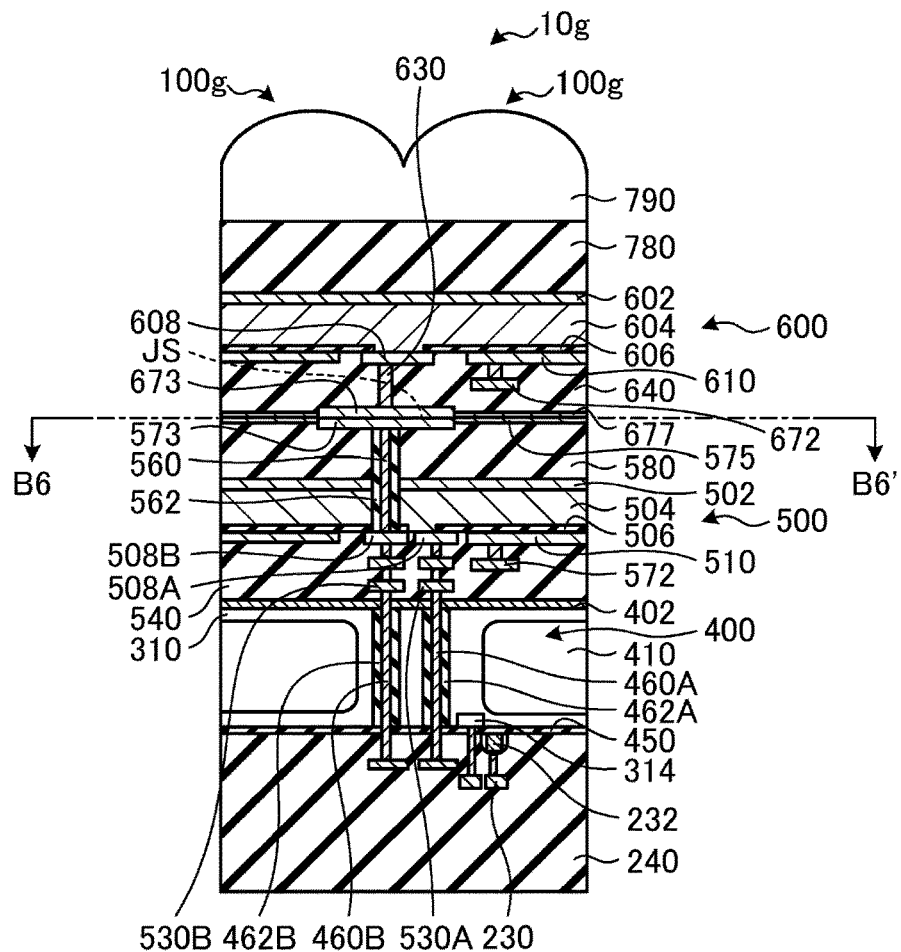
FIG. 35 is a cross-sectional view of a pixel array unit according to the present embodiment.

Moreover, in an embodiment of the present disclosure, the PDs 500 and 600 may have stopper layers 577 and 677. Therefore, as a ninth embodiment of the present disclosure, a laminated structure of a solid-state imaging element 100g including PDs 500 and 600 having stopper layers 577 and 677 will be described with reference to FIG. 35. FIG. 35 is a cross-sectional view of a pixel array unit 10g according to the present embodiment, and specifically, in the pixel array unit 10g, the solid-state imaging elements 100g including the PDs 500 and 600 having the stopper layers 577 and 677 are arranged in a matrix.

In the present embodiment, as illustrated in FIG. 35, the stopper layer 577 is formed so as to be opposed to a common electrode 502 via an insulating film 580. Furthermore, the stopper layer 677 is formed so as to be opposed to a storage electrode 610 via an insulating film 640. The stopper layers 577 and 677 are formed, for example, in a region excluding a region where electrodes 573 and 673 are formed on a joint surface JS. The stopper layers 577 and 677 only need to have a polishing rate of, for example, 0.1 times or less as compared with the electrodes 573 and 673, and are formed by, for example, SiNx (a silicon nitride film). In this way, the stopper layers 577 and 677 are formed by a hard insulating material.

Figure 36:
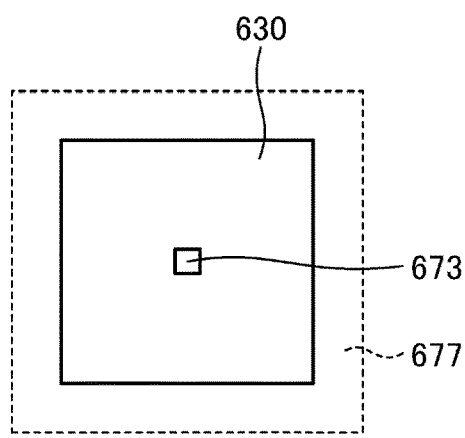
FIG. 36 is a cross-sectional view of a solid-state imaging element taken along line B6-B6' in FIG. 35.

Here, a layout configuration of the solid-state imaging element 100g according to the present embodiment will be described with reference to FIG. 36. FIG. 36 is a cross-sectional view of the solid-state imaging element 100g taken along line B6-B6' in FIG. 35. Note that FIG. 36 illustrates a cross section in a case where one reading electrode 508 and one reading electrode 608 are shared by four pixels (four solid-state imaging elements 100g). In the present embodiment, as illustrated in FIG. 36, the stopper layer 677 is formed around the electrode 673. Note that the stopper layer 577 is also arranged similarly to the stopper layer 677, and thus illustration thereof is omitted.

Next, a manufacturing method for the solid-state imaging element 100g according to the present embodiment will be described with reference to FIGS. 37A, 37B, 37C, and 37D. FIGS. 37A, 37B, 37C, and 37D are views for explaining the manufacturing method for the solid-state imaging element 100g according to the present embodiment. Note that, in FIGS. 37A, 37B, 37C, and 37D, only reference numerals used for the description are given, and illustration of other reference numerals is omitted.

Figures 37A, 37B, 37C, 37D:
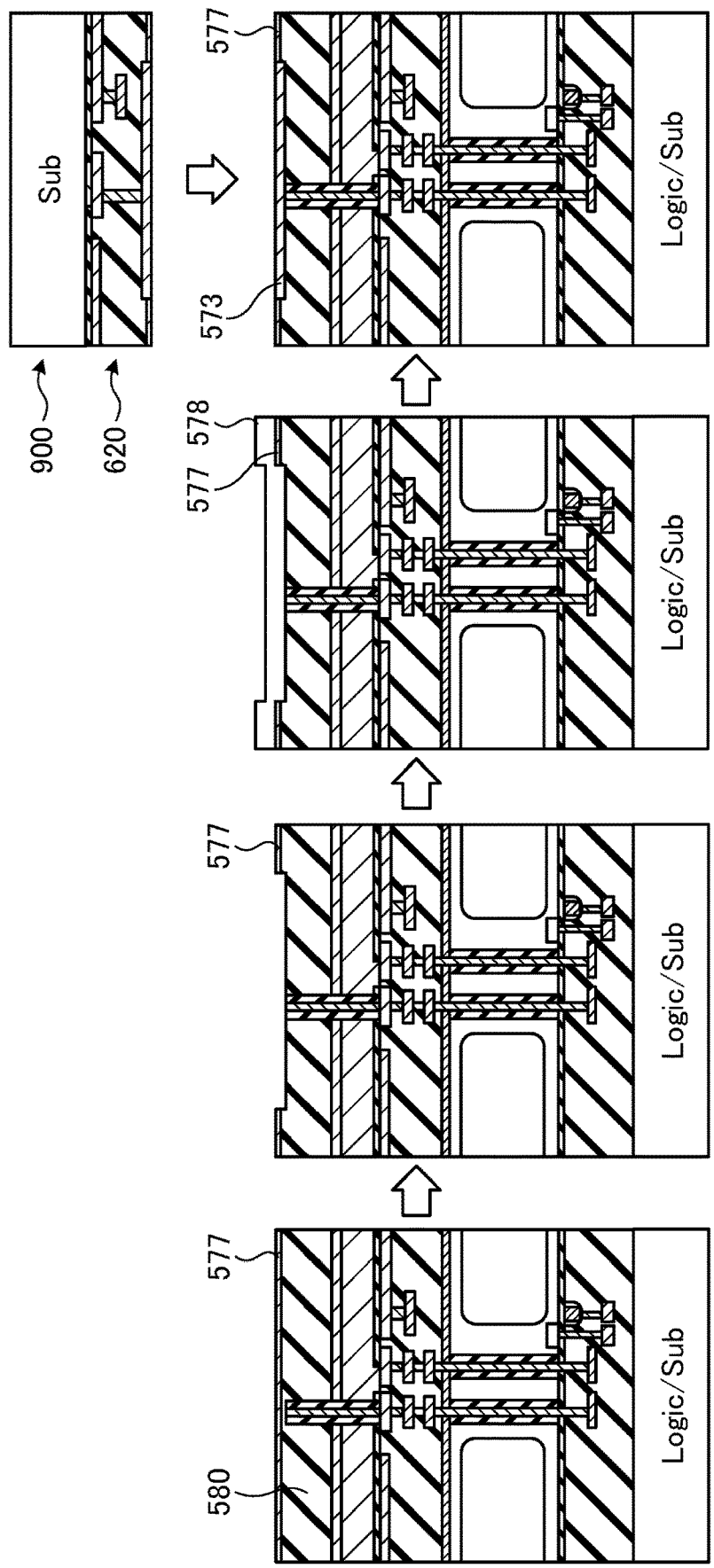
FIGS. 37A, 37B, 37C, and 37D are views for explaining a manufacturing method for the solid-state imaging element according to the present embodiment.

First, as illustrated in FIG. 37A, the stopper layer 577 is formed on a semiconductor substrate 300 on which the insulating film 580 is formed. Subsequently, as illustrated in FIG. 37B, a part of the stopper layer 577 is opened by dry etching. Thereafter, as illustrated in FIG. 37C, by forming a transparent conductive layer 578 above the stopper layer 577 of the semiconductor substrate 300, and planarizing the transparent conductive layer 578 by, for example, a method or a dry etching method, the electrode 573 as illustrated in FIG. 37D is formed. At this time, since the stopper layer 577 is formed, film loss of the electrode 573 can be suppressed, and a step between the electrode 573 and the insulating film 580 can be reduced.

As illustrated in FIG. 37D, a semiconductor substrate 900 in which the stopper layer 677 and the electrode 673 are formed in a wiring layer 620 is joined to the semiconductor substrate 300. Note that the stopper layer 677 and the electrode 673 can be configured similarly to the stopper layer 577 and the electrode 573. Furthermore, the subsequnt manufacturing method is the same as the manufacturing method illustrated in FIGS. 8A, 8B, and 8C, and thus a description thereof is omitted.

As described above, in the solid-state imaging element 100g according to the present embodiment, by providing the stopper layers 577 and 677 on the joint surface JS, film loss of the electrodes 573 and 673 can be suppressed in the planarization processing of the electrodes 573 and 673, and the joint surface JS can be formed flatter.

Note that, here, a case where the stopper layers 577 and 677 are added to the solid-state imaging element 100 illustrated in FIGS. 9 to 12 has been described, but the present embodiment is not limited to this. For example, the stopper layers 577 and 677 may be added to the solid-state imaging element 100 illustrated in FIGS. 3 to 7 and the solid-state imaging elements 100a to 100f shown in other embodiments. Note that, for example, as illustrated in FIGS. 29 to 31, by adding the stopper layers 577 and 677 to the solid-state imaging element 100e in which an area ratio of the electrodes 573a and 673a is suppressed by forming holes in the electrodes 573a and 673a, an area ratio of the stopper layers 577 and 677 at the joint surface JS can be increased, and performance as a stopper can be improved.

12. Tenth Embodiment

Figure 38:
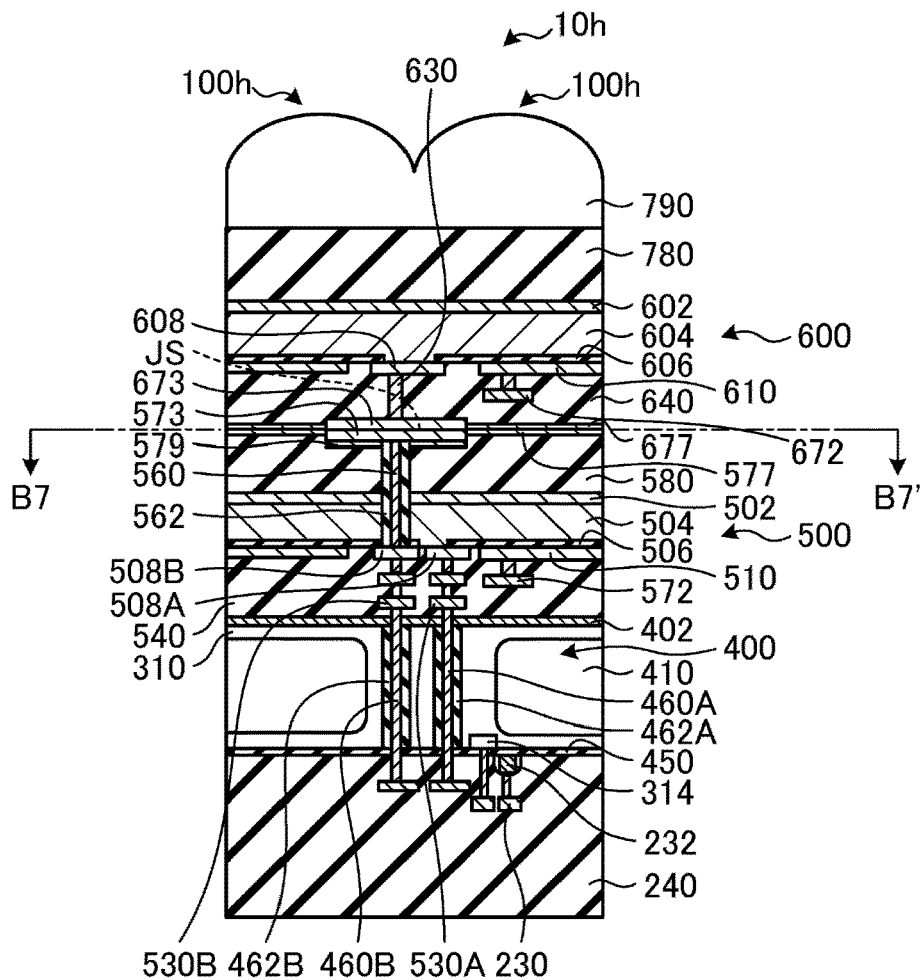
FIG. 38 is a cross-sectional view of a pixel array unit according to the present embodiment.

In the ninth embodiment, the solid-state imaging element 100g includes the stopper layers 577 and 677. However, in an embodiment of the present disclosure, the PD 500 may further include a stopper layer 579. Therefore, as a tenth embodiment of the present disclosure, a laminated structure of a solid-state imaging element 100h including a PD 500 having a stopper layer 579 will be described with reference to FIG. 38. FIG. 38 is a cross-sectional view of a pixel array unit 10h according to the present embodiment, and specifically, in the pixel array unit 10h, the solid-state imaging elements 100h including the PD 500 having the stopper layer 579 are arranged in a matrix.

In the present embodiment, as illustrated in FIG. 38, the stopper layer 579 is formed between an insulating film 580 and an electrode 573. Similarly to the stopper layers 577 and 677, the stopper layer 579 only needs to have a polishing rate of, for example, 0.1 times or less as compared with the electrodes 573 and 673, and is formed by, for example, SiNx.

Here, refractive indexes of the insulating film 580, the stopper layer 579, and the electrode 573 increase in the order of the insulating film 580, the stopper layer 579, and the electrode 573. As a result, as compared with a case where the stopper layer 579 is not provided, a difference in refractive index at an interface of the electrode 573 can be reduced, and light condensing characteristics of light incident on the solid-state imaging element 100h can be improved.

Figure 39:
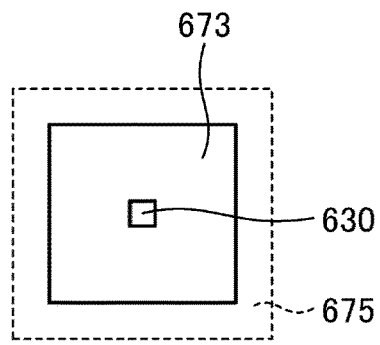
FIG. 39 is a cross-sectional view of a solid-state imaging element taken along line B7-B7' in FIG. 38.

Here, a layout configuration of the solid-state imaging element 100g according to the present embodiment will be described with reference to FIG. 39. FIG. 39 is a cross-sectional view of the solid-state imaging element 100h taken along line B7-B7' in FIG. 38. Note that FIG. 38 illustrates a cross section in a case where one reading electrode 508 and one reading electrode 608 are shared by four pixels (four solid-state imaging elements 100h). In the present embodiment, as illustrated in FIG. 38, a stopper layer 677 is formed around an electrode 673. Furthermore, a stopper layer 679 has substantially the same shape as the electrode 673 in a cross section of the solid-state imaging element 100h cut in a laminating direction of a laminated structure.

Next, a manufacturing method for the solid-state imaging element 100h according to the present embodiment will be described with reference to FIGS. 40A, 40B, 40C, 40D, and 40E. FIGS. 40A, 40B, 40C, 40D, and 40E are views for explaining the manufacturing method for the solid-state imaging element 100h according to the present embodiment. Note that, in FIGS. 40A, 40B, 40C, 40D, and 40E, only reference numerals used for the description are given, and illustration of other reference numerals is omitted.

Figure 40:
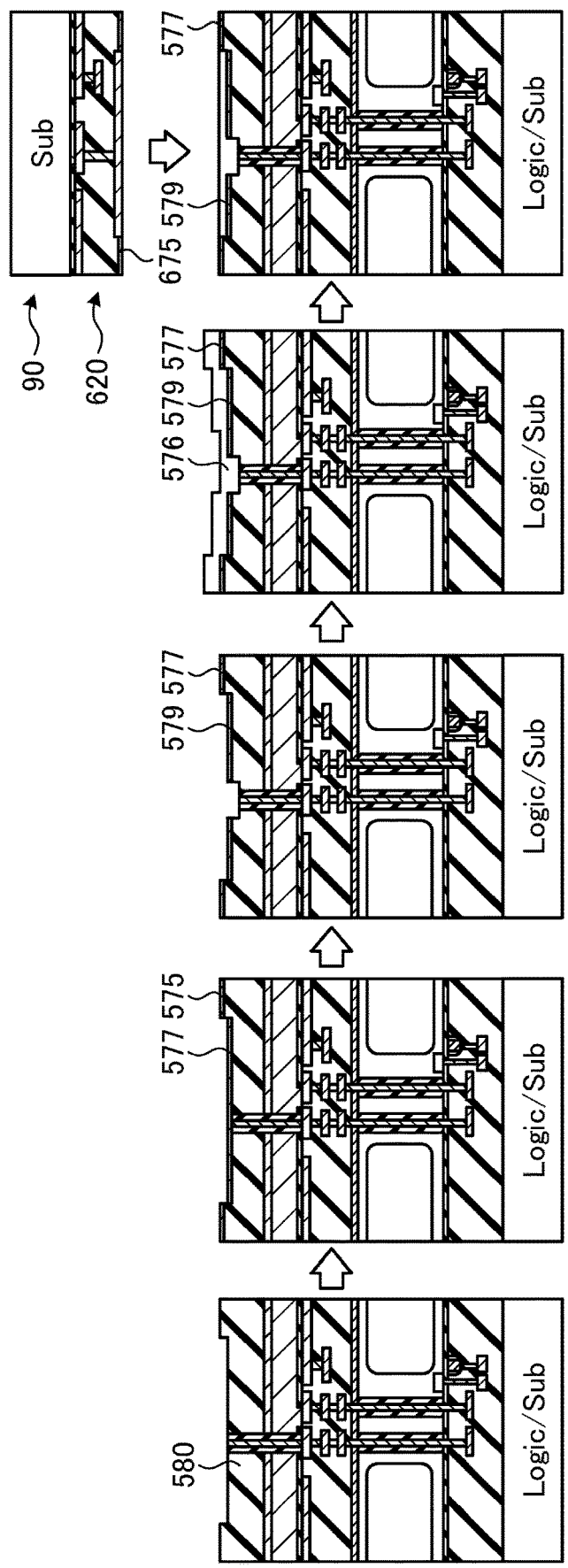
FIGS. 40A, 40B, 40C, 40D, and 40E are views for explaining a manufacturing method for the solid-state imaging element according to the present embodiment.

First, as illustrated in FIG. 40A, a part of the insulating film 580 is etched by dry etching. As illustrated in FIG. 40B, the stopper layers 577 and 579 are formed on the etched insulating film 580. Subsequently, as illustrated in FIG. 40C, a part of the stopper layer 577 is opened by dry etching to connect the electrode 573 and a through electrode 560. Thereafter, as illustrated in FIG. 40D, by forming a transparent conductive layer 578 above the stopper layers 577 and 579 of the semiconductor substrate 300, and planarizing the transparent conductive layer 578 by, for example, a CMP method or a dry etching method, the electrode 573 as illustrated in FIG. 40E is formed. At this time, since the stopper layer 577 is formed, film loss of the electrode 573 can be suppressed, and a step between the electrode 573 and the insulating film 580 can be reduced.

As illustrated in FIG. 40E, a semiconductor substrate 900 in which the stopper layer 677 and the electrode 673 are formed in a wiring layer 620 is joined to the semiconductor substrate 300. Note that the stopper layer 677 and the electrode 673 can be configured similarly to the stopper layer 577 and the electrode 573. Furthermore, the subsequent manufacturing method is the same as the manufacturing method illustrated in FIGS. 8A, 8B, and 8C, and thus a description thereof is omitted.

As described above, in the solid-state imaging element 100h according to the present embodiment, by providing the stopper layer 579 between the insulating film 580 and the electrode 573, a difference in refractive index at an interface of the electrode 573 can be suppressed, and light condensing characteristics of the light incident on the solid-state imaging element 100h can be improved.

Note that, here, the case where the stopper layer 579 is provided between the insulating film 580 and the electrode 573 has been described, but the present embodiment is not limited to this. For example, a stopper layer 679 (not illustrated) may be provided between an insulating film 640 and the electrode 673.

13. Eleventh Embodiment

Figure 41:
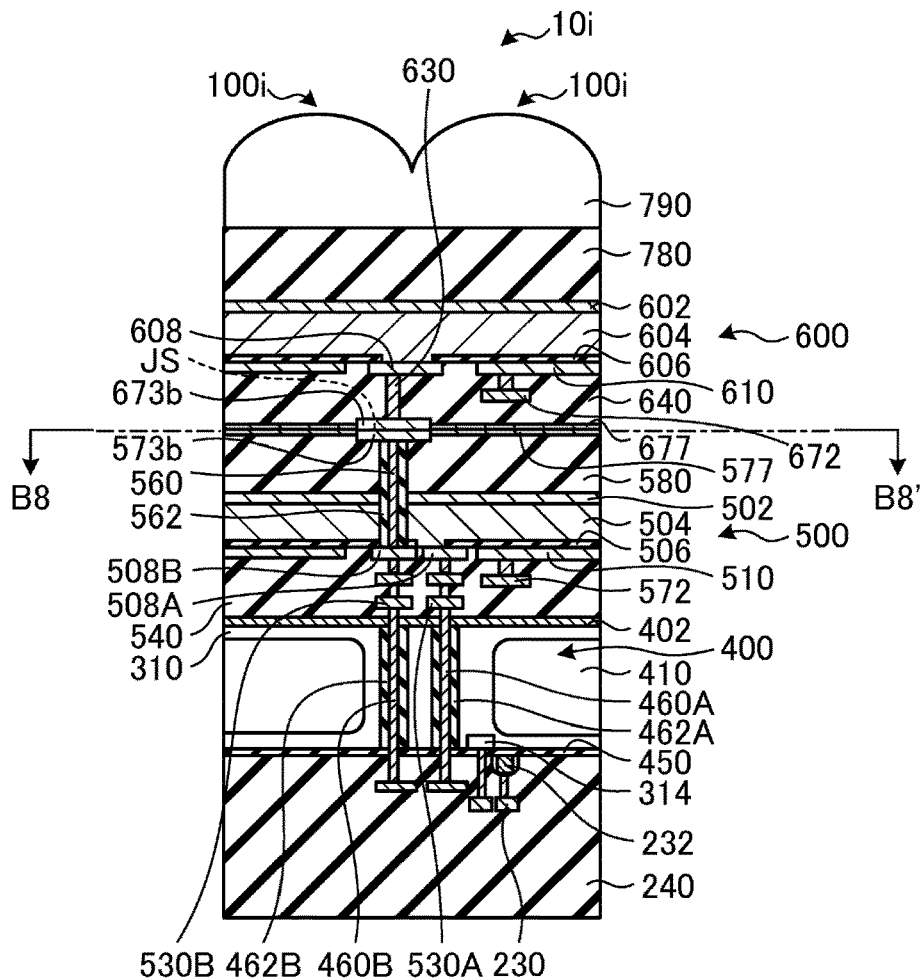
FIG. 41 is a cross-sectional view of a pixel array unit according to the present embodiment.

Moreover, in an embodiment of the present disclosure, sizes of electrodes 573b and 673b may be reduced. Therefore, as an eleventh embodiment of the present disclosure, a laminated structure of a solid-state imaging element 100i including PDs 500 and 600 having electrodes 573b and 673b will be described with reference to FIG. 41. FIG. 41 is a cross-sectional view of a pixel array unit 10i according to the present embodiment, and specifically, in the pixel array unit 10i, the solid-state imaging elements 100i including the PDs 500 and 600 having the electrodes 573b and 673b are arranged in a matrix.

In the present embodiment, as illustrated in FIG. 41, the electrodes 573b and 673b are formed to be smaller than the electrodes 573 and 673 illustrated in FIG. 35, for example.

Figure 42:
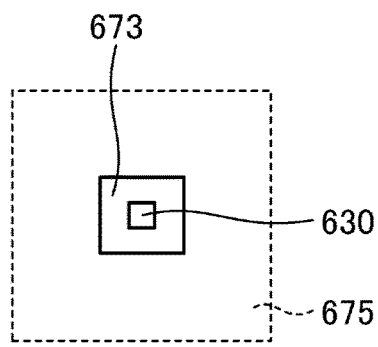
FIG. 42 is a cross-sectional view of a solid-state imaging element taken along line B8-B8' in FIG. 4.

Here, a layout configuration of the solid-state imaging element 100g according to the present embodiment will be described with reference to FIG. 42. FIG. 42 is a cross-sectional view of the solid-state imaging element 100i taken along line B8-B8' in FIG. 41. Note that FIG. 41 illustrates a cross section in a case where one reading electrode 508 and one reading electrode 608 are shared by four pixels (four solid-state imaging elements 100i). In the present embodiment, as illustrated in FIG. 42, the electrode 673b is formed to have an area smaller than that of the electrode 673 illustrated in FIG. 36, for example, in a cross section obtained by cutting the solid-state imaging element 100i in a laminating direction of a laminated structure. Note that, since a shape of the electrode 573b is the same as that of the electrode 673b, illustration thereof is omitted.

In this way, by forming the electrodes 573b and 673b to be small, an area ratio of stopper layers 577 and 677 at a joint surface JS can be increased, and performance as a stopper can be improved.

14. Twelfth Embodiment

Figure 43:
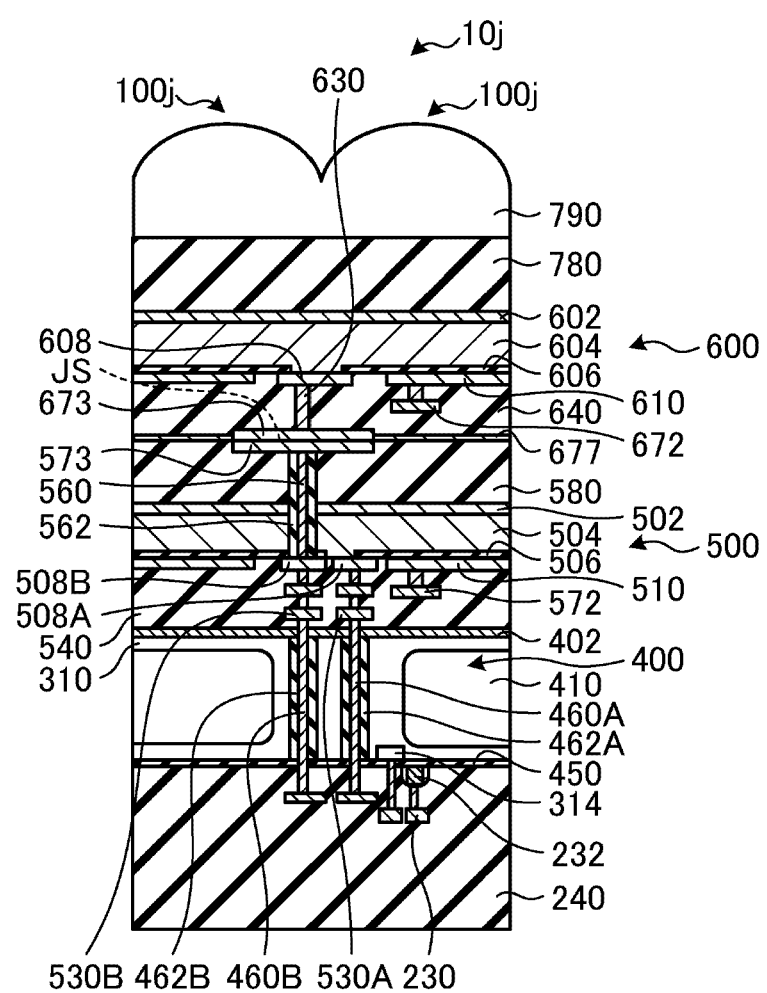
FIG. 43 is a cross-sectional view of a pixel array unit according to the present embodiment.

Moreover, in an embodiment of the present disclosure, the stopper layer 677 may be provided on the PD 600, and the stopper layer 577 may be omitted. Therefore, as a twelfth embodiment of the present disclosure, a laminated structure of a solid-state imaging element 100j including a PD 600 having a stopper layer 677 will be described with reference to FIG. 43. FIG. 43 is a cross-sectional view of a pixel array unit 10j according to the present embodiment, and specifically, in the pixel array unit 10j, the solid-state imaging elements 100j including the PD 600 having the stopper layer 677 are arranged in a matrix.

In the present embodiment, as illustrated in FIG. 43, the stopper layer 677 is formed on a joint surface JS of the PD 600. Whereas, a stopper layer 577 is not formed on a joint surface JS of a PD 500. In other words, the solid-state imaging element 100j in the present embodiment can also be said as a solid-state imaging element in which the PD 500 in the first embodiment and the PD 600 in the ninth embodiment are joined.

In this way, by joining the PD 600 on which the stopper layer 677 is formed and the PD 500 on which the stopper layer 577 is not formed at the joint surface JS, joint strength of the solid-state imaging element 100j can be improved.

Note that, here, the stopper layer 677 is provided in the PD 600, but the present embodiment is not limited to this. The PD on which the stopper layer is provided is only required to be any one of the PDs 500 and 600. For example, the stopper layer 577 may be provided on the PD 500, and the stopper layer 677 of the PD 600 may be omitted.

15. Thirteenth Embodiment

Figure 44:
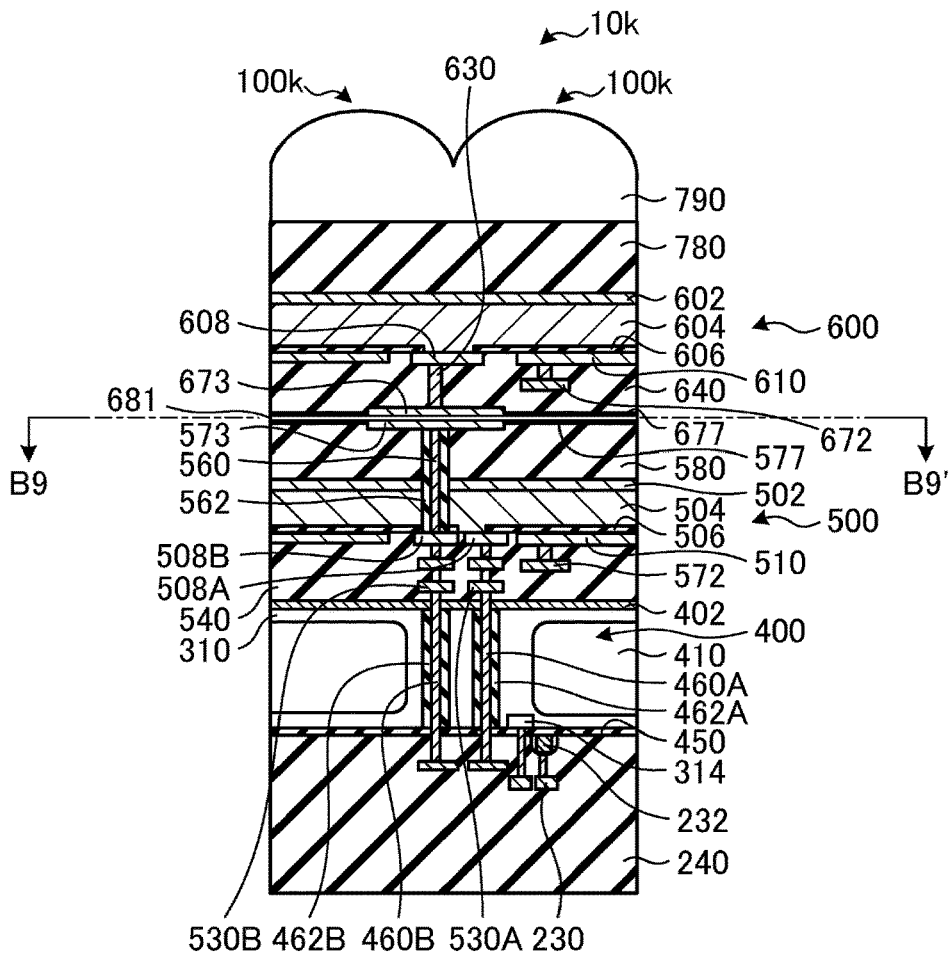
FIG. 44 is a cross-sectional view of a pixel array unit according to the present embodiment.

Moreover, in an embodiment of the present disclosure, an insulating film 681 may be formed between the stopper layers 577 and 677. Therefore, as a thirteenth embodiment of the present disclosure, a laminated structure of a solid-state imaging element 100k having an insulating film 681 will be described with reference to FIG. 44. FIG. 44 is a cross-sectional view of a pixel array unit 10k according to the present embodiment, and specifically, in the pixel array unit 10k, the solid-state imaging elements 100k having the insulating film 681 are arranged in a matrix.

In the present embodiment, as illustrated in FIG. 44, the insulating film 681 is formed over the entire joint surface JS. In the present embodiment, the insulating film 681 is formed by a material different from stopper layers 577 and 677. Specifically, the insulating film 681 is preferably formed using a film forming method in which a film thickness can be easily controlled, and can be formed by, for example, an ALD oxide film, a TEOS film (that is, a silicon oxide film using tetraethylorthosilicate as a raw material gas), or the like, and is not particularly limited. In a case where the insulating film 681 is formed by the TEOS film, the insulating film 681 can also serve as an oxygen supply source.

Figure 45:
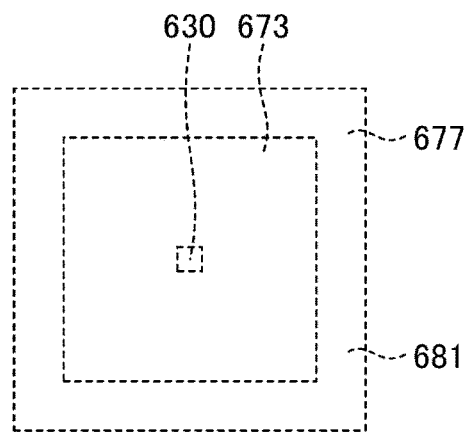
FIG. 45 is a cross-sectional view of a solid-state imaging element taken along line B9-B9' in FIG. 44.

Here, a layout configuration of the solid-state imaging element 100k according to the present embodiment will be described with reference to FIG. 45. FIG. 45 is a cross-sectional view of the solid-state imaging element 100k taken along line B9-B9' in FIG. 44. Note that FIG. 45 illustrates a cross section in a case where one reading electrode 508 and one reading electrode 608 are shared by four pixels (four solid-state imaging elements 100k). In the present embodiment, as illustrated in FIG. 45, the insulating film 681 is formed so as to cover the stopper layer 677 and an electrode 673.

In this way, in the present embodiment, the insulating film 681 is also formed between electrodes 573 and 673. Since the insulating film 681 is formed to have a film thickness of a degree to allow conduction between the electrodes 573 and 673, the electrodes 573 and 673 are brought into a state of being electrically connected with each other. Here, conduction between the electrodes 573 and 673 means a state where the electrodes 573 and 673 are electrically connected, that is, charges can be stored in a floating diffusion unit 314 from a PD 600. Furthermore, the film thickness of the degree to allow conduction between the electrodes 573 and 673 is preferably, for example, about several nm, and more specifically, 5 nm or less. By forming the thin insulating film 681 in this way, it is possible to improve joint strength between stopper layers 577 and 677 while securing conduction between the electrodes 573 and 673. Therefore, as described above, the insulating film 681 is preferably formed using a film forming method in which the film thickness can be easily controlled.

In this way, by forming the insulating film 681 between the stopper layers 577 and 677, joint strength of the solid-state imaging element 100j can be improved.

16. Fourteenth Embodiment

Meanwhile, in the embodiment of the present disclosure described above, the solid-state imaging device 1 has been downsized by laminating the plurality of photoelectric conversion elements 400, 500, and 600 (see, for example, FIG. 13). However, in such a structure, since the plurality of photoelectric conversion elements 400, 500, and 600 is laminated, the solid-state imaging device 1 becomes higher (a thickness increases) along the laminating direction. As a result, in such a structure, it may be difficult for the photoelectric conversion elements 500 and 400 located below to sufficiently take in light transmitted through the photoelectric conversion element 600 located above. Furthermore, in such a structure, there is a case where crosstalk to an adjacent solid-state imaging element (pixel) 100 due to obliquely incident light is likely to occur due to the increase in height along the laminating direction.

Therefore, in the following, as a fourteenth embodiment of the present disclosure, a structure is proposed in which light transmitted through a photoelectric conversion element 600 located above can be condensed on photoelectric conversion elements 500 and 400 located below with high efficiency. Specifically, in the present embodiment described below, a condensing element (specifically, a waveguide, an inner lens, a partition wall, and the like) to condense light is provided between the plurality of photoelectric conversion elements 400, 500, and 600 in a laminating direction. According to the present embodiment, by providing such a condensing element between the plurality of photoelectric conversion elements 400, 500, and 600, it is possible to condense light on the photoelectric conversion elements 500 and 400 located below with high efficiency. As a result, according to the present embodiment, sensitivity characteristics of a solid-state imaging device 1 can be improved, and furthermore, an occurrence of the above-described crosstalk can be suppressed. Hereinafter, details of the present embodiment will be sequentially described.

Figure 46:
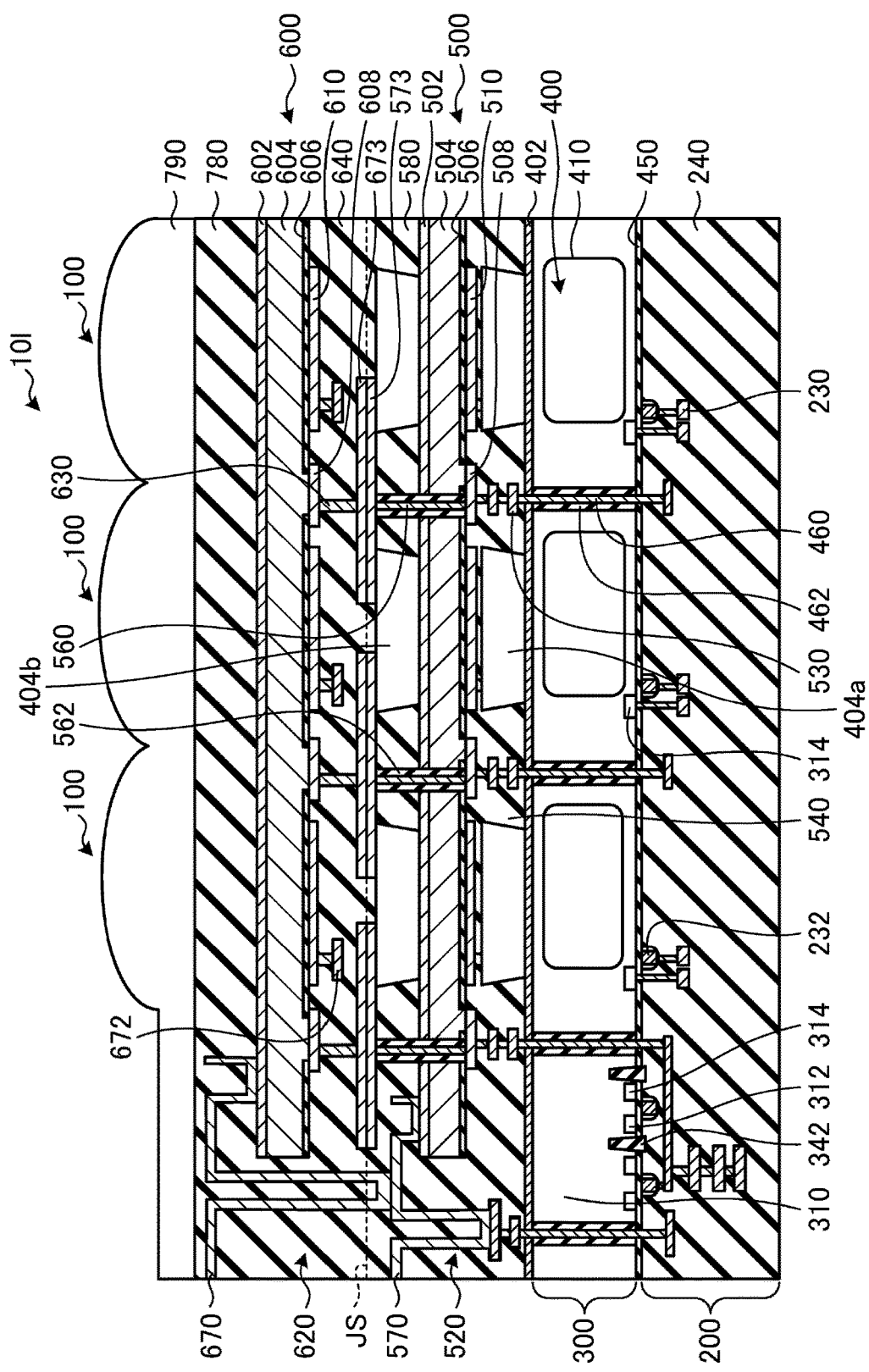
FIG. 46 is a cross-sectional view of a pixel array unit according to the present embodiment.

First, one of structure examples of the present embodiment will be described with reference to FIG. 46. FIG. 46 is a cross-sectional view of a pixel array unit 101 according to the present embodiment. Specifically, in the present embodiment, as illustrated in FIG. 46, a waveguide 404a is provided as the condensing element described above in an insulating film 540 including SiO2 or the like and capable of transmitting light, on an antireflection film 402. Moreover, in the present embodiment, a waveguide 404b is also provided as the condensing element described above in an insulating film 580, on the photoelectric conversion element 500. That is, in the present embodiment, the waveguides 404a and 404b capable of condensing light on the photoelectric conversion elements 500 and 400 located below are provided between the photoelectric conversion elements 400, 500, and 600 in the laminating direction of the solid-state imaging element 100. The waveguides 404a and 404b are preferably formed using, for example, Si3N4 (a refractive index of about 1.9). In this case, by forming the insulating films 540 and 580 with SiO2 (a refractive index of about 1.4), light can be condensed on the waveguides 404a and 404b due to a refractive index difference. Note that, in the present embodiment, materials of the waveguides 404a and 404b and the insulating films 540 and 580 are not particularly limited. However, in the present embodiment, a difference between a refractive index of a material of the waveguides 404a and 404b and a refractive index of a material of the insulating films 540 and 580 is preferably about 0.2 or more. By doing this way, light collection efficiency of the waveguides 404a and 404b can be further improved. Moreover, a structure example illustrated in FIG. 46 can be formed by various semiconductor process technologies.

As described above, according to the present embodiment, by providing the waveguides 404a and 404b as described above between the plurality of photoelectric conversion elements 400, 500, and 600, light can be condensed on the photoelectric conversion elements 500 and 400 located below with high efficiency. As a result, according to the present embodiment, sensitivity characteristics of the solid-state imaging device 1 can be improved, and furthermore, an occurrence of the crosstalk as described above can be suppressed.

Figure 47:
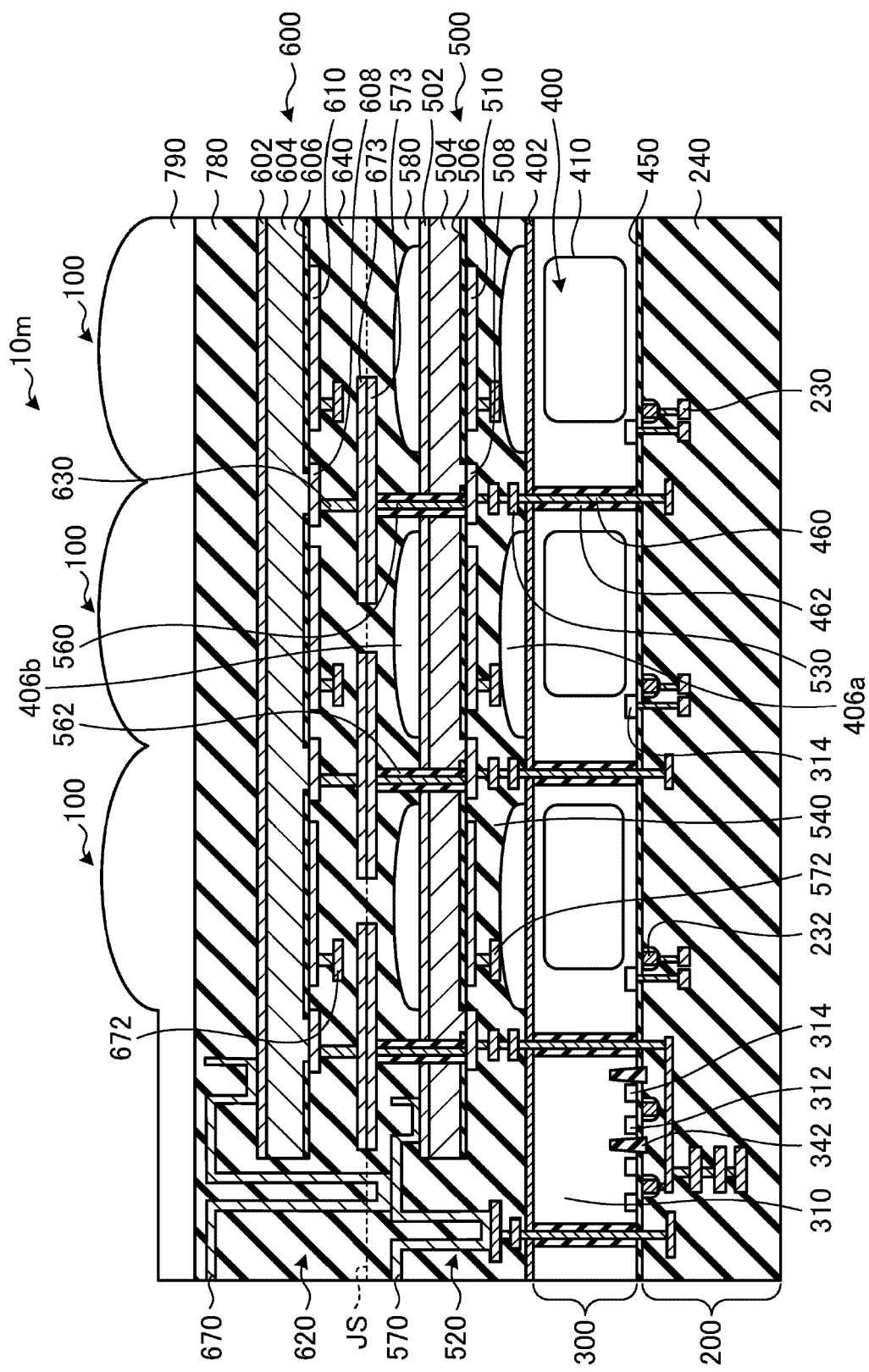
FIG. 47 is a cross-sectional view of a pixel array unit according to Modification 1 of the present embodiment.

Furthermore, the present embodiment may be modified as illustrated in FIG. 47. Next, Modification 1 of a structure example of the present embodiment will be described with reference to FIG. 47. FIG. 47 is a cross-sectional view of a pixel array unit 10m according to Modification 1 of the present embodiment. Specifically, in this Modification 1, instead of the waveguides 404a and 404b described above, inner lenses 406a and 406b capable of condensing light on the photoelectric conversion elements 500 and 400 located below are provided. The inner lenses 406a and 406b are preferably formed by a material having a refractive index higher than a refractive index of about 1.4 to 1.6 of a material of the insulating films 540 and 580, and more preferably formed by a material having a refractive index of 1.8 or more. Examples of the material of the inner lenses 406a and 406b may include a high refractive index material of a coating type, for example, a siloxane resin material film that contains transparent metal oxide film fine particles such as TiOx and ZnOx, a SiN film, a SiON film, and a TiOx film formed by a CVD method, and the like.

The structure illustrated in FIG. 47 can be formed, for example, as follows. A high refractive index layer (not illustrated) including a high refractive index material is formed on the antireflection film 402, and a resist to form the inner lenses 406a and 406b is formed on the high refractive index layer. Then, after the resist is formed, a lens pattern is formed by lithography, and heat treatment (reflow) is performed to form a resist having a round hill shape corresponding to outer shapes of the inner lenses 406a and 406b. Thereafter, the entire surface is etched back by dry etching, so that the shape of the resist described above is transferred to the high refractive index layer, and thus the inner lenses 406a and 406b are formed. Note that examples of an etching gas used for the etching described above may include fluorocarbon gas such as CF4 and C4F8, O2, and the like.

As described above, according to the structure example illustrated in FIG. 47, by providing the inner lenses 406a and 406b between a plurality of photoelectric conversion elements 400, 500, and 600, light can be condensed on the photoelectric conversion elements 500 and 400 located below with high efficiency. As a result, according to the present modification, sensitivity characteristics of the solid-state imaging device 1 can be improved, and furthermore, an occurrence of the crosstalk as described above can be suppressed.

Figure 48:
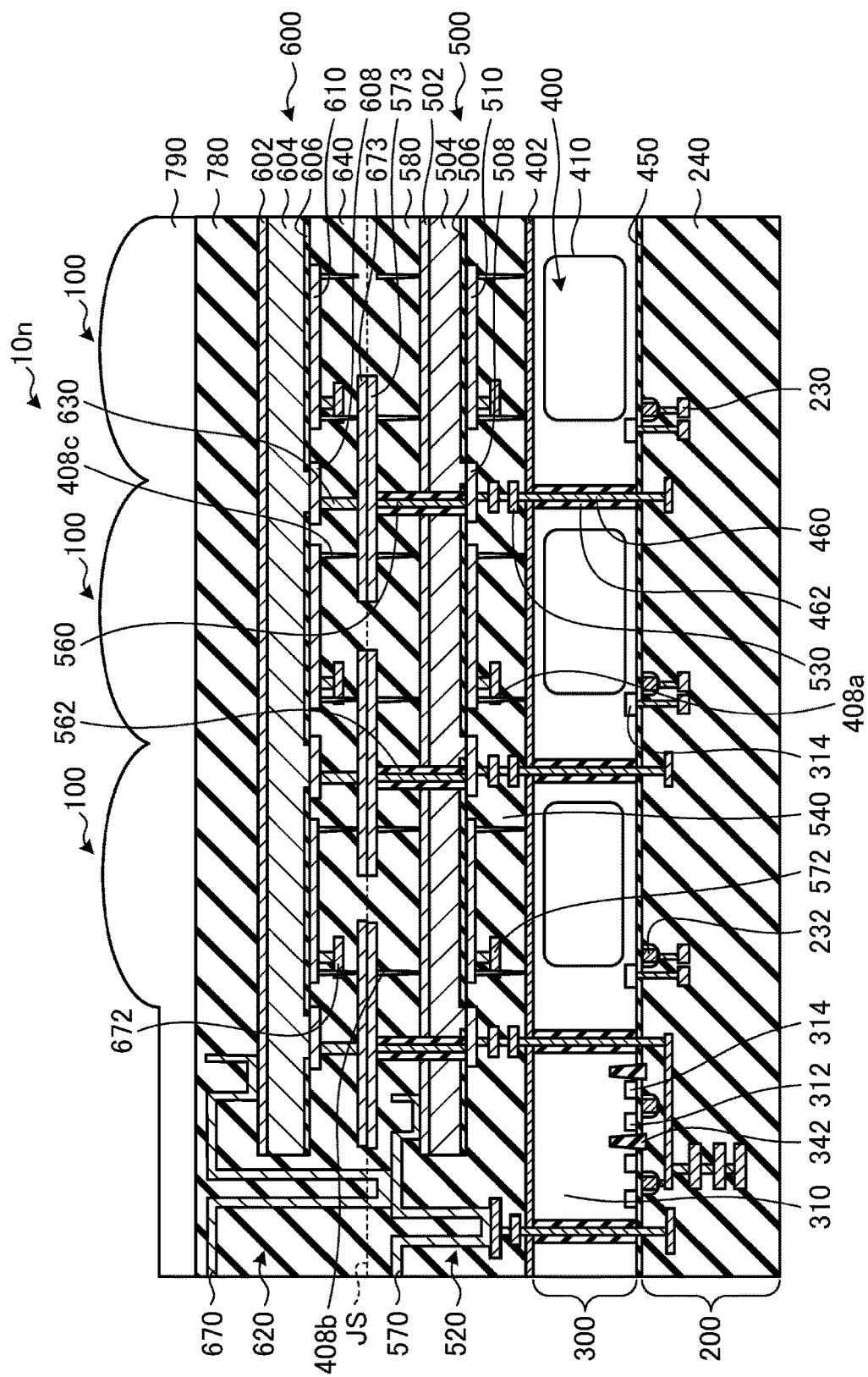
FIG. 48 is a cross-sectional view of a pixel array unit according to Modification 2 of the present embodiment.

Furthermore, the present embodiment can also be modified as illustrated in FIG. 48. Next, Modification 2 of a structure example of the present embodiment will be described with reference to FIG. 48. FIG. 48 is a cross-sectional view of a pixel array unit 10n according to Modification 2 of the present embodiment. Specifically, in this Modification 2, partition walls 408a, 408b, and 408c are provided instead of the waveguides 404a and 404b described above. For example, in a case where the insulating films 540, 580, and 640 are formed by SiO2 (a refractive index of about 1.4), the partition walls 408a, 408b, and 408c are preferably formed by Si3N4 (a refractive index of about 1.9). In the present modification, a material of the partition walls 408a, 408b, and 408c is not particularly limited, but a difference between a refractive index of a material of the partition walls 408a, 408b, and 408c and a refractive index of a material of the insulating films 540, 580, and 640 is preferably about 0.2 or more. By doing this way, light collection efficiency can be further improved. Furthermore, as the material of the partition walls 408a, 408b, and 408c, a metal material (Al, W, Ti, TiN, titanium aluminide (TiAl), Cu, tantalum (Ta), TaN, Co, Ru, or the like, or a material containing these elements) may be used.

As described above, according to the structure example illustrated in FIG. 48, by providing such partition walls 408a, 408b, and 408c between a plurality of photoelectric conversion elements 400, 500, and 600, light can be condensed on the photoelectric conversion elements 500 and 400 located below with high efficiency. As a result, according to the present modification, sensitivity characteristics of the solid-state imaging device 1 can be improved, and furthermore, an occurrence of the crosstalk described above can be suppressed.

Moreover, in the present disclosure, the present embodiment and Modifications 1 and 2 described above can be appropriately combined and implemented. Furthermore, in the present embodiment, positions at which the waveguides 404a and 404b, the inner lenses 406a and 406b, and the partition walls 408a, 408b, and 408c are provided are not limited to the above-described positions, and may be provided at other positions, and are not particularly limited.

17. Fifteenth Embodiment

Meanwhile, in the embodiment of the present disclosure described above, the plurality of photoelectric conversion elements 500 and 600 is laminated, and the through electrode 560 that electrically connects these photoelectric conversion elements 500 and 600 is provided. Then, in the embodiment of the present disclosure described above, for example, one through electrode 560 is shared between the photoelectric conversion elements 500 and 600, so that a processing area can be reduced and an area of the pixel transistor can be expanded. However, in the embodiment of the present disclosure described above, as can be seen from FIG. 13, it is difficult to avoid an increase in size of the reading electrode 508, in order to secure electrical connection between the through electrode 560 connected to the photoelectric conversion element 600 and the photoelectric conversion element 500 (specifically, the photoelectric conversion film 504 exposed from the opening). As a result, in the embodiment of the present disclosure described above, it may be difficult to avoid reduction in size of an incident surface for light to be incident on the photoelectric conversion elements 500 and 400 due to the increase in size of the reading electrode 508.

Therefore, in the following, a description is given to a fifteenth embodiment of the present disclosure for making it possible to avoid reduction in size of an incident surface for light to be incident on photoelectric conversion elements 500 and 400. In the embodiment described below, a structure is proposed in which a transparent conductive layer 480 electrically connected to the photoelectric conversion element 500 (specifically, a photoelectric conversion film 504) is provided. Note that, here, the transparent conductive layer 480 electrically connected to the photoelectric conversion element 500 is provided, but a structure may be adopted in which a transparent conductive layer 582 electrically connected to a photoelectric conversion element 600 (specifically, a photoelectric conversion film 604) is provided. Note that the transparent conductive layer 582 can have a configuration similar to that of the transparent conductive layer 480, and thus a description thereof is omitted here.

Moreover, the present embodiment proposes such a structure in which a through electrode 560*a* is electrically connected to a through electrode 460*a* penetrating a semiconductor substrate 300 via the transparent conductive layer 480 described above (see FIG. 49). According to such a structure, electrical connection between the photoelectric conversion elements 500 and 600 can be secured via the through electrode 560*a* and the transparent conductive layer 480. Moreover, according to such a structure, in a case where a pixel array unit 10*o* is viewed from above, the through electrode 560*a* and the through electrode 460*a* can be arranged at the same position, that is, arranged such that the through electrodes 560*a* and 460*a* overlap with each other. Therefore, it is possible to eliminate necessity of an opening for exposing a surface of the photoelectric conversion film 504 to secure the electrical connection described above, which enables to avoid an increase in size of a reading electrode 508 or to eliminate necessity of the reading electrode 508 itself. As a result, according to the present embodiment, since it is possible to avoid an increase in size of the reading electrode 508 or to eliminate necessity of the reading electrode 508, reduction of the incident surface described above can be avoided. Hereinafter, details of the present embodiment will be sequentially described.

Figure 49:
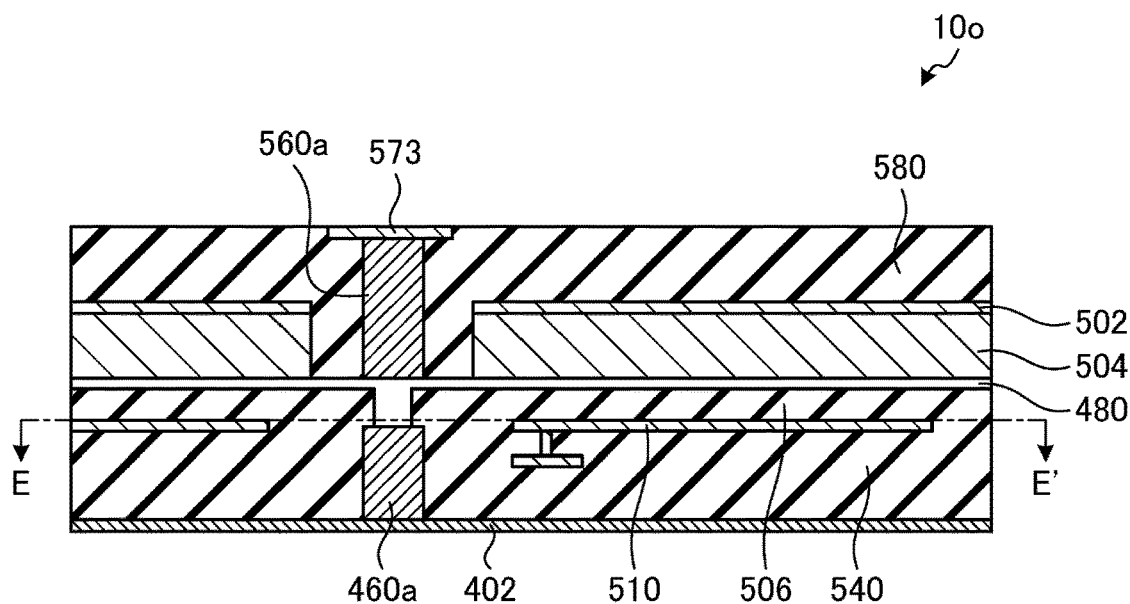
FIG. 49 is a cross-sectional view of a pixel array unit according to the present embodiment.

First, one of structure examples of the present embodiment will be described with reference to FIG. 49. FIG. 49 is a cross-sectional view of the pixel array unit 10*o* according to the present embodiment, and only a main part of the present embodiment is illustrated for easy understanding. Specifically, in the present embodiment, the transparent conductive layer 480 electrically connected to the photoelectric conversion film 504 is provided below the photoelectric conversion film 504. The transparent conductive layer 480 is electrically connected to the through electrode 460*a* penetrating the semiconductor substrate 300. Moreover, the through electrode 560*a* described above is electrically connected to the through electrode 460*a* via the transparent conductive layer 480. In addition, in the present embodiment, in a case where the pixel array unit 10*o* is viewed from above, the through electrode 560*a* and the through electrode 460*a* are arranged at the same position, that is, arranged such that the through electrodes 560*a* and 460*a* overlap with each other.

In the present embodiment, the transparent conductive layer 480 can be formed by an oxide semiconductor material such as indium-gallium-zinc oxide (IGZO), an organic semiconductor material, or the like. Moreover, examples of other oxide semiconductor materials may include zinc-tin oxide (ZTO), indium-gallium-zinc-tin oxide (IGZTO), gallium-tin oxide (GTO), indium-gallium oxide (IGO), and the like, in addition to IGZO. Note that, in the present embodiment, it is preferable to select IGZO from the viewpoint of characteristics and ease of creation. Note that a connection region of the transparent conductive layer 480 between with the through electrode 560*a* preferably has low resistance. Therefore, in the present embodiment, for example, when an opening is provided in the transparent conductive layer 480 in order to allow electrical connection to the through electrode 560*a*, after providing the opening, a surface of the transparent conductive layer 480 exposed from the opening is preferably subjected to a hydrogen plasma treatment.

Furthermore, in the present embodiment, examples of the metal material used for the through electrode 560*a* may include W, TiN/W, Co, cobalt-tungsten-boron (CoWB), cobalt-boron-phosphorus (CoBP), and the like.

Figure 50:
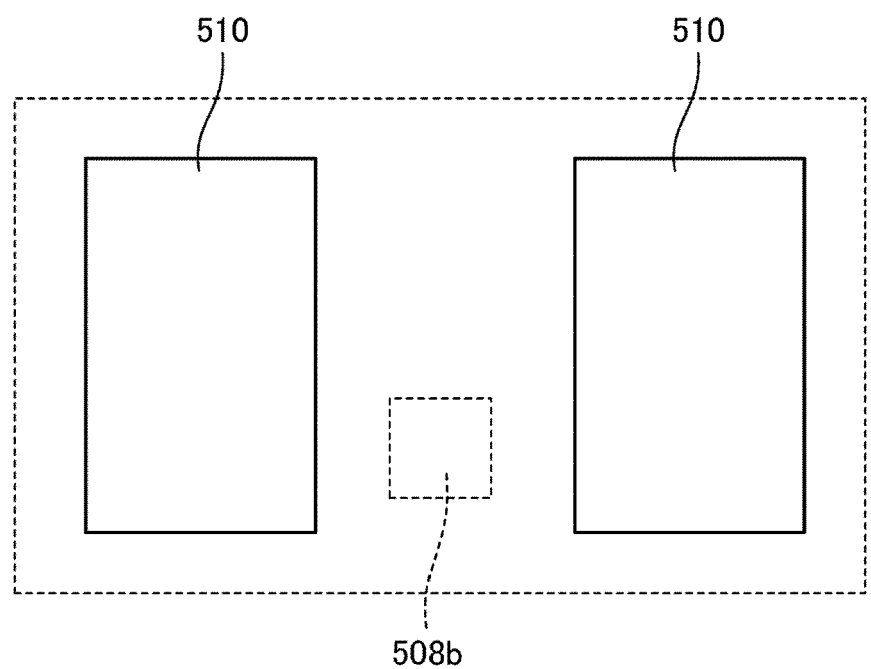
FIG. 50 is a cross-sectional view of a solid-state imaging element taken along line E-E' in FIG. 49 in two-pixel sharing.

Next, a layout configuration in a case where the through electrodes 460*a* and 560*a* are shared by two pixels (solid-state imaging elements) 100 in the present embodiment (two-pixel sharing) will be described with reference to FIG. 50. FIG. 50 is a cross-sectional view of the solid-state imaging element 100 taken along line E-E' in FIG. 49 in two-pixel sharing. Specifically, as illustrated in FIG. 50, in the present embodiment, a contact region 508*b* electrically connected to the through electrode 460*a* via the transparent conductive layer 480 is provided between two storage electrodes 510.

Figure 51:
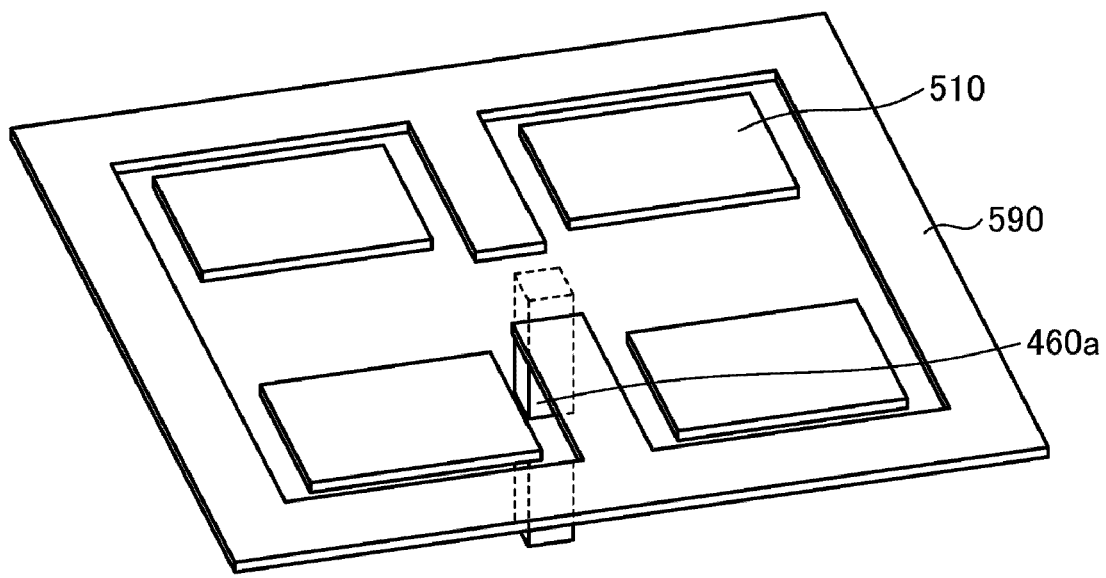
FIG. 51 is a cross-sectional perspective view of the solid-state imaging element taken along line E-E' in FIG. 49 in four-pixel sharing.

Next, a layout configuration in a case where the through electrodes 460*a* and 560*a* are shared by four pixels 100 (four-pixel sharing) in the present embodiment will be described with reference to FIG. 51. FIG. 51 is a cross-sectional perspective view of the solid-state imaging element 100 taken along line E-E' in FIG. 49 in four-pixel sharing. In the present embodiment, as illustrated in FIG. 51, a shield pattern 590 is provided so as to surround the storage electrodes 510 of the four pixels 100. Below a center surrounded by the four storage electrodes 510, the through electrode 460*a* extending downward is provided. Then, in the present embodiment, the through electrode 560*a* and the through electrode 460*a* are arranged so as to overlap with each other in a case where the pixel array unit 10*o* is viewed from above.

Note that the layout configurations illustrated in FIGS. 50 and 51 are an example of the present embodiment, and for example, in each modification of the present embodiment to be described later, the layout configurations illustrated in FIGS. 50 and 51 can be appropriately changed in accordance with each modification.

Next, a manufacturing method for the solid-state imaging element 100 according to the present embodiment will be described with reference to FIGS. 52A, 52B, 52C, 52D, 53A, 53B, and 53C. FIGS. 52A, 52B, 52C, 52D, 53A, 53B, and 53C are cross-sectional views for explaining the manufacturing method for the solid-state imaging element 100 according to the present embodiment, and only a main part of the present embodiment is illustrated in these figures.

First, as illustrated in FIG. 52A, an insulating film 540 is deposited on the semiconductor substrate 300 (not illustrated) on which an antireflection film 402 is formed, and the storage electrode 510 is formed on the insulating film 540. Moreover, after the insulating film 540 is embedded between the storage electrodes 510, a surface is subjected to a CMP method to be planarized. Next, as illustrated in FIG. 52B, a via penetrating the insulating film 540 for the through electrode 460a is formed, and a metal film (for example, a W film) 250 is deposited so as to embed the via. Then, as illustrated in FIG. 52C, the metal film 250 protruding from the via described above is removed by performing planarization by the CMP method up to a surface of the storage electrode 510, so that the through electrode 460a is formed.

Moreover, the insulating film 540 is deposited on the storage electrode 510, and the deposited insulating film 540 is patterned by photolithography and dry etching to form an opening, on the through electrode 460a, through which the through electrode 460a is exposed from the insulating film 540. Then, the transparent conductive layer 480 is deposited so as to fill the opening and cover the insulating film 540. Moreover, as illustrated in FIG. 52D, the photoelectric conversion film 504, a common electrode 502, and an organic film 150 are sequentially deposited on the transparent conductive layer 480.

Figure 53A:
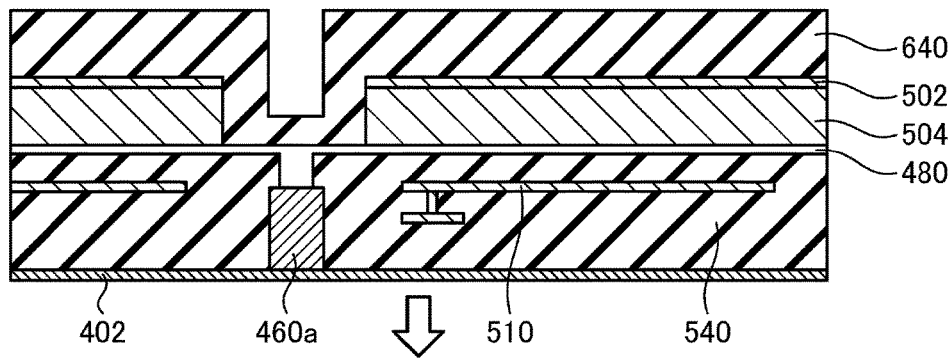
FIGS. 53A, 53B, and 53C are cross-sectional views for explaining a manufacturing method for the solid-state imaging element according to the present embodiment.

Next, as illustrated in FIG. 53A, a via penetrating the common electrode 502 and the photoelectric conversion film 504 for the through electrode 560a is formed by photolithography and dry etching (specifically, etching up to a surface of the transparent conductive layer 480), and an insulating film 580 is deposited so as to cover a side wall of the via and a surface of the common electrode 502.

Figure 53B:
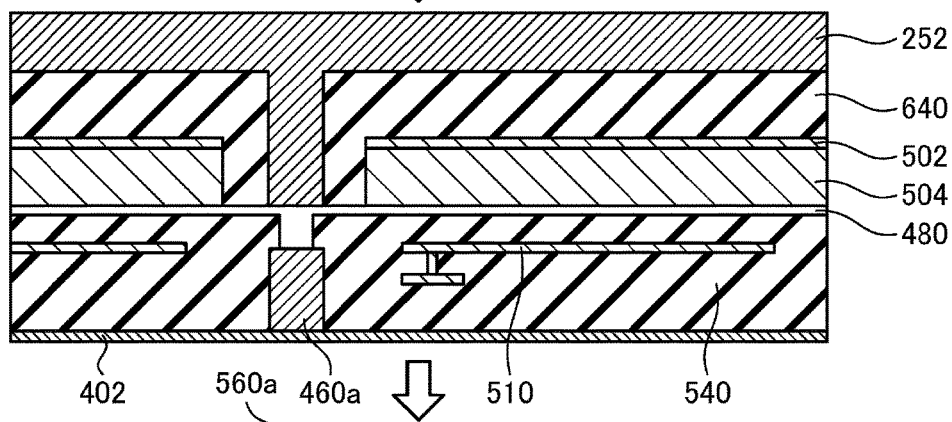
Figure 53C:
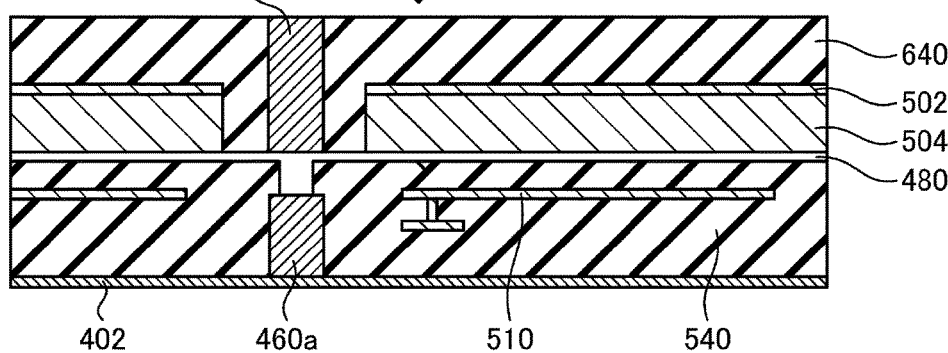

Then, as illustrated in FIG. 53B, the insulating film 580 deposited at the bottom of the via described above is removed by dry etching, and a metal film (for example, a W film) 252 is deposited so as to embed the via. Moreover, as illustrated in FIG. 53C, the through electrode 560a is formed by removing the metal film 252 protruding from the via described above by using the CMP method or the dry etching method. Thereafter, by forming an electrode 573, the pixel array unit 10o as illustrated in FIG. 49 can be obtained.

As described above, according to the present embodiment, since it is possible to avoid an increase in size of the reading electrode 508 or to eliminate necessity of the reading electrode 508, reduction of the incident surface can be avoided.

Figure 54:
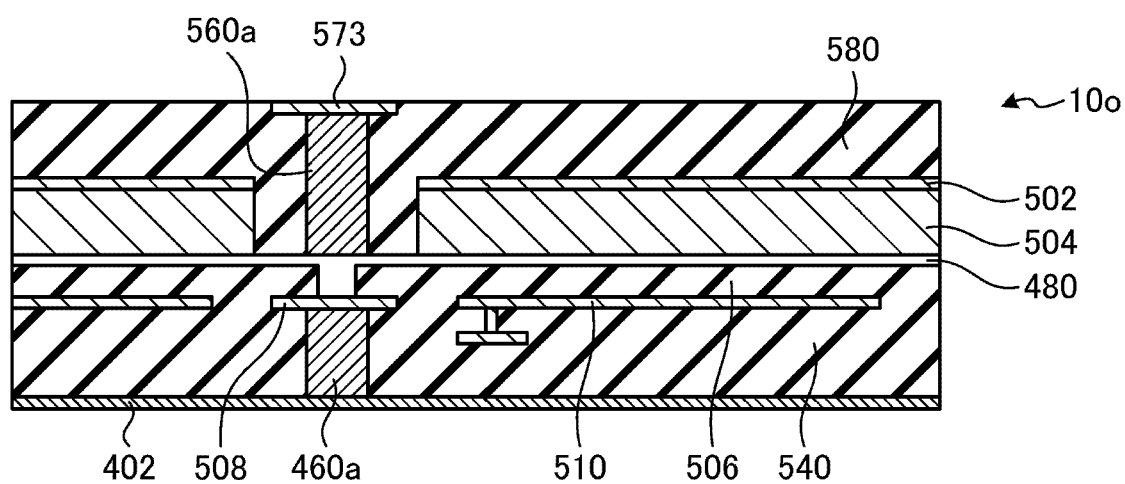
FIG. 54 is a cross-sectional view of a main part of a pixel array unit according to Modification 1 of the present embodiment.

Furthermore, the present embodiment may be modified as illustrated in FIG. 54. Next, Modification 1 of a structure example of the present embodiment will be described with reference to FIG. 54. FIG. 54 is a cross-sectional view of a main part of a pixel array unit 10o according to Modification 1 of the present embodiment. Specifically, in this Modification 1, as illustrated in FIG. 54, a reading electrode 508 is provided, and the through electrode 560a and the through electrode 460a are electrically connected via the reading electrode 508 and the transparent conductive layer 480. Similarly to the above-described embodiment, the structure according to this Modification 1 illustrated in FIG. 54 can be easily formed, in addition to being able to avoid reduction of the incident surface.

Next, a manufacturing method for the solid-state imaging element 100 according to Modification 1 of the present embodiment will be described with reference to FIGS. 55A, 55B, 55C, 55D, 56A, 56B, and 56C. FIGS. 55A, 55B, 55C, 55D, 56A, 56B, and 56C are cross-sectional views for explaining the manufacturing method for the solid-state imaging element 100 according to Modification 1 of the present embodiment, and only a main part of the present embodiment is illustrated in these figures.

Figure 55A:
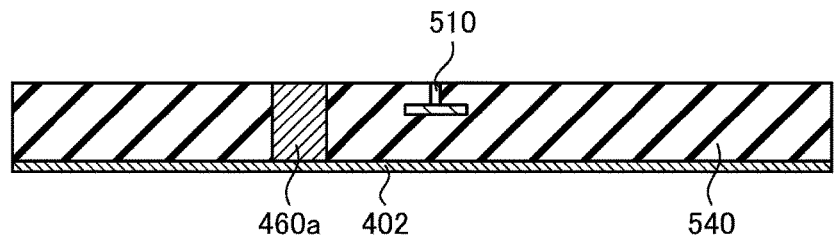
FIGS. 55A, 55B, 55C, and 55D are cross-sectional views for explaining a manufacturing method for the solid-state imaging element according to the present embodiment.
Figure 55B:
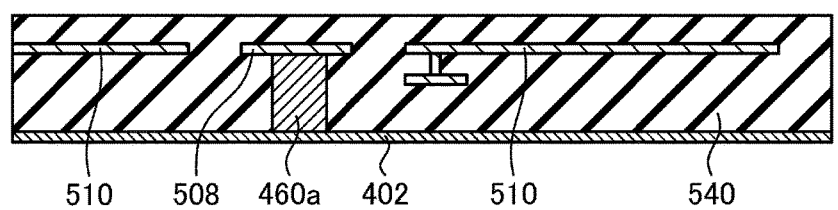
Figure 55C:
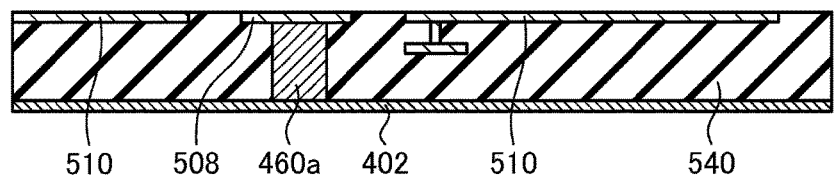

First, similarly to the present embodiment, the insulating film 540 is deposited on the semiconductor substrate 300 (not illustrated) on which the antireflection film 402 is formed, and the storage electrode 510 is formed on the insulating film 540. Moreover, after the insulating film 540 is deposited, a via penetrating the insulating film 540 for the through electrode 460a is formed, and a metal film is deposited so as to embed the via. Then, as illustrated in FIG. 55A, a metal film protruding from the via described above is removed by performing planarization by the CMP method up to a surface of the storage electrode 510, so that the through electrode 460a is formed. Next, as illustrated in FIG. 55B, the reading electrode 508 and the storage electrode 510 are formed, and the insulating film 540 is deposited thereon. Moreover, as illustrated in FIG. 55C, until surfaces of the reading electrode 508 and the storage electrode 510 are exposed, the CMP method is performed to planarize.

Figure 55D:
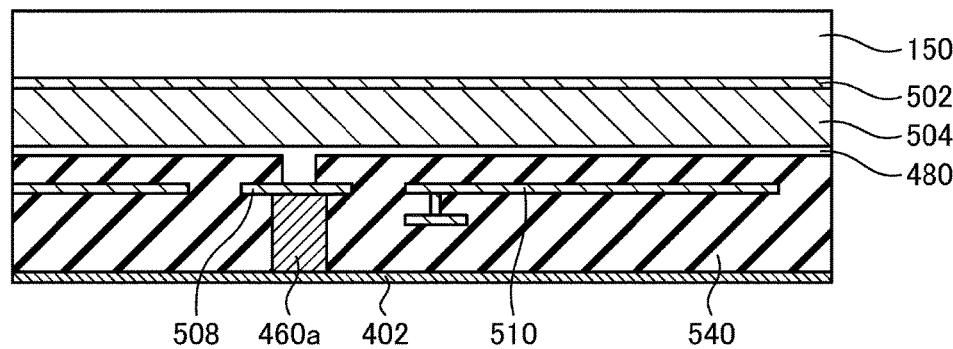

Moreover, the insulating film 540 is deposited on the reading electrode 508 and the storage electrode 510, and an opening is formed in the deposited insulating film 540 such that a surface of the reading electrode 508 on the through electrode 460a is exposed from the insulating film 540. Then, the transparent conductive layer 480 is deposited so as to fill the opening described above and cover the insulating film 540. Moreover, as illustrated in FIG. 55D, the photoelectric conversion film 504, the common electrode 502, and the organic film 150 are sequentially deposited on the transparent conductive layer 480.

Figure 56A:
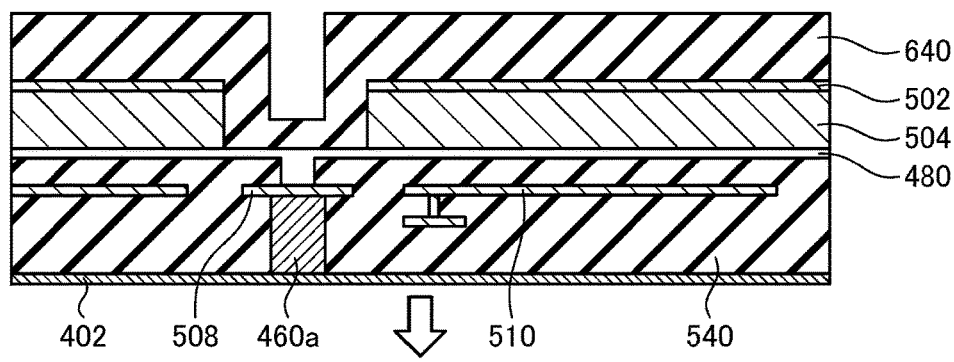
FIGS. 56A, 56B, and 56C are cross-sectional views for explaining a manufacturing method for the solid-state imaging element according to the present embodiment.

Next, as illustrated in FIG. 56A, a via penetrating the common electrode 502 and the photoelectric conversion film 504 for the through electrode 560a is formed by photolithography and dry etching (specifically, etching up to a surface of the transparent conductive layer 480), and the insulating film 580 is deposited so as to cover a side wall of the via and a surface of the common electrode 502.

Figure 56B:
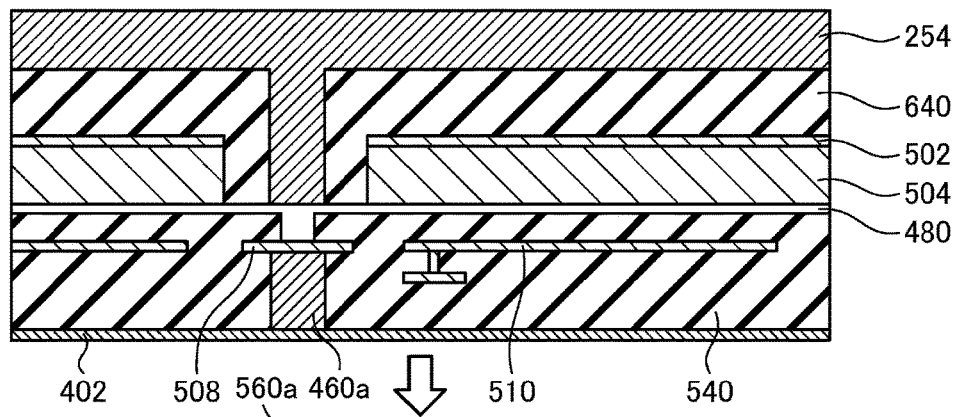
Figure 56C:
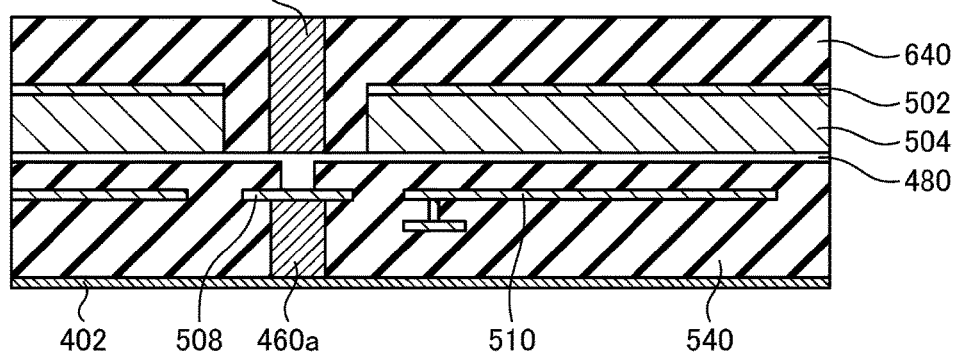

Then, as illustrated in FIG. 56B, the insulating film 580 deposited at the bottom of the via described above is removed, and a metal film 254 is deposited so as to embed the via. Moreover, as illustrated in FIG. 56C, the through electrode 560a is formed by removing the metal film 254 protruding from the via described above. Thereafter, by forming the electrode 573, the pixel array unit 10o as illustrated in FIG. 54 can be obtained.

Figure 57:
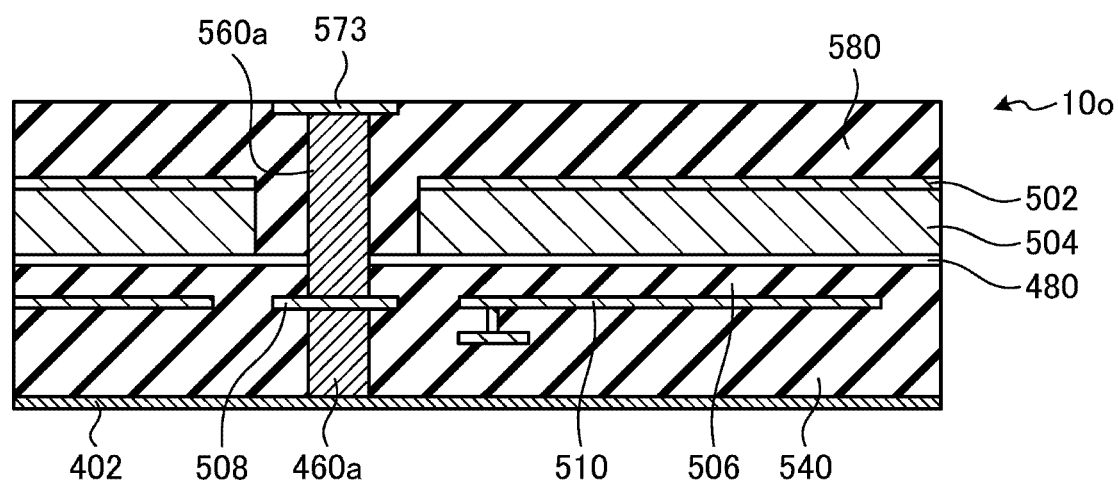
FIG. 57 is a cross-sectional view of a main part of a pixel array unit according to Modification 2 of the present embodiment.

Furthermore, the present embodiment may be modified as illustrated in FIG. 57. Next, Modification 2 of a structure example of the present embodiment will be described with reference to FIG. 57. FIG. 57 is a cross-sectional view of a main part of a pixel array unit 10o according to Modification 2 of the present embodiment. Specifically, in this Modification 2, the through electrode 560a is electrically connected by being in contact with the transparent conductive layer 480 at a side surface, not a bottom surface, of the through electrode 560a. Similarly to the above-described embodiment, the structure according to this Modification 2 illustrated in FIG. 57 can avoid reduction of the incident surface.

Next, a manufacturing method for the solid-state imaging element 100 according to Modification 2 of the present embodiment will be described with reference to FIGS. 58A, 58B, 59A, and 59B. FIGS. 58A, 58B, 59A, and 59B are cross-sectional views for explaining the manufacturing method for the solid-state imaging element 100 according to Modification 2 of the present embodiment, and only a main part of the present embodiment is illustrated in these figures. Note that, the manufacturing method of the this Modification 2 is common to the description of FIGS. 55A, 55B, and 55C of Modification 1 described above, and thus a description of common parts is omitted.

Figure 58A:
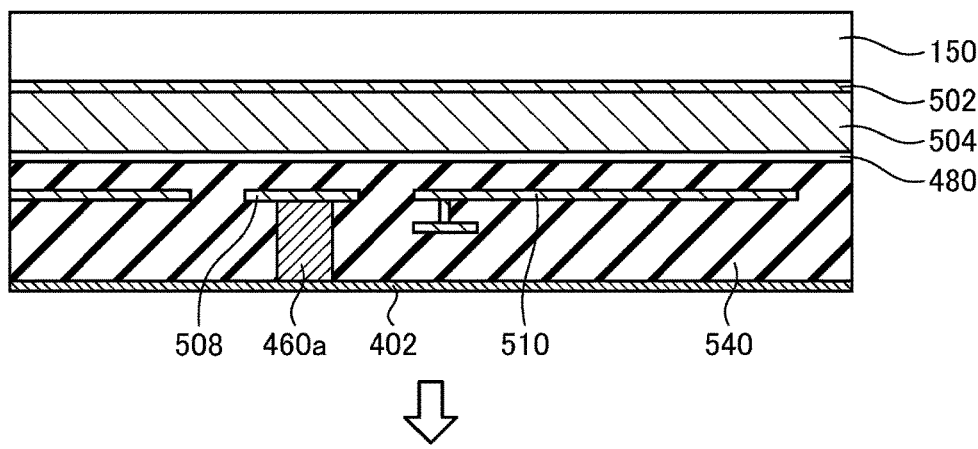
FIGS. 58A and 58B are cross-sectional views for explaining a manufacturing method for the solid-state imaging element according to the present embodiment.
Figure 58B:
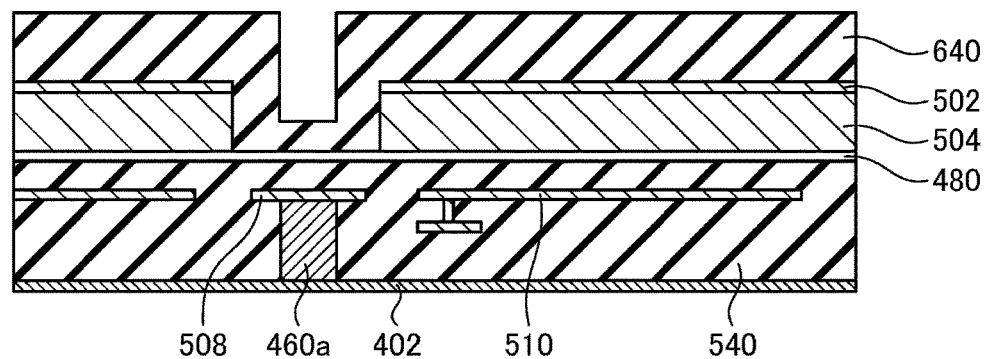

In the present modification, after steps illustrated in FIGS. 55A, 55B, and 55C, as illustrated in FIG. 58A, the insulating film 540, the transparent conductive layer 480, the photoelectric conversion film 504, the common electrode 502, and the organic film 150 are sequentially deposited on the reading electrode 508 and the storage electrode 510. Next, as illustrated in FIG. 58B, a via penetrating the common electrode 502 and the photoelectric conversion film 504 for the through electrode 560a is formed by photolithography and dry etching (specifically, etching up to a surface of the transparent conductive layer 480), and the insulating film 580 is deposited so as to cover a side wall of the via and a surface of the common electrode 502.

Figure 59A:
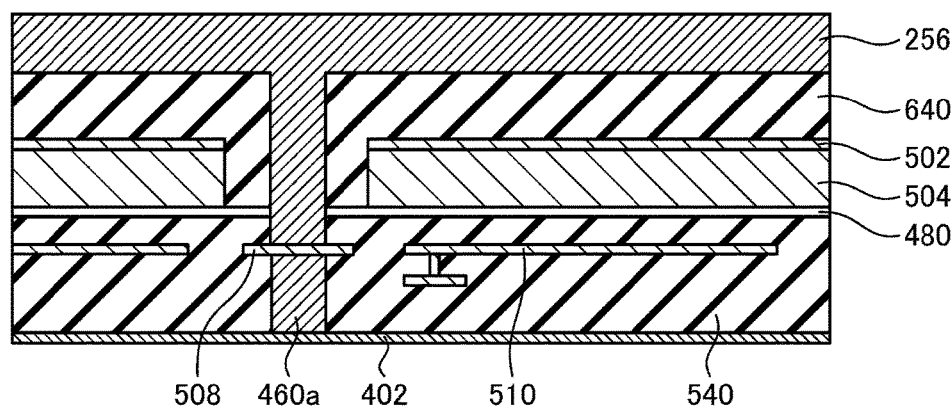
FIGS. 59A and 59B are cross-sectional views for explaining a manufacturing method for the solid-state imaging element according to the present embodiment.
Figure 59B:
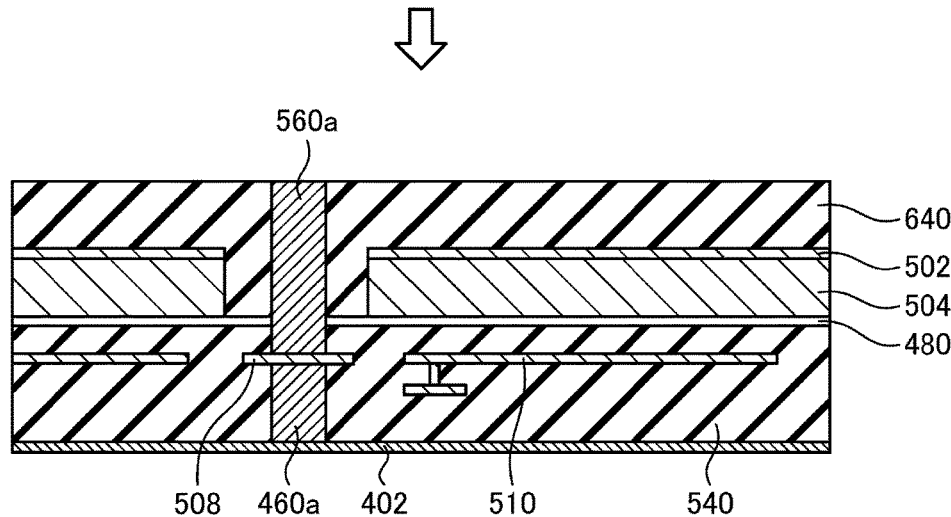

Then, as illustrated in FIG. 59A, the insulating film 580 deposited on the reading electrode 508 is removed together with a part of the transparent conductive layer 480 by dry etching, and a metal film 25 is deposited so as to embed the via. Moreover, as illustrated in FIG. 59B, the through electrode 560a is formed by removing the metal film 256 protruding from the via described above. Thereafter, by forming the electrode 573, the pixel array unit 10o as illustrated in FIG. 57 can be obtained.

Figure 60:
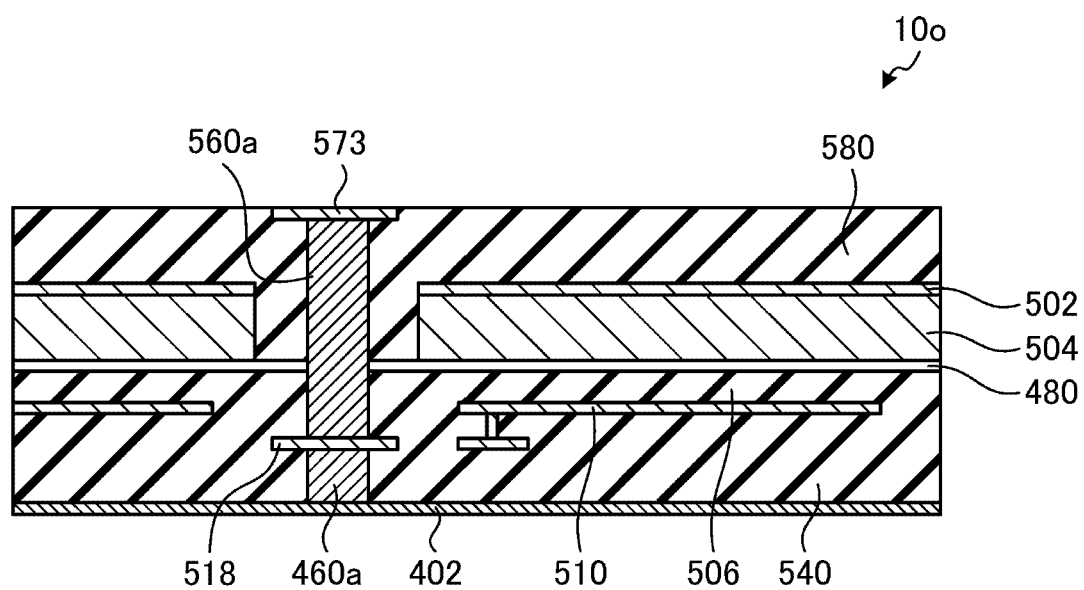
FIG. 60 is a cross-sectional view of a main part of a pixel array unit according to Modification 3 of the present embodiment.

Furthermore, the present embodiment may be modified as illustrated in FIG. 60. Next, Modification 3 of a structure example of the present embodiment will be described with reference to FIG. 60. FIG. 60 is a cross-sectional view of a main part of a pixel array unit 10o according to Modification 3 of the present embodiment. Specifically, in the present modification, a reading electrode 518 including a metal film having low resistance is provided instead of the reading electrode 508. Therefore, in the structure according to the present Modification 3 illustrated in FIG. 60, similarly to the above-described embodiment, not only the reduction of the incident surface can be avoided, but also the connection resistance between the through electrode 560a and the through electrode 460a can be reduced.

Next, a manufacturing method for the solid-state imaging element 100 according to Modification 3 of the present embodiment will be described with reference to FIGS. 61A, 61B, 61C, 61D, 62A, 62B, and 62C. FIGS. 61A, 61B, 61C, 61D, 62A, 62B, and 62C are cross-sectional views for explaining the manufacturing method for the solid-state imaging element 100 according to Modification 3 of the present embodiment, and only a main part of the present embodiment is illustrated in these figures.

Figure 61A:
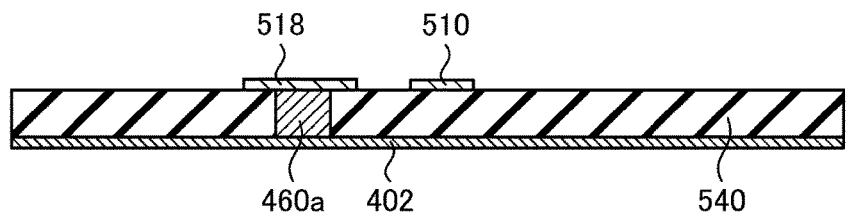
FIGS. 61A, 61B, 61C, and 61D are cross-sectional views for explaining a manufacturing method for the solid-state imaging element according to the present embodiment.

First, similarly to the present embodiment, the insulating film 540 is deposited on the semiconductor substrate 300 (not illustrated) on which the antireflection film 402 is formed, and a part of the storage electrode 510 is formed on the insulating film 540. Moreover, a via penetrating the insulating film 540 for the through electrode 460a is formed, and a metal film is deposited so as to embed the via, to form the through electrode 460a. Then, as illustrated in FIG. 61A, the reading electrode 518 including a metal film is formed on the through electrode 460a by photolithography and dry etching.

Figure 61B:
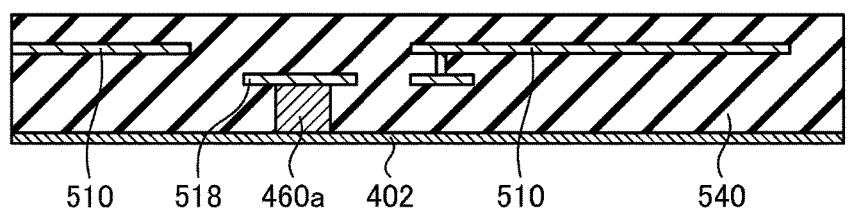
Figure 61C:
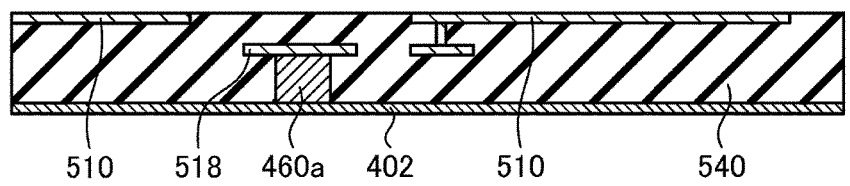
Figure 61D:
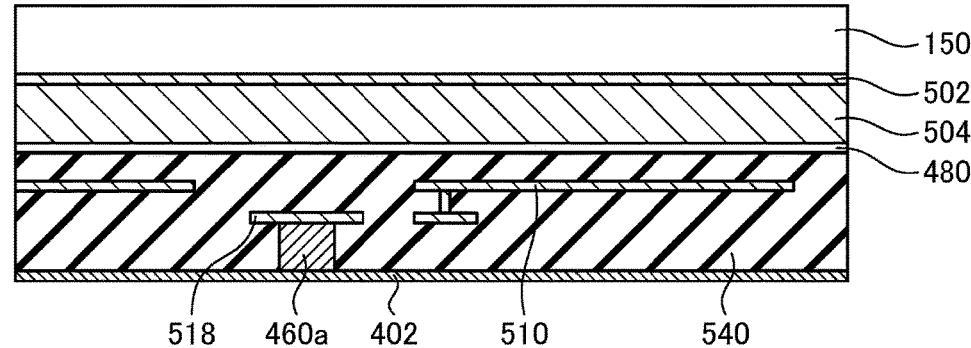

Next, as illustrated in FIG. 61B, after the insulating film 540 is deposited, the storage electrode 510 is formed, and the insulating film 540 is further deposited thereon. Moreover, as illustrated in FIG. 61C, until a surface of the storage electrode 510 is exposed, the CMP method is performed to planarize. Then, as illustrated in FIG. 61D, the insulating film 540, the transparent conductive layer 480, the photoelectric conversion film 504, the common electrode 502, and the organic film 150 are sequentially deposited on the storage electrode 510.

Figure 62A:
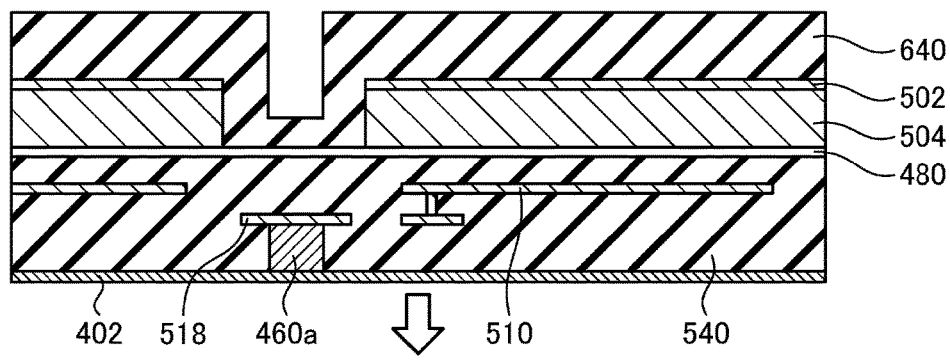
FIGS. 62A, 62B, and 62C are cross-sectional views for explaining a manufacturing method for the solid-state imaging element according to the present embodiment.

Next, as illustrated in FIG. 62A, a via penetrating the common electrode 502 and the photoelectric conversion film 504 for the through electrode 560a is formed by photolithography and dry etching (specifically, etching up to a surface of the transparent conductive layer 480), and the insulating film 580 is deposited so as to cover a side wall of the via and a surface of the common electrode 502.

Figure 62B:
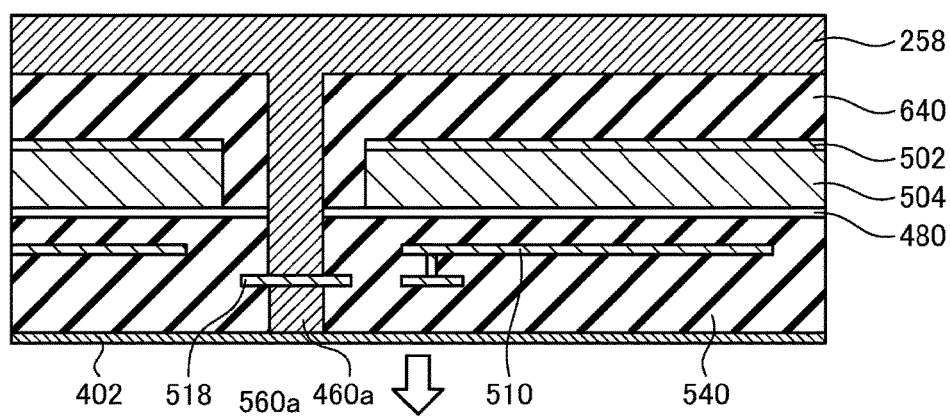
Figure 62C:
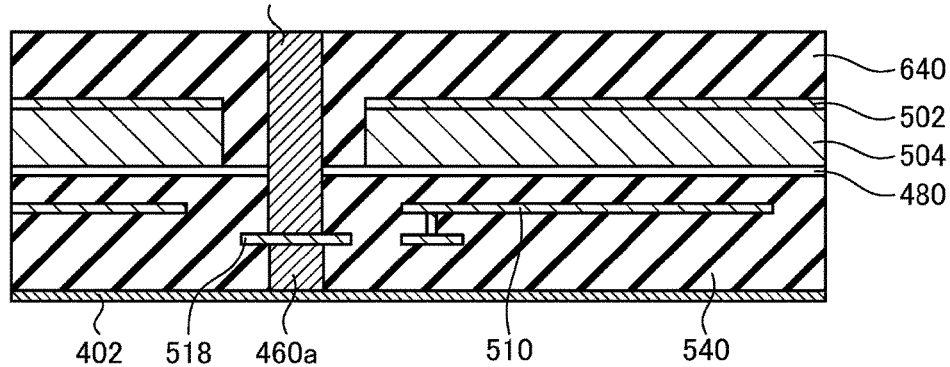

Then, as illustrated in FIG. 62B, the insulating film 580 deposited on the bottom of the via described above is removed together with a part of the transparent conductive layer 480, and a metal film 258 is deposited so as to embed the via. Moreover, as illustrated in FIG. 62C, the through electrode 560a is formed by removing the metal film 258 protruding from the via described above. Thereafter, by forming the electrode 573, the pixel array unit 10o as illustrated in FIG. 60 can be obtained.

Figure 63:
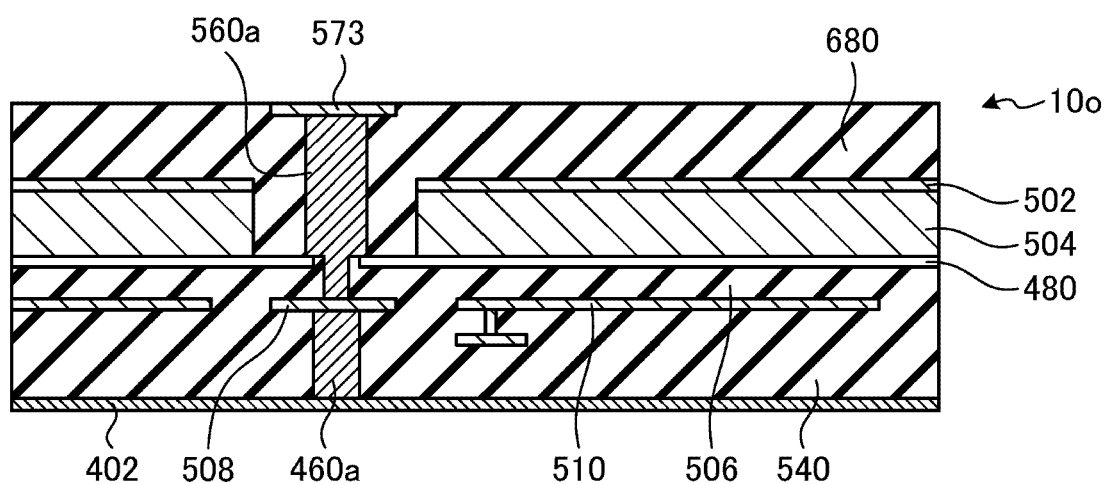
FIG. 63 is a cross-sectional view of a main part of a pixel array unit according to Modification 4 of the present embodiment.

Furthermore, the present embodiment may be modified as illustrated in FIG. 63. Next, Modification 4 of a structure example of the present embodiment will be described with reference to FIG. 63. FIG. 63 is a cross-sectional view of a main part of a pixel array unit 10o according to Modification 4 of the present embodiment. Specifically, in the present modification, a lower end of the through electrode 560a is made thin, and the lower end is electrically connected to the through electrode 460a via the reading electrode 508. Similarly to the above-described embodiment, the structure according to this Modification 4 illustrated in FIG. 63 can avoid reduction of the incident surface.

Next, a manufacturing method for the solid-state imaging element 100 according to Modification 4 of the present embodiment will be described with reference to FIGS. 64A, 64B, 64C, 64D, 65A, and 65B. FIGS. 64A, 64B, 64C, 64D, 65A, and 65B are cross-sectional views for explaining the manufacturing method for the solid-state imaging element 100 according to Modification 4 of the present embodiment, and only a main part of the present embodiment is illustrated in these figures. Note that, the manufacturing method of this Modification 4 is common to the description of Modification 1 for FIGS. 55A, 55B, and 55C and the description of Modification 2 for FIG. 58A described above, so that a description of the common part is omitted.

Figure 64A:
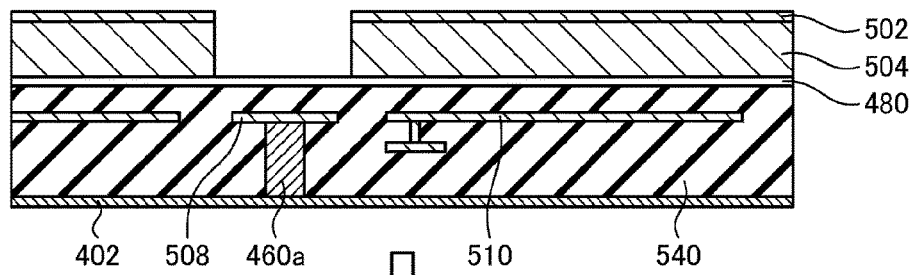
FIGS. 64A, 64B, 64C, and 64D are cross-sectional views for explaining a manufacturing method for the solid-state imaging element according to the present embodiment.

In the present modification, after steps illustrated in FIGS. 55A, 55B, and 55C and steps illustrated in FIG. 58A are performed, as illustrated in FIG. 64A, a via penetrating the common electrode 502 and the photoelectric conversion film 504 for the through electrode 560a is formed by photolithography and dry etching (specifically, etching up to a surface of the transparent conductive layer 480).

Figure 64B:
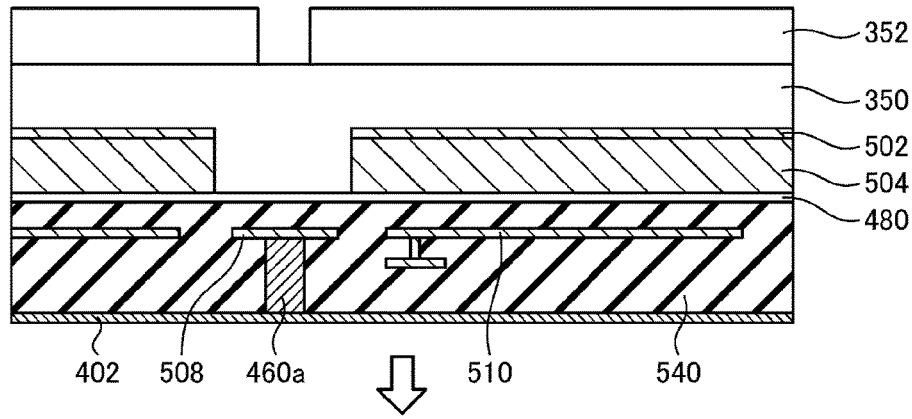
Figure 64C:
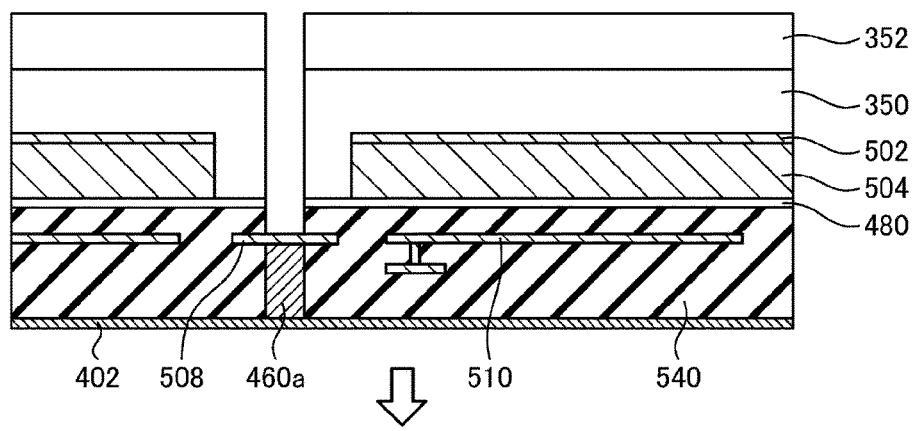

Next, as illustrated in FIG. 64B, the formed via is embedded, an organic film 350 on the common electrode 502 is formed, a surface is planarized, and a patterned photoresist 352 is formed on the planarized surface. Moreover, as illustrated in FIG. 64C, a via penetrating the organic film 350, the transparent conductive layer 480, and the insulating film 540 is formed by dry etching in accordance with the patterned photoresist 352.

Figure 64D:
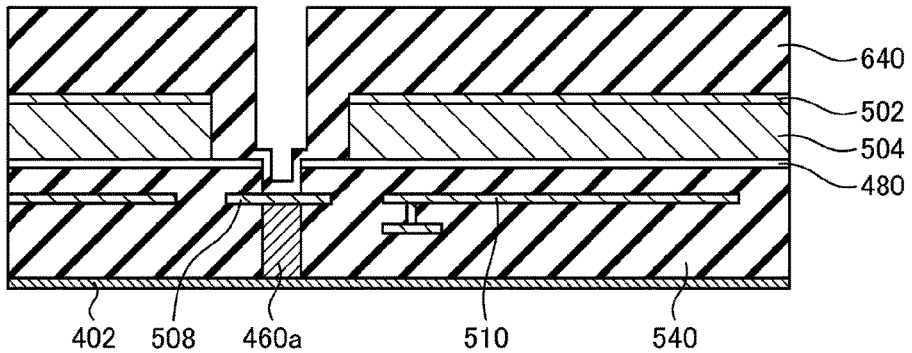
Figure 65A:
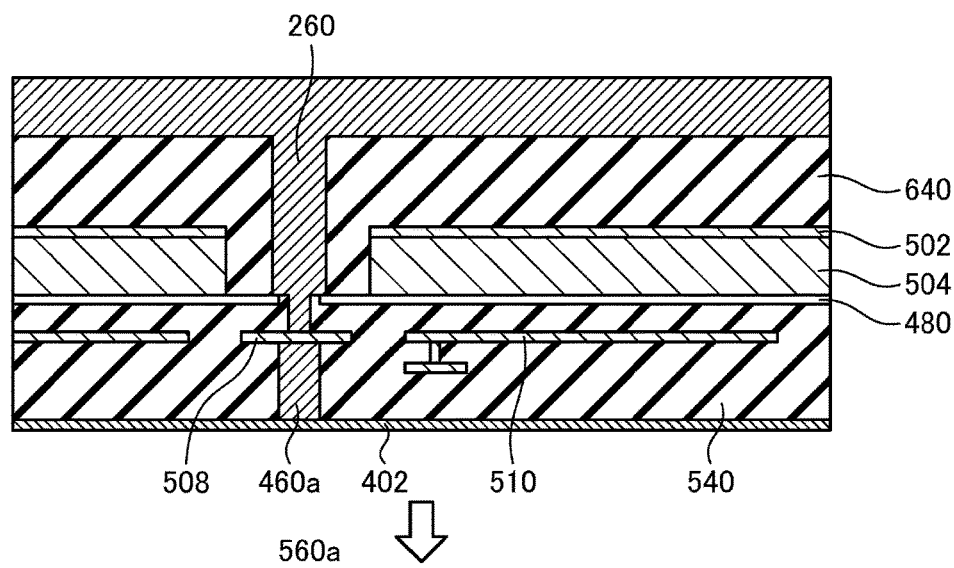
FIGS. 65A and 65B are cross-sectional views for explaining a manufacturing method for the solid-state imaging element according to the present embodiment.
Figure 65B:
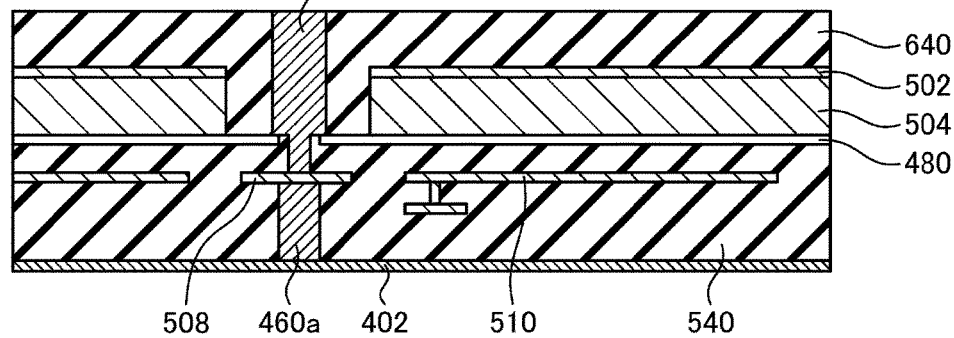

Next, as illustrated in FIG. 64D, after the photoresist 352 and the organic film 350 are removed, the insulating film 580 is deposited so as to cover a surface of the reading electrode 508, a side wall of the via, and a surface of the common electrode 502. Then, as illustrated in FIG. 65A, the insulating film 580 deposited at the bottom of the via described above is removed by dry etching, and a metal film 260 is deposited so as to embed the via. Moreover, as illustrated in FIG. 65B, the through electrode 560a is formed by removing the metal film 260 protruding from the via described above. Thereafter, by forming the electrode 573, the pixel array unit 10o as illustrated in FIG. 63 can be obtained.

Figure 66:
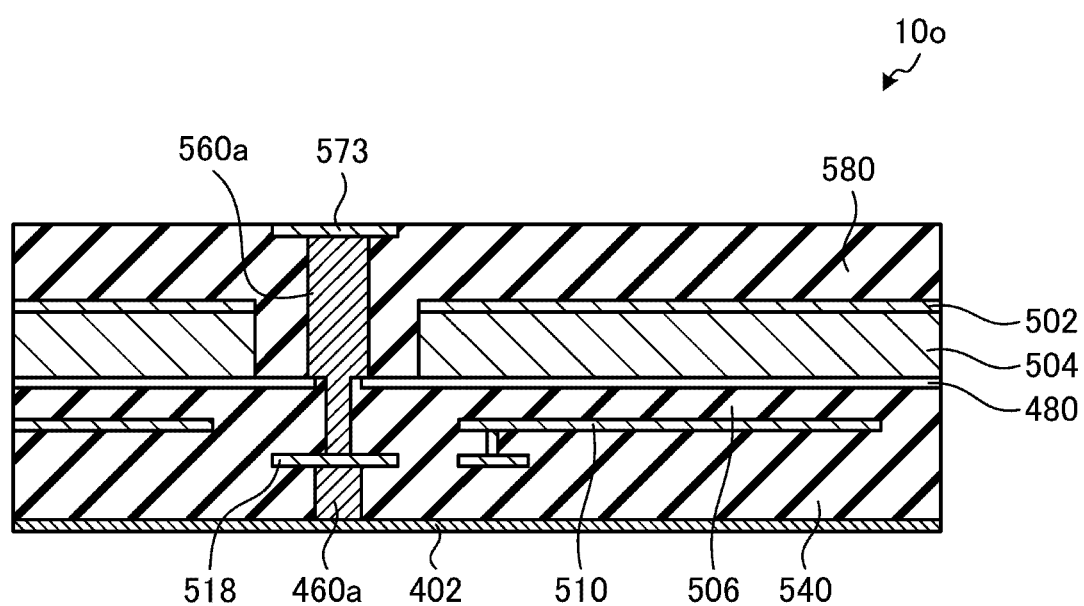
FIG. 66 is a cross-sectional view of a main part of a pixel array unit according to Modification 5 of the present embodiment.

Furthermore, the present embodiment may be modified as illustrated in FIG. 66. Next, Modification 5 of a structure example of the present embodiment will be described with reference to FIG. 66. FIG. 66 is a cross-sectional view of a main part of a pixel array unit 10o according to Modification 5 of the present embodiment. Specifically, in the present modification, a lower end of the through electrode 560a is made thin, and the lower end is electrically connected to the through electrode 460a via the reading electrode 518 including a low-resistance metal film. Similarly to the above-described embodiment, the structure according to this Modification 5 illustrated in FIG. 66 can avoid reduction of the incident surface.

Next, a manufacturing method for the solid-state imaging element 100 according to Modification 5 of the present embodiment will be described with reference to FIGS. 67A, 67B, 67C, and 67D. FIGS. 67A, 67B, 67C, and 67D are cross-sectional views for explaining the manufacturing method for the solid-state imaging element 100 according to Modification 5 of the present embodiment, and only a main part of the present embodiment is illustrated in these figures. Note that, in the manufacturing method of the this Modification 5, the description of FIGS. 61A, 61B, 61C, and 61D of Modification 3 described above is common, and thus a description of common parts is omitted.

Figure 67A:
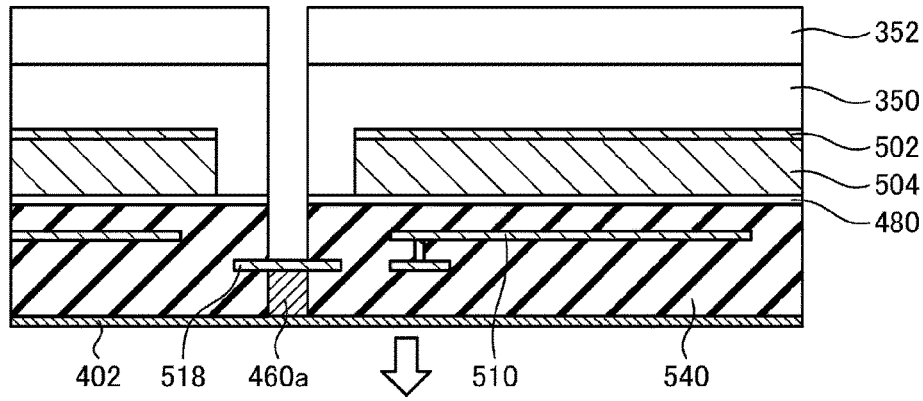
FIGS. 67A, 67B, 67C, and 67D are cross-sectional views for explaining a manufacturing method for the solid-state imaging element according to the present embodiment.

In the present modification, after steps illustrated in FIGS. 61A, 61B, 61C, and 61D are performed, a via penetrating the common electrode 502 and the photoelectric conversion film 504 for the through electrode 560a is formed by photolithography and dry etching (specifically, etching up to a surface of the transparent conductive layer 480). Moreover, the formed via is embedded, the organic film 350 on the common electrode 502 is formed, a surface is planarized, and the patterned photoresist 352 is formed on the planarized surface. Then, as illustrated in FIG. 67A, a via penetrating the organic film 350, the transparent conductive layer 480, and the insulating film 540 is formed in accordance with the patterned photoresist 352.

Figure 67B:
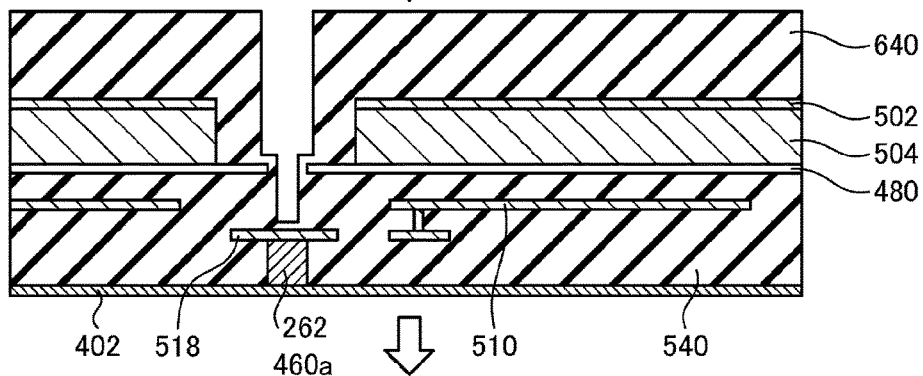
Figure 67C:
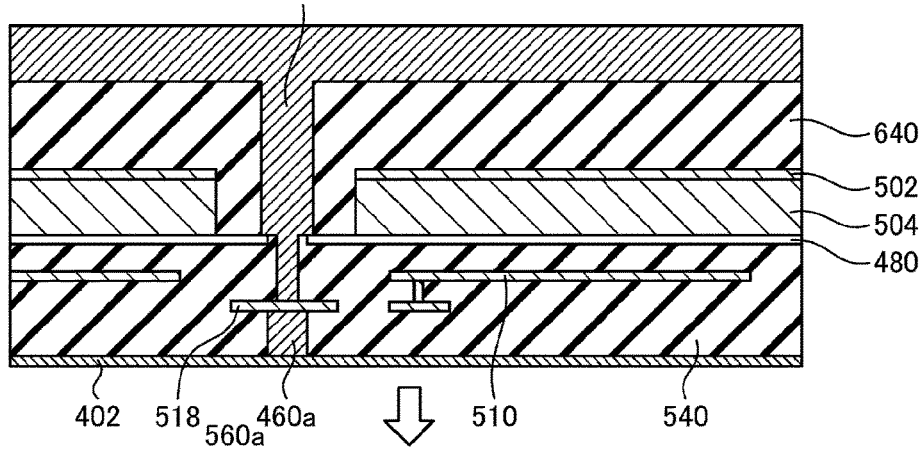
Figure 67D:
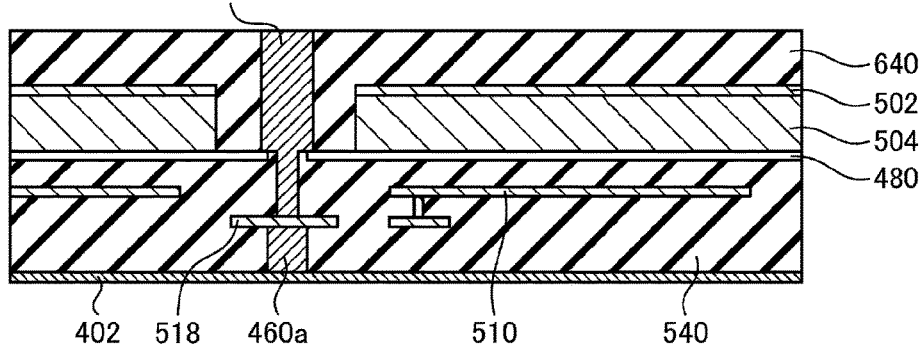

Next, as illustrated in FIG. 67B, after the photoresist 352 and the organic film 350 are removed, the insulating film 580 is deposited so as to cover a surface of the reading electrode 518, a side wall of the via, and a surface of the common electrode 502. Then, as illustrated in FIG. 67C, the insulating film 580 deposited at the bottom of the via described above is removed by dry etching, and a metal film 262 is deposited so as to embed the via. Moreover, as illustrated in FIG. 67D, the through electrode 560a is formed by removing the metal film 262 protruding from the via described above. Thereafter, by forming the electrode 573, the pixel array unit 10o as illustrated in FIG. 66 can be obtained.

18. Application Example

Figure 68:
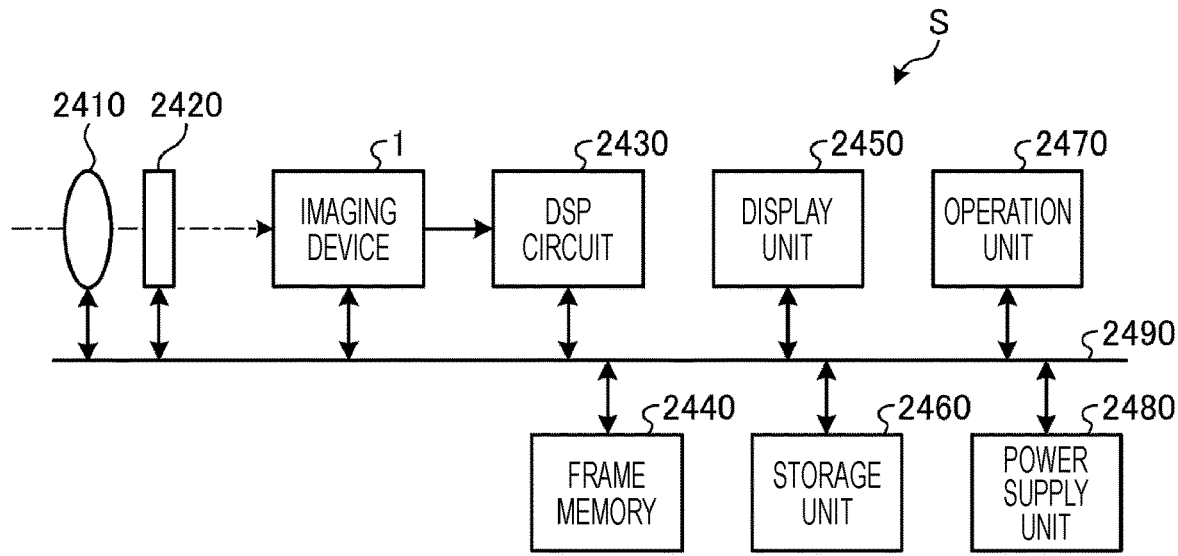
FIG. 68 illustrates an example of a schematic configuration of an imaging system including the solid-state imaging device (an imaging device) according to the above-described embodiments and modifications thereof.

FIG. 68 illustrates an example of a schematic configuration of an imaging system S including the solid-state imaging device (imaging device) 1 according to the above-described embodiments and modifications thereof.

The imaging system S is, for example, an electronic device such as an imaging device such as a digital still camera or a video camera, or a portable terminal device such as a smartphone or a tablet terminal. The imaging system S includes, for example, the solid-state imaging device 1 according to the above-described embodiments and modifications thereof, a DSP circuit 2430, a frame memory 2440, a display unit 2450, a storage unit 2460, an operation unit 2470, and a power supply unit 2480. In the imaging system S, the imaging device 1 according to the above-described embodiments and modifications thereof, the DSP circuit 2430, the frame memory 2440, the display unit 2450, the storage unit 2460, the operation unit 2470, and the power supply unit 2480 are connected to each other via a bus line 2490.

The imaging device 1 according to the above-described embodiments and modifications thereof outputs image data according to incident light. The DSP circuit 2430 is a signal processing circuit that processes a signal (image data) outputted from the imaging device 1 according to the above-described embodiments and modifications thereof. The frame memory 2440 temporarily holds the image data processed by the DSP circuit 2430, on a frame basis. The display unit 2450 includes, for example, a panel-type display device such as a liquid crystal panel or an organic electro luminescence (EL) panel, and displays a moving image or a still image captured by the imaging device 1 according to the above-described embodiments and modifications thereof. The storage unit 2460 records image data of a moving image or a still image captured by the imaging device 1 according to the above-described embodiments and modifications thereof, in a recording medium such as a semiconductor memory or a hard disk. The operation unit 2470 issues operation commands for various functions of the imaging system S in accordance with an operation by a user. The power supply unit 2480 appropriately supplies various power supplies serving as operation power supplies of the imaging device 1 according to the above-described embodiments and modifications thereof, the DSP circuit 2430, the frame memory 2440, the display unit 2450, the storage unit 2460, and the operation unit 2470, to these supply targets.

Next, an imaging procedure in the imaging system S will be described.

Figure 69:
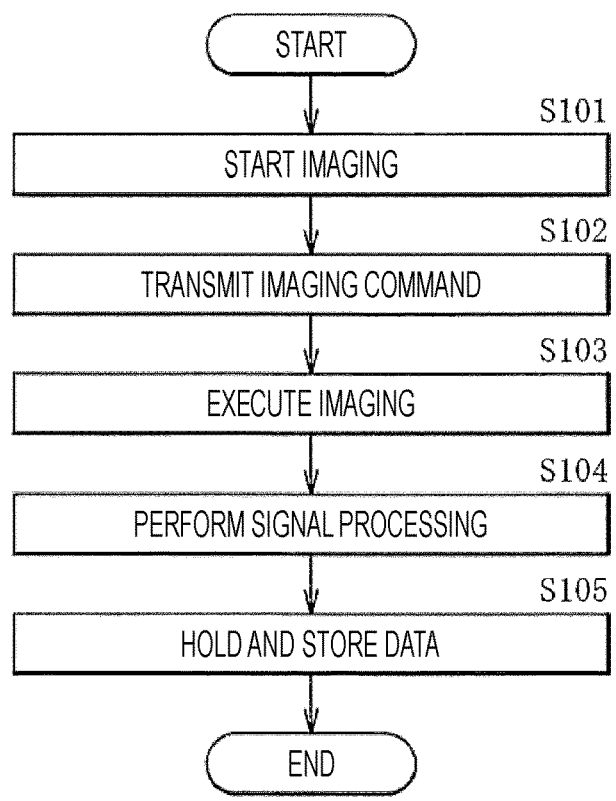
FIG. 69 is a view illustrating an example of a flowchart of an imaging operation in the imaging system.

FIG. 69 illustrates an example of a flowchart of an imaging operation in the imaging system S. The user instructs a start of imaging by operating the operation unit 2470 (step S101). Then, the operation unit 2470 transmits an imaging command to the imaging device 1 (step S102). When receiving the imaging command, the imaging device 1 executes imaging by a predetermined imaging method (step S103).

The imaging device 1 outputs image data obtained by imaging, to the DSP circuit 2430. Here, the image data is data for all pixels of a pixel signal generated on the basis of charges temporarily held in the floating diffusion unit 314. The DSP circuit 2430 performs predetermined signal processing (for example, noise reduction processing) on the basis of the image data inputted from the imaging device 1 (step S104). The DSP circuit 2430 causes the frame memory 2440 to hold the image data subjected to predetermined signal processing, and the frame memory 2440 causes the storage unit 2460 to store the image data (step S105). In this way, imaging in the imaging system S is performed.

In the present application example, the imaging device 1 according to the above-described embodiments and modifications thereof is applied to the imaging system S. Since the imaging device 1 can efficiently output and transfer a pixel signal while suppressing an increase in manufacturing cost, it is possible to provide the imaging system S capable of efficiently outputting and transferring the pixel signal while suppressing an increase in manufacturing cost.

19. Application Example to Endoscopic Surgery System

The technology (the present technology) according to the present disclosure can be applied to various products. For example, the technology according to the present disclosure may be applied to an endoscopic surgery system.

Figure 70:
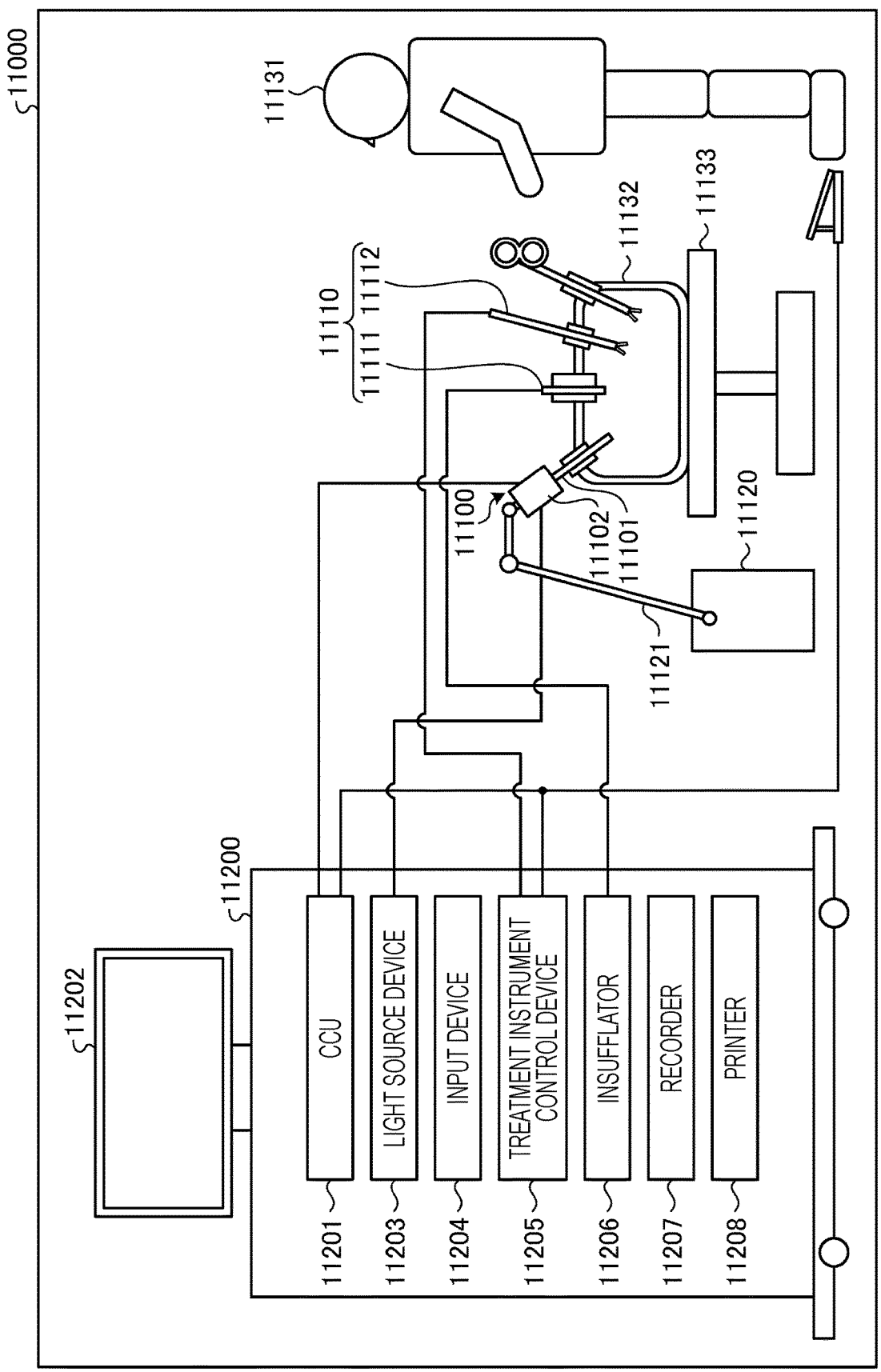
FIG. 70 is a view illustrating an example of a schematic configuration of an endoscopic surgery system to which the technology (the present technology) according to the present disclosure can be applied.

FIG. 70 is a view illustrating an example of a schematic configuration of an endoscopic surgery system to which the technology (the present technology) according to the present disclosure can be applied.

FIG. 70 illustrates a state where an operator (a doctor) 11131 performs surgery on a patient 11132 on a patient bed 11133, by using an endoscopic surgery system 11000. As illustrated, the endoscopic surgery system 11000 includes: an endoscope 11100; other surgical instruments 11110 such as an insufflation tube 11111 and an energy treatment instrument 11112; a support arm device 11120 supporting the endoscope 11100; and a cart 11200 mounted with various devices for endoscopic surgery.

The endoscope 11100 includes a lens barrel 11101 whose region of a predetermined length from a distal end is inserted into a body cavity of the patient 11132, and a camera head 11102 connected to a proximal end of the lens barrel 11101. In the illustrated example, the endoscope 11100 configured as a so-called rigid endoscope having a rigid lens barrel 11101 is illustrated, but the endoscope 11100 may be configured as a so-called flexible endoscope having a flexible lens barrel.

At the distal end of the lens barrel 11101, an opening fitted with an objective lens is provided. The endoscope 11100 is connected with a light source device 11203, and light generated by the light source device 11203 is guided to the distal end of the lens barrel by a light guide extended inside the lens barrel 11101, and emitted toward an observation target in the body cavity of the patient 11132 through the objective lens. Note that the endoscope 11100 may be a forward-viewing endoscope, or may be an oblique-viewing endoscope or a side-viewing endoscope.

Inside the camera head 11102, an optical system and an imaging element are provided, and reflected light (observation light) from the observation target is condensed on the imaging element by the optical system. The observation light is photoelectrically converted by the imaging element, and an electric signal corresponding to the observation light, in other words, an image signal corresponding to an observation image is generated. The image signal is transmitted to a camera control unit (CCU) 11201 as RAW data.

The CCU 11201 is configured by a central processing unit (CPU), a graphics processing unit (GPU), and the like, and integrally controls action of the endoscope 11100 and a display device 11202. Moreover, the CCU 11201 receives an image signal from the camera head 11102, and applies, on the image signal, various types of image processing for displaying an image on the basis of the image signal, for example, development processing (demosaicing processing) and the like.

The display device 11202 displays an image on the basis of the image signal subjected to the image processing by the CCU 11201, under the control of the CCU 11201.

The light source device 11203 is configured by a light source such as a light emitting diode (LED), for example, and supplies irradiation light at a time of capturing an image of the operative site or the like to the endoscope 11100.

An input device 11204 is an input interface to the endoscopic surgery system 11000. A user can input various types of information and input instructions to the endoscopic surgery system 11000 via the input device 11204. For example, the user inputs an instruction or the like for changing imaging conditions (a type of irradiation light, a magnification, a focal length, and the like) by the endoscope 11100.

A treatment instrument control device 11205 controls driving of the energy treatment instrument 11112 for ablation of a tissue, incision, sealing of a blood vessel, or the like. An insufflator 11206 sends gas into a body cavity through the insufflation tube 11111 in order to inflate the body cavity of the patient 11132 for the purpose of securing a visual field by the endoscope 11100 and securing a working space of the operator. A recorder 11207 is a device capable of recording various types of information regarding the surgery. A printer 11208 is a device capable of printing various types of information regarding the surgery in various forms such as text, images, and graphs.

Note that the light source device 11203 that supplies the endoscope 11100 with irradiation light for capturing an image of the operative site may include, for example, a white light source configured by an LED, a laser light source, or a combination thereof. In a case where the white light source is configured by a combination of RGB laser light sources, since output intensity and output timing of each color (each wavelength) can be controlled with high precision, the light source device 11203 can adjust white balance of a captured image. Furthermore, in this case, it is also possible to capture an image corresponding to each of RGB in a time division manner by irradiating the observation target with laser light from each of the RGB laser light sources in a time-division manner, and controlling driving of the imaging element of the camera head 11102 in synchronization with the irradiation timing. According to this method, it is possible to obtain a color image without providing a color filter in the imaging element.

Furthermore, driving of the light source device 11203 may be controlled to change intensity of the light to be outputted at every predetermined time interval. By acquiring images in a time-division manner by controlling the driving of the imaging element of the camera head 11102 in synchronization with the timing of the change of the light intensity, and combining the images, it is possible to generate an image of a high dynamic range without so-called black defects and whiteout.

Furthermore, the light source device 11203 may be configured to be able to supply light having a predetermined wavelength band corresponding to special light observation. In the special light observation, for example, so-called narrow band imaging is performed in which predetermined tissues such as blood vessels in a mucous membrane surface layer are imaged with high contrast by utilizing wavelength dependency of light absorption in body tissues and irradiating the predetermined tissues with narrow band light as compared to the irradiation light (in other words, white light) at the time of normal observation. Alternatively, in the special light observation, fluorescence observation for obtaining an image by fluorescence generated by irradiation of excitation light may be performed. In the fluorescence observation, it is possible to perform irradiating a body tissue with excitation light and observing fluorescence from the body tissue (autofluorescence observation), locally injecting a reagent such as indocyanine green (ICG) into a body tissue and irradiating the body tissue with excitation light corresponding to the fluorescence wavelength of the reagent to obtain a fluorescent image, or the like. The light source device 11203 may be configured to be able to supply narrow band light and/or excitation light corresponding to such special light observation.

Figure 71:
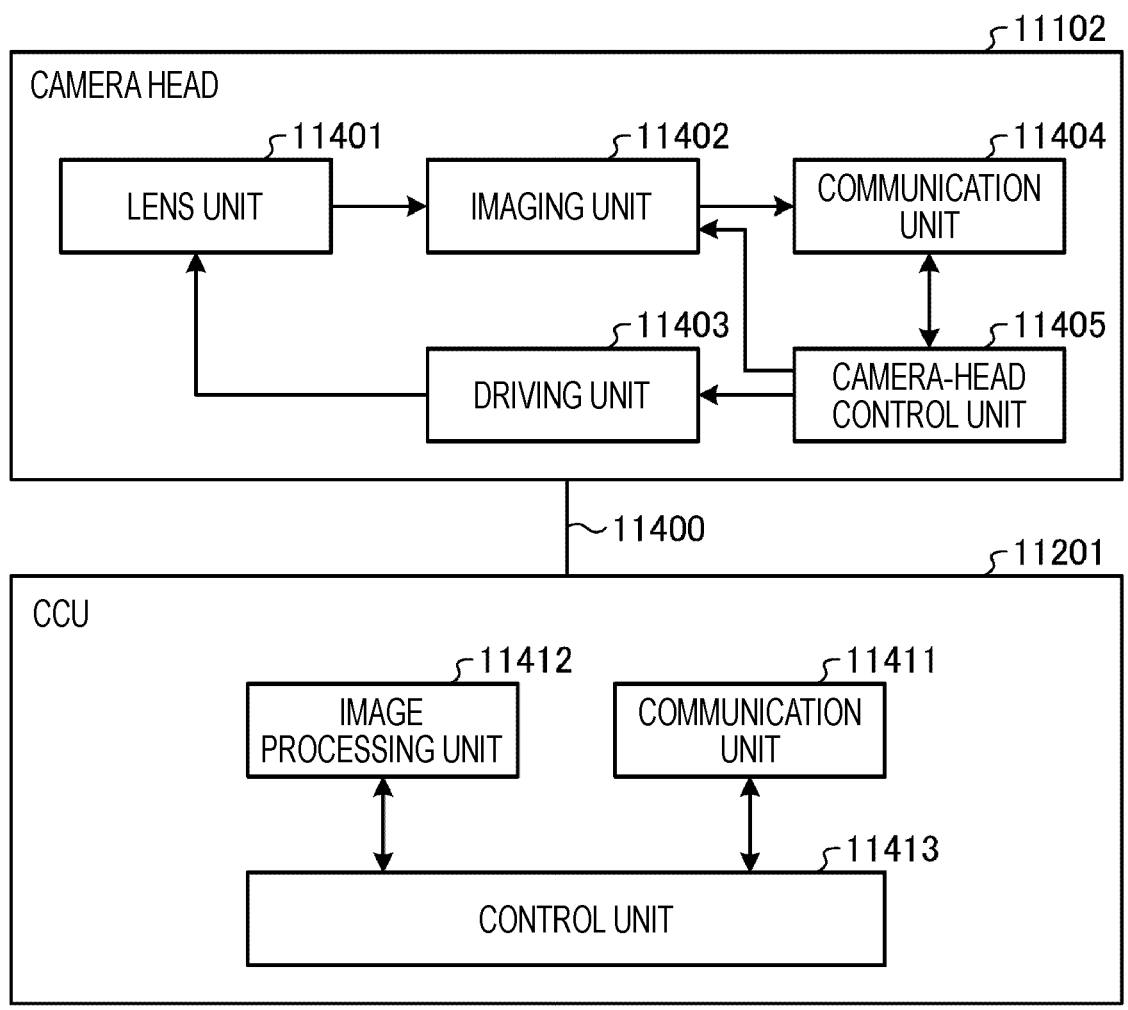
FIG. 71 is a block diagram illustrating an example of a functional configuration of a camera head and a CCU illustrated in FIG. 70.

FIG. 71 is a block diagram illustrating an example of a functional configuration of the camera head 11102 and the CCU 11201 illustrated in FIG. 70.

The camera head 11102 has a lens unit 11401, an imaging unit 11402, a driving unit 11403, a communication unit 11404, and a camera-head control unit 11405. The CCU 11201 has a communication unit 11411, an image processing unit 11412, and a control unit 11413. The camera head 11102 and the CCU 11201 are communicably connected in both directions by a transmission cable 11400.

The lens unit 11401 is an optical system provided at a connection part with the lens barrel 11101. Observation light taken in from the distal end of the lens barrel 11101 is guided to the camera head 11102 and is incident on the lens unit 11401. The lens unit 11401 is configured by combining a plurality of lenses including a zoom lens and a focus lens.

The imaging unit 11402 includes an imaging element. The number of the imaging elements included in the imaging unit 11402 may be one (a so-called single plate type) or plural (a so-called multi-plate type). In a case where the imaging unit 11402 is configured with the multi-plate type, for example, individual imaging elements may generate image signals corresponding to RGB each, and a color image may be obtained by synthesizing them. Alternatively, the imaging unit 11402 may have a pair of imaging elements for respectively acquiring image signals for the right eye and the left eye corresponding to three-dimensional (3D) display. Performing 3D display enables the operator 11131 to more accurately grasp a depth of living tissues in the operative site. Note that, in a case where the imaging unit 11402 is configured as the multi-plate type, a plurality of systems of the lens unit 11401 may also be provided corresponding to individual imaging elements.

Furthermore, the imaging unit 11402 may not necessarily be provided in the camera head 11102. For example, the imaging unit 11402 may be provided inside the lens barrel 11101 immediately after the objective lens.

The driving unit 11403 is configured by an actuator, and moves the zoom lens and the focus lens of the lens unit 11401 along an optical axis by a predetermined distance under control from the camera-head control unit 11405. With this configuration, a magnification and focus of a captured image by the imaging unit 11402 may be appropriately adjusted.

The communication unit 11404 is configured by a communication device for exchange of various types of information between with the CCU 11201. The communication unit 11404 transmits an image signal obtained from the imaging unit 11402 to the CCU 11201 via the transmission cable 11400 as RAW data.

Furthermore, the communication unit 11404 receives a control signal for controlling driving of the camera head 11102 from the CCU 11201, and supplies to the camera-head control unit 11405. The control signal includes information regarding imaging conditions such as, for example, information of specifying a frame rate of a captured image, information of specifying an exposure value at the time of imaging, information of specifying a magnification and focus of a captured image, and/or the like.

Note that the imaging conditions described above such as a frame rate, an exposure value, magnification, and focus may be appropriately specified by the user, or may be automatically set by the control unit 11413 of the CCU 11201 on the basis of the acquired image signal. In the latter case, a so-called auto exposure (AE) function, auto focus (AF) function, and auto white balance (AWB) function are to be installed in the endoscope 11100.

The camera-head control unit 11405 controls driving of the camera head 11102 on the basis of the control signal from the CCU 11201 received via the communication unit 11404.

The communication unit 11411 is configured by a communication device for exchange of various types of information with the camera head 11102. The communication unit 11411 receives an image signal transmitted via the transmission cable 11400 from the camera head 11102.

Furthermore, the communication unit 11411 transmits, to the camera head 11102, a control signal for controlling driving of the camera head 11102. Image signals and control signals can be transmitted by telecommunication, optical communication, or the like.

The image processing unit 11412 performs various types of image processing on an image signal that is RAW data transmitted from the camera head 11102.

The control unit 11413 performs various types of control related to imaging of an operative site and the like by the endoscope 11100 and related to display of a captured image obtained by the imaging of the operative site and the like. For example, the control unit 11413 generates a control signal for controlling driving of the camera head 11102.

Furthermore, the control unit 11413 causes the display device 11202 to display a captured image in which the operative site or the like is shown, on the basis of the image signal subjected to the image processing by the image processing unit 11412. At this time, the control unit 11413 recognizes various objects in the captured image by using various image recognition techniques. For example, by detecting a shape, a color, and the like of an edge of the object included in the captured image, the control unit 11413 can recognize a surgical instrument such as forceps, a specific living site, bleeding, mist in using the energy treatment instrument 11112, and the like. When causing the display device 11202 to display the captured image, the control unit 11413 may use the recognition result to superimpose and display various types of surgery support information on the image of the operative site. By superimposing and displaying the surgical support information and presenting to the operator 11131, it becomes possible to reduce a burden on the operator 11131 and to allow the operator 11131 to reliably proceed with the surgery.

The transmission cable 11400 connecting the camera head 11102 and the CCU 11201 is an electric signal cable corresponding to communication of an electric signal, an optical fiber corresponding to optical communication, or a composite cable of these.

Here, in the illustrated example, communication is performed by wire communication using the transmission cable 11400, but communication between the camera head 11102 and the CCU 11201 may be performed wirelessly.

An example of the endoscopic surgery system to which the technology according to the present disclosure may be applied has been described above. The technology according to the present disclosure can be applied to, for example, the endoscope 11100, (the imaging unit 11402 of) the camera head 11102, (the image processing unit 11412 of) the CCU 11201, and the like among the configurations described above.

Note that, here, the endoscopic surgery system has been described as an example, but the technology according to the present disclosure may be applied to other, for example, a microscopic surgery system or the like.

20. Application Example to Mobile Object

The technology (the present technology) according to the present disclosure can be applied to various products. For example, the technology according to the present disclosure may be realized as a device equipped on any type of mobile objects, such as an automobile, an electric car, a hybrid electric car, a motorcycle, a bicycle, personal mobility, an airplane, a drone, a ship, a robot, and the like.

Figure 72:
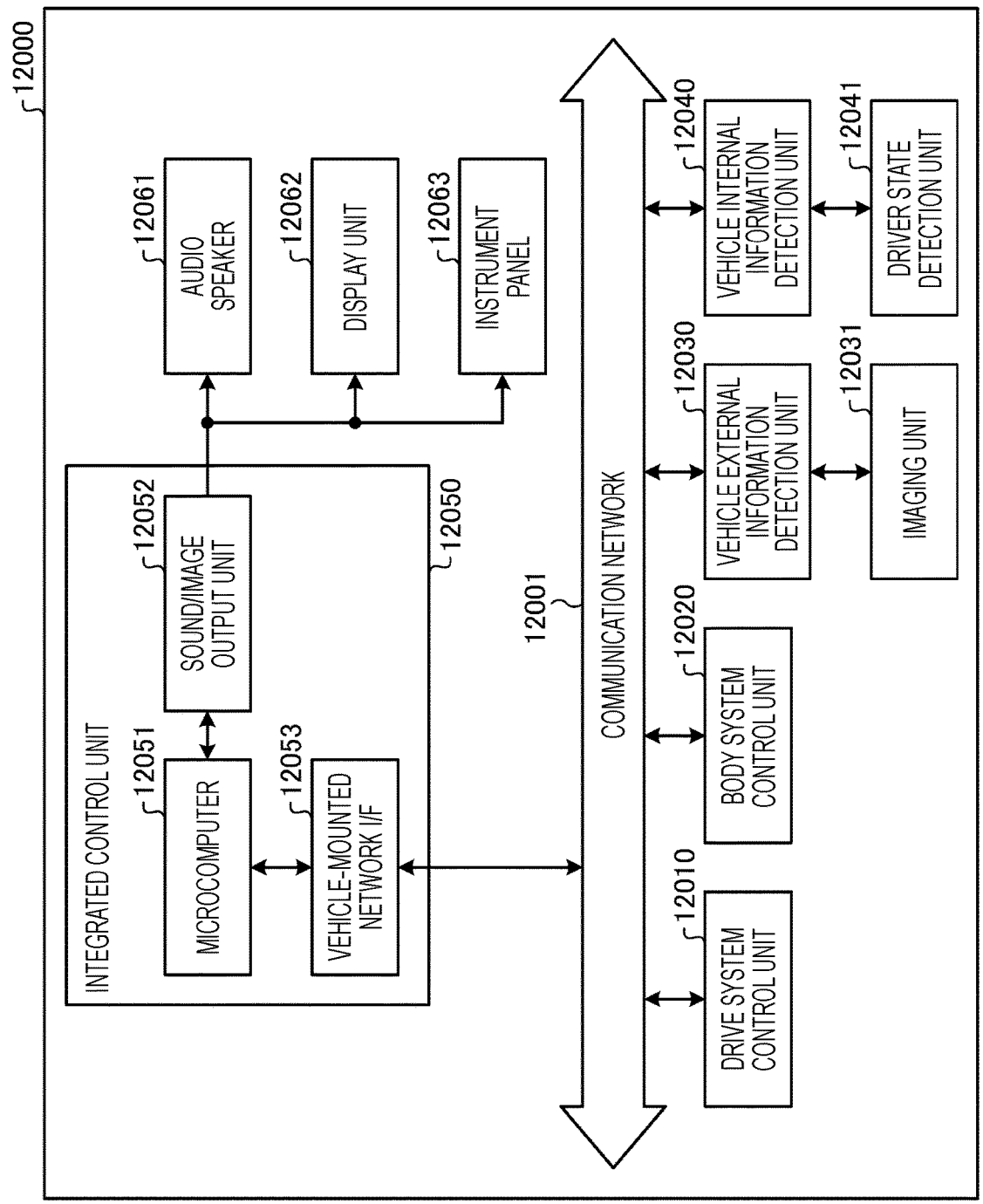
FIG. 72 is a block diagram illustrating a schematic configuration example of a vehicle control system, which is an example of a mobile object control system to which the technology according to the present disclosure may be applied.

FIG. 72 is a block diagram illustrating a schematic configuration example of a vehicle control system, which is an example of a mobile object control system to which the technology according to the present disclosure may be applied.

A vehicle control system 12000 includes a plurality of electronic control units connected via a communication network 12001. In the example illustrated in FIG. 72, the vehicle control system 12000 includes a drive system control unit 12010, a body system control unit 12020, a vehicle external information detection unit 12030, a vehicle internal information detection unit 12040, and an integrated control unit 12050. Furthermore, as a functional configuration of the integrated control unit 12050, a microcomputer 12051, a sound/image output unit 12052, and a vehicle-mounted network interface (I/F) 12053 are illustrated.

The drive system control unit 12010 controls an operation of devices related to a drive system of a vehicle in accordance with various programs. For example, the drive system control unit 12010 functions as a control device of: a driving force generation device for generation of a driving force of the vehicle such as an internal combustion engine or a drive motor; a driving force transmission mechanism for transmission of a driving force to wheels; a steering mechanism to adjust a steering angle of the vehicle; a braking device that generates a braking force of the vehicle; and the like.

The body system control unit 12020 controls an operation of various devices mounted on a vehicle body in accordance with various programs. For example, the body system control unit 12020 functions as a control device for a keyless entry system, a smart key system, a power window device, or various lamps such as a headlamp, a back lamp, a brake lamp, a turn indicator, or a fog lamp. In this case, the body system control unit 12020 may be inputted with radio waves or signals of various switches transmitted from a portable device that substitutes for a key. The body system control unit 12020 receives an input of these radio waves or signals, and controls a door lock device, a power window device, a lamp, and the like of the vehicle.

The vehicle external information detection unit 12030 detects information about an outside of the vehicle equipped with the vehicle control system 12000. For example, to the vehicle external information detection unit 12030, an imaging unit 12031 is connected. The vehicle external information detection unit 12030 causes the imaging unit 12031 to capture an image of an outside of the vehicle, and receives the captured image. The vehicle external information detection unit 12030 may perform an object detection process or a distance detection process for a person, a vehicle, an obstacle, a sign, a character on a road surface, or the like on the basis of the received image.

The imaging unit 12031 is an optical sensor that receives light and outputs an electric signal according to an amount of received light. The imaging unit 12031 can output the electric signal as an image, or can output as distance measurement information. Furthermore, the light received by the imaging unit 12031 may be visible light or non-visible light such as infrared light.

The vehicle internal information detection unit 12040 detects information inside the vehicle. The vehicle internal information detection unit 12040 is connected with, for example, a driver state detection unit 12041 that detects a state of a driver. The driver state detection unit 12041 may include, for example, a camera that images the driver, and, on the basis of detection information inputted from the driver state detection unit 12041, the vehicle internal information detection unit 12040 may calculate a degree of tiredness or a degree of concentration of the driver, or may determine whether or not the driver is asleep.

On the basis of information inside and outside the vehicle acquired by the vehicle external information detection unit 12030 or the vehicle internal information detection unit 12040, the microcomputer 12051 can operate a control target value of the driving force generation device, the steering mechanism, or the braking device, and output a control command to the drive system control unit 12010. For example, the microcomputer 12051 can perform cooperative control for the purpose of realizing functions of advanced driver assistance system (ADAS) including avoidance of collisions or mitigation of impacts of the vehicle, follow-up traveling on the basis of an inter-vehicle distance, vehicle speed maintenance traveling, vehicle collision warning, vehicle lane departure warning, and the like.

Furthermore, by controlling the driving force generation device, the steering mechanism, the braking device, or the like on the basis of the information about surroundings of the vehicle acquired by the vehicle external information detection unit 12030 or the vehicle internal information detection unit 12040, the microcomputer 12051 may perform cooperative control for the purpose of, for example, automatic driving for autonomously traveling without depending on an operation of the driver.

Furthermore, the microcomputer 12051 can output a control command to the body system control unit 12020 on the basis of information about the outside of the vehicle acquired by the vehicle external information detection unit 12030. For example, the microcomputer 12051 can control a headlamp in accordance with a position of a preceding vehicle or an oncoming vehicle detected by the vehicle external information detection unit 12030, and perform cooperative control for the purpose of antiglare, such as switching a high beam to a low beam.

The sound/image output unit 12052 transmits an output signal of at least one of sound or an image, to an output device capable of visually or audibly notifying, of information, a passenger of the vehicle or outside the vehicle. In the example of FIG. 72, an audio speaker 12061, a display unit 12062, and an instrument panel 12063 are exemplified as the output devices. The display unit 12062 may include, for example, at least one of an on-board display or a head-up display.

Figure 73:
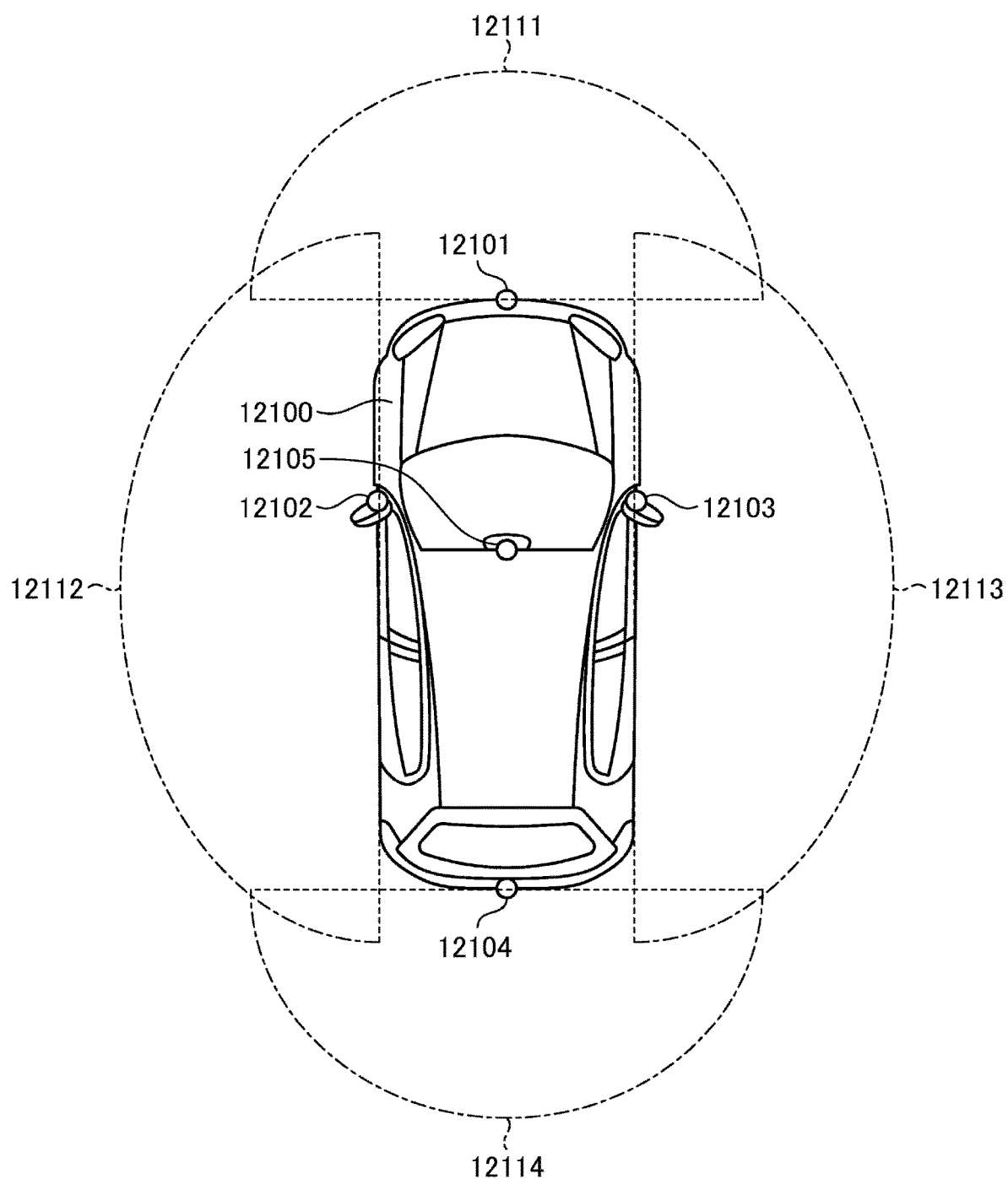
FIG. 73 is a view illustrating an example of an installation position of the imaging unit.

FIG. 73 is a view illustrating an example of an installation position of the imaging unit 12031.

In FIG. 73, as the imaging unit 12031, a vehicle 12100 includes imaging units 12101, 12102, 12103, 12104, and 12105.

The imaging units 12101, 12102, 12103, 12104, and 12105 are provided at, for example, a front nose, side mirrors, a rear bumper, a back door, an upper part of a windshield in a vehicle cabin, or the like of the vehicle 12100. The imaging unit 12101 provided at the front nose and the imaging unit 12105 provided at the upper part of the windshield in the vehicle cabin mainly acquire an image in front of the vehicle 12100. The imaging units 12102 and 12103 provided at the side mirrors mainly acquire an image of a side of the vehicle 12100. The imaging unit 12104 provided at the rear bumper or the back door mainly acquires an image behind the vehicle 12100. A front image acquired by the imaging units 12101 and 12105 is mainly used to detect preceding vehicles, pedestrians, obstacles, traffic lights, traffic signs, lanes, and the like.

Note that FIG. 73 illustrates an example of an image capturing range of the imaging units 12101 to 12104. An imaging range 12111 indicates an imaging range of the imaging unit 12101 provided at the front nose, imaging ranges 12112 and 12113 indicate imaging ranges of the imaging units 12102 and 12103 each provided at the side mirrors, and an imaging range 12114 indicates an imaging range of the imaging unit 12104 provided at the rear bumper or the back door. For example, by superimposing image data captured by the imaging units 12101 to 12104, an overhead view image of the vehicle 12100 viewed from above can be obtained.

At least one of the imaging units 12101 to 12104 may have a function of acquiring distance information. For example, at least one of the imaging units 12101 to 12104 may be a stereo camera including a plurality of imaging elements, or an imaging element having pixels for detection of a phase difference.

For example, on the basis of the distance information obtained from the imaging units 12101 to 12104, by obtaining a distance to each solid object within the imaging ranges 12111 to 12114 and a time change of this distance (a relative speed with respect to the vehicle 12100), the microcomputer 12051 can extract, as a preceding vehicle, especially a solid object that is the closest on a travel route of the vehicle 12100, and that is traveling at a predetermined speed (for example, 0 km/h or more) in substantially the same direction as the vehicle 12100. Moreover, the microcomputer 12051 can set an inter-vehicle distance to be secured from a preceding vehicle in advance, and perform automatic brake control (including follow-up stop control), automatic acceleration control (including follow-up start control), and the like. In this way, it is possible to perform cooperative control for the purpose of, for example, automatic driving for autonomously traveling without depending on an operation of the driver.

For example, on the basis of the distance information obtained from the imaging units 12101 to 12104, the microcomputer 12051 can classify solid object data regarding solid objects into a two-wheeled vehicle, an ordinary vehicle, a large vehicle, a pedestrian, a utility pole, and the like, to extract and use for automatic avoidance of obstacles. For example, the microcomputer 12051 distinguishes obstacles around the vehicle 12100 into obstacles that are visible to the driver of the vehicle 12100 and obstacles that are difficult to see. Then, the microcomputer 12051 can determine a collision risk indicating a risk of collision with each obstacle, and provide driving assistance for collision avoidance by outputting an alarm to the driver via the audio speaker 12061 or the display unit 12062, or by performing forced deceleration and avoidance steering via the drive system control unit 12010, when the collision risk is equal to or larger than a set value and there is a possibility of collision.

At least one of the imaging units 12101 to 12104 may be an infrared camera that detects infrared light. For example, the microcomputer 12051 can recognize a pedestrian by determining whether or not a pedestrian exists in a captured image of the imaging units 12101 to 12104. Such recognition of a pedestrian is performed by, for example, a procedure of extracting a feature point in a captured image of the imaging unit 12101 to 12104 as an infrared camera, and a procedure of performing pattern matching processing on a series of feature points indicating a contour of an object and determining whether or not the object is a pedestrian. When the microcomputer 12051 determines that a pedestrian is present in the image captured by the imaging units 12101 to 12104 and recognizes the pedestrian, the sound/image output unit 12052 controls the display unit 12062 so as to superimpose and display a rectangular contour line for emphasis on the recognized pedestrian. Furthermore, the sound/image output unit 12052 may control the display unit 12062 to display an icon or the like indicating a pedestrian at a desired position.

An example of the vehicle control system to which the technology according to the present disclosure may be applied has been described above. The technology according to the present disclosure can be applied to, for example, the imaging unit 12031 and the like among the configurations described above.

21. Conclusion

As described above, according to each embodiment of the present disclosure, it is possible to provide the solid-state imaging element 100 and the electronic device capable of efficiently outputting and transferring a pixel signal while avoiding an increase in manufacturing cost.

Note that, in each embodiment of the present disclosure described above, the solid-state imaging element 100 has been described in which the first conductivity type is the P-type, the second conductivity type is the N-type, and electrons are used as signal charges. However, the embodiment of the present disclosure is not limited to such an example. For example, each embodiment can be applied to the solid-state imaging element 100 in which the first conductivity type is the N-type, the second conductivity type is the P-type, and positive holes are used as signal charges.

Furthermore, in each embodiment of the present disclosure described above, the semiconductor substrate 300 is not necessarily a silicon substrate, and may be another substrate (for example, a silicon on insulator (SOI) substrate, a SiGe substrate, or the like). Furthermore, the semiconductor substrate 300 described above may have a semiconductor structure or the like formed on such various substrates.

Moreover, the solid-state imaging element 100 according to each embodiment of the present disclosure is not limited to a solid-state imaging element that detects distribution of an incident light amount of visible light to capture as an image. For example, the present embodiment can be applied to a solid-state imaging element that captures a distribution of an incident amount of infrared rays, X-rays, particles, or the like as an image, or a solid-state imaging element (a physical amount distribution detection device) such as a fingerprint detection sensor, which detects a distribution of other physical amounts such as pressure and capacitance to capture as an image.

Furthermore, the solid-state imaging element 100 according to each embodiment of the present disclosure can be manufactured by using a method, a device, and conditions used for manufacturing a general semiconductor device. That is, the solid-state imaging element 100 according to each embodiment can be manufactured using an existing semiconductor device manufacturing process.

Note that, examples of the above-described method may include, for example, a PVD method, a CVD method, an ALD method, and the like. Examples of the PVD method may include a vacuum vapor deposition method, an electron beam (EB) vapor deposition method, various sputtering methods (such as a magnetron sputtering method, an RF-DC coupled bias sputtering method, an electron cyclotron resonance (ECR) sputtering method, a facing target sputtering method, and a high frequency sputtering method), an ion plating method, a laser ablation method, a molecular beam epitaxy method (MBE method), and a laser transfer method. Furthermore, examples of the CVD method may include a plasma CVD method, a thermal CVD method, a metal organic (MO) CVD method, and a photo CVD method. Moreover, examples of other methods may include: an electrolytic plating method, an electroless plating method, and a spin coat method; an immersion method; a cast method; a micro-contact printing method; a drop cast method; various printing methods such as a screen printing method, an inkjet printing method, an offset printing method, a gravure printing method, and a flexographic printing method; a stamping method; a spray method; and various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calender coater method. Moreover, examples of a patterning method may include chemical etching such as shadow mask, laser transfer, and photolithography, and physical etching using ultraviolet rays, laser, or the like. In addition, examples of a planarization technique may include a CMP method, a laser planarization method, a reflow method, and the like.

22. Supplement

The preferred embodiments of the present disclosure have been described above in detail with reference to the accompanying drawings, but the technical scope of the present disclosure is not limited to such examples. It is obvious that those with ordinary skill in the technical field of the present disclosure can arrive various variations or modifications within the scope of the technical idea described in the claims, and it is naturally understood that these also fall within the technical scope of the present disclosure.

Furthermore, the effects described in the present specification are merely exemplary or illustrative, and not restrictive. That is, the technology according to the present disclosure can exhibit other effects apparent to those skilled in the art from the description of the present specification, in addition to the effect described above or instead of the effect described above.

Note that the following configurations are also within the technical scope of the present disclosure.

(1)

A solid-state imaging element including:

a semiconductor substrate;

a first photoelectric conversion unit provided above the semiconductor substrate and configured to convert light into a charge; and a second photoelectric conversion unit provided above the first photoelectric conversion unit and configured to convert light into a charge, in which the first and second photoelectric conversion units are joined at joint surfaces facing each other, each of the first and second photoelectric conversion units has a laminated structure including:

an upper electrode;

a lower electrode;

a photoelectric conversion film sandwiched between the upper electrode and the lower electrode; and a storage electrode opposed to the upper electrode via the photoelectric conversion film and an insulating film, the lower electrode of the first photoelectric conversion unit is electrically connected to a charge storage unit provided in the semiconductor substrate, via a first through electrode penetrating the semiconductor substrate, and the lower electrode of the second photoelectric conversion unit is electrically connected to the charge storage unit via:

a second electrode provided on a joint surface of the second photoelectric conversion unit;

a first electrode provided on a joint surface of the first photoelectric conversion unit;

a second through electrode penetrating the first photoelectric conversion unit; and the first through electrode.

(2)

The solid-state imaging element according to (1), in which the first and second electrodes are formed by a transparent conductive material.

(3)

The solid-state imaging element according to (1) or (2), in which the first and second electrodes are substantially circular in a cross section of the solid-state imaging element cut in a laminating direction of the laminated structure.

(4)

The solid-state imaging element according to any one of (1) to (3), in which the first and second photoelectric conversion units have at least one dummy electrode on each of the joint surfaces.

(5)

The solid-state imaging element according to any one of (1) to (4), in which at least one opening is formed in the first and second electrodes.

(6)

The solid-state imaging element according to any one of (1) to (5), in which the first and second electrodes have sizes different from each other.

(7)

The solid-state imaging element according to any one of (1) to (6), in which at least one of the joint surfaces of the first and second photoelectric conversion units is provided with a stopper layer including a hard insulating material and surrounding the first electrode or the second electrode.

(8)

The solid-state imaging element according to (7), in which a first wiring layer is provided between the first electrode and the upper electrode of the first photoelectric conversion unit, and a stopper layer including a hard insulating material is provided between the first electrode and the first wiring layer.

(9)

The solid-state imaging element according to (8), in which the first electrode, the stopper layer, and the first wiring layer have a larger refractive index in this order.

(10)

The solid-state imaging element according to (7), in which a second wiring layer is provided between the second electrode and the upper electrode of the second photoelectric conversion unit, and a stopper layer including a hard insulating material is provided between the second electrode and the second wiring layer.

(11)

The solid-state imaging element according to (10), in which the second electrode, the stopper layer, and the second wiring layer have a larger refractive index in this order.

(12)

The solid-state imaging element according to any one of (1) to (6), further including:

a stopper layer including a hard insulating material and provided on the joint surfaces of the first and second photoelectric conversion units so as to surround the first electrode or the second electrode; and an insulating film including a material different from a material of the stopper layer and provided so as to cover the stopper layer and the first and second electrodes, in which the first and second electrodes are electrically connected via the insulating film.

(13)

The solid-state imaging element according to (12), in which the insulating film has a thickness that allows electrical connection between the first and second electrodes.

(14)

The solid-state imaging element according to any one of (1) to (13), in which the first through electrode is a common through electrode provided in common for the first and second photoelectric conversion units, and the charge storage unit is a common charge storage unit provided in common for the first and second photoelectric conversion units.

(15)

The solid-state imaging element according to (14), in which each of the lower electrodes of the first and second photoelectric conversion units is electrically connected, via the common through electrode, to a common pixel transistor provided in common for the first and second photoelectric conversion units in the semiconductor substrate.

(16)

The solid-state imaging element according to any one of (1) to (15), in which the photoelectric conversion film includes an organic material.

(17)

The solid-state imaging element according to any one of (1) to (16), further including a third photoelectric conversion unit provided in the semiconductor substrate and configured to convert the light into a charge.

(18)

An electronic device including:

a solid-state imaging element;

an optical system configured to form an image of incident light on a light receiving surface of the solid-state imaging element; and a processor configured to control the solid-state imaging element, in which the solid-state imaging element includes:

a semiconductor substrate;

a first photoelectric conversion unit provided above the semiconductor substrate and configured to convert light into a charge; and a second photoelectric conversion unit provided above the first photoelectric conversion unit and configured to convert light into a charge, the first and second photoelectric conversion units are joined at joint surfaces facing each other, each of the first and second photoelectric conversion units has a laminated structure including:

an upper electrode;

a lower electrode;

a photoelectric conversion film sandwiched between the upper electrode and the lower electrode; and a storage electrode opposed to the upper electrode via the photoelectric conversion film and an insulating film, the lower electrode of the first photoelectric conversion unit is electrically connected to a charge storage unit provided in the semiconductor substrate, via a first through electrode penetrating the semiconductor substrate, and the lower electrode of the second photoelectric conversion unit is electrically connected to the charge storage unit via:

a second electrode provided on a joint surface of the second photoelectric conversion unit;

a first electrode provided on a joint surface of the first photoelectric conversion unit;

a second through electrode penetrating the first photoelectric conversion unit; and the first through electrode.

REFERENCE SIGNS LIST

1 Solid-state imaging device
10, 80 Pixel array unit
32 Vertical drive circuit unit
34 Column signal processing circuit unit
36 Horizontal drive circuit unit
38 Output circuit unit
40 Control circuit unit
42 Pixel drive wiring
44 Vertical signal line
46 Horizontal signal line
48 Input/output terminal
100, 800 Solid-state imaging element
150, 350 Organic film
200, 520, 620, 720 Wiring layer
230, 530, 570, 572, 670, 672, 730, 770, 772 Wiring
232, 573, 673, 674 Electrode
240 Interlayer insulating film
250, 252, 254, 256, 258, 260, 262 Metal film
300 Semiconductor substrate
310, 312, 410 Semiconductor region
314, 814 Floating diffusion unit
342 Isolation insulating film
352 Photoresist
400, 500, 600, 700, 802, 804, 806 Photoelectric conversion element
402 Antireflection film
404a, 404b Waveguide
406a, 406b Inner lens
408a, 408b Partition wall
480, 578, 676 Transparent conductive layer
450, 462, 506, 540, 562, 580, 606, 640, 662, 681, 706, 780 Insulating film
460, 460a, 560, 560a, 630, 660, 807, 860 Through electrode
502, 602, 702 Common electrode
504, 604, 704 Photoelectric conversion film
508, 518, 608, 708 Reading electrode 508b Contact region
512, 612 Transfer electrode
514, 614 Shield electrode
510, 610, 710 Storage electrode
590 Shield pattern
575, 675 Dummy electrode
577, 579, 677 Stopper layer

The invention claimed is:

1. A solid-state imaging element, comprising:
a semiconductor substrate;
a first photoelectric conversion unit above the semiconductor substrate and configured to convert light into a charge; and
a second photoelectric conversion unit above the first photoelectric conversion unit and configured to convert light into a charge, wherein
the first photoelectric conversion unit and the second photoelectric conversion unit are joined at joint surfaces that face each other,
each of the first photoelectric conversion unit and the second photoelectric conversion unit has
a laminated structure including:
an upper electrode;
a lower electrode;
a photoelectric conversion film sandwiched between the upper electrode and the lower electrode; and
a storage electrode opposed to the upper electrode via the photoelectric conversion film and a first insulating film,
the lower electrode of the first photoelectric conversion unit is
electrically connected to a charge storage unit in the semiconductor substrate, via a first through electrode that penetrates the semiconductor substrate,
the lower electrode of the second photoelectric conversion unit is
electrically connected to the charge storage unit via:
a second electrode on a joint surface of the second photoelectric conversion unit;
a first electrode on a joint surface of the first photoelectric conversion unit so as to be opposed to the second electrode and joined to the second electrode;
a second through electrode that penetrates the first photoelectric conversion unit; and
the first through electrode.

2. The solid-state imaging element according to claim 1, wherein
the first electrode and the second electrode includes a transparent conductive material.

3. The solid-state imaging element according to claim 2, wherein
the first electrode and the second electrode are substantially circular in a cross section of the solid-state imaging element cut in a laminating direction of the laminated structure.

4. The solid-state imaging element according to claim 2, wherein
the first photoelectric conversion unit and the second photoelectric conversion unit have at least one dummy electrode on each of the joint surfaces.

5. The solid-state imaging element according to claim 2, wherein
at least one opening is in each of the first electrode and the second electrode.

6. The solid-state imaging element according to claim 2, wherein
the first electrode and the second electrode have sizes different from each other.

7. The solid-state imaging element according to claim 2, wherein
at least one of the joint surfaces of the first photoelectric conversion unit and the second photoelectric conversion unit includes a stopper layer, and
the stopper layer includes a hard insulating material and surrounds the first electrode or the second electrode.

8. The solid-state imaging element according to claim 7, wherein
a first wiring layer is between the first electrode and the upper electrode of the first photoelectric conversion unit, and
the stopper layer including the hard insulating material is between the first electrode and the first wiring layer.

9. The solid-state imaging element according to claim 8, wherein
the first electrode, the stopper layer, and the first wiring layer have a larger refractive index in this order.

10. The solid-state imaging element according to claim 7, wherein
a second wiring layer is between the second electrode and the upper electrode of the second photoelectric conversion unit, and
the stopper layer including the hard insulating material is between the second electrode and the second wiring layer.

11. The solid-state imaging element according to claim 10, wherein
the second electrode, the stopper layer, and the second wiring layer have a larger refractive index in this order.

12. The solid-state imaging element according to claim 2, further comprising:
a stopper layer including a hard insulating material and on the joint surfaces of the first photoelectric conversion unit and the second photoelectric conversion unit so as to surround the first electrode or the second electrode; and
a second insulating film including a material different from a material of the stopper layer, wherein
the second insulating film covers the stopper layer, the first electrode, and the second electrode, and
the first electrode and the second electrode are electrically connected via the second insulating film.

13. The solid-state imaging element according to claim 12, wherein
the second insulating film has a thickness that allows electrical connection between the first electrode and the second electrode.

14. The solid-state imaging element according to claim 1, wherein
the first through electrode is a common through electrode in common for the first photoelectric conversion unit and the second photoelectric conversion unit, and
the charge storage unit is a common charge storage unit in common for the first photoelectric conversion unit and the second photoelectric conversion unit.

15. The solid-state imaging element according to claim 14, wherein each of the lower electrode of the first photoelectric conversion unit and the lower electrode of the second photoelectric conversion unit is electrically connected, via the common through electrode, to a common pixel transistor in common for the first photoelectric conversion unit and the second photoelectric conversion unit in the semiconductor substrate.

16. The solid-state imaging element according to claim 1, wherein the photoelectric conversion film includes an organic material.

17. The solid-state imaging element according to claim 1, further comprising a third photoelectric conversion unit in the semiconductor substrate and configured to convert the light into a charge.

18. An electronic device, comprising:
a solid-state imaging element;
an optical system configured to form an image of incident light on a light receiving surface of the solid-state imaging element; and
a processor configured to control the solid-state imaging element, wherein
the solid-state imaging element includes:
a semiconductor substrate;
a first photoelectric conversion unit above the semiconductor substrate and configured to convert light into a charge; and
a second photoelectric conversion unit above the first photoelectric conversion unit and configured to convert light into a charge,
the first photoelectric conversion unit and the second photoelectric conversion unit are joined at joint surfaces that face each other,
each of the first photoelectric conversion unit and the second photoelectric conversion unit has
a laminated structure including:
an upper electrode;
a lower electrode;
a photoelectric conversion film sandwiched between the upper electrode and the lower electrode; and
a storage electrode opposed to the upper electrode via the photoelectric conversion film and an insulating film,
the lower electrode of the first photoelectric conversion unit is
electrically connected to a charge storage unit in the semiconductor substrate, via a first through electrode that penetrates the semiconductor substrate,
the lower electrode of the second photoelectric conversion unit is
electrically connected to the charge storage unit via:
a second electrode on a joint surface of the second photoelectric conversion unit;
a first electrode on a joint surface of the first photoelectric conversion unit so as to be opposed to the second electrode and joined to the second electrode;
a second through electrode that penetrates the first photoelectric conversion unit; and
the first through electrode.

* * * * *